United States Patent
Kodate et al.

(10) Patent No.: US 10,910,020 B1
(45) Date of Patent: Feb. 2, 2021

(54) THREE-DIMENSIONAL MEMORY DEVICE CONTAINING COMPACT BIT LINE SWITCH CIRCUIT AND METHOD OF MAKING THE SAME

(71) Applicant: SANDISK TECHNOLOGIES LLC, Addison, TX (US)

(72) Inventors: Hokuto Kodate, Nagoya (JP); Hiroyuki Ogawa, Nagoya (JP); Junko Ono, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/579,974

(22) Filed: Sep. 24, 2019

(51) Int. Cl.
| | |
|---|---|
| *G11C 5/06* | (2006.01) |
| *H01L 23/522* | (2006.01) |
| *H01L 23/528* | (2006.01) |
| *H01L 27/11519* | (2017.01) |
| *H01L 27/1157* | (2017.01) |
| *H01L 27/11565* | (2017.01) |
| *H01L 27/11582* | (2017.01) |
| *H01L 27/11556* | (2017.01) |
| *H01L 27/11524* | (2017.01) |

(52) U.S. Cl.
CPC .......... *G11C 5/063* (2013.01); *H01L 23/5226* (2013.01); *H01L 23/5283* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ....................................................... G11C 5/063
USPC ............................................................. 257/314
See application file for complete search history.

(56) References Cited

U.S. PATENT DOCUMENTS

| | | | |
|---|---|---|---|
| 5,915,167 A | 6/1999 | Leedy | |
| 9,859,422 B2 | 1/2018 | Nishikawa et al. | |
| 10,115,735 B2 | 10/2018 | Amano et al. | |
| 10,224,407 B2 | 3/2019 | Chowdhury et al. | |
| 10,256,099 B1 | 4/2019 | Akaiwa et al. | |
| 10,355,017 B1 | 7/2019 | Nakatsuji et al. | |
| 10,355,100 B1 | 7/2019 | Ueda et al. | |
| 2016/0260733 A1* | 9/2016 | Lue ................... | H01L 29/66742 |
| 2016/0351709 A1 | 12/2016 | Nishikawa et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Ajay Arora
(74) *Attorney, Agent, or Firm* — The Marbury Law Group PLLC

(57) ABSTRACT

A semiconductor structure includes a three-dimensional NAND memory array including bit lines and an array of bit line connection switches. Each of the bit line connection switches includes a series connection of a first field effect transistor and a second field effect transistor that include a common active region. A deep active portion of a first active region of the first field effect transistor is vertically coincident with a first outer sidewall of a first dielectric spacer, and a deep active portion of the common active region is laterally spaced from the first dielectric spacer to provide a compact design the each bit line connection switch.

20 Claims, 46 Drawing Sheets

(56) References Cited

U.S. PATENT DOCUMENTS

| | | |
|---|---|---|
| 2017/0294445 A1* | 10/2017 | Son .................. H04L 5/0091 |
| 2018/0247954 A1 | 8/2018 | Amano et al. |
| 2018/0248013 A1 | 8/2018 | Chowdhury et al. |
| 2018/0331118 A1 | 11/2018 | Amano |

OTHER PUBLICATIONS

U.S. Appl. No. 16/130,104, filed Sep. 13, 2018, SanDisk Technologies LLC.

* cited by examiner

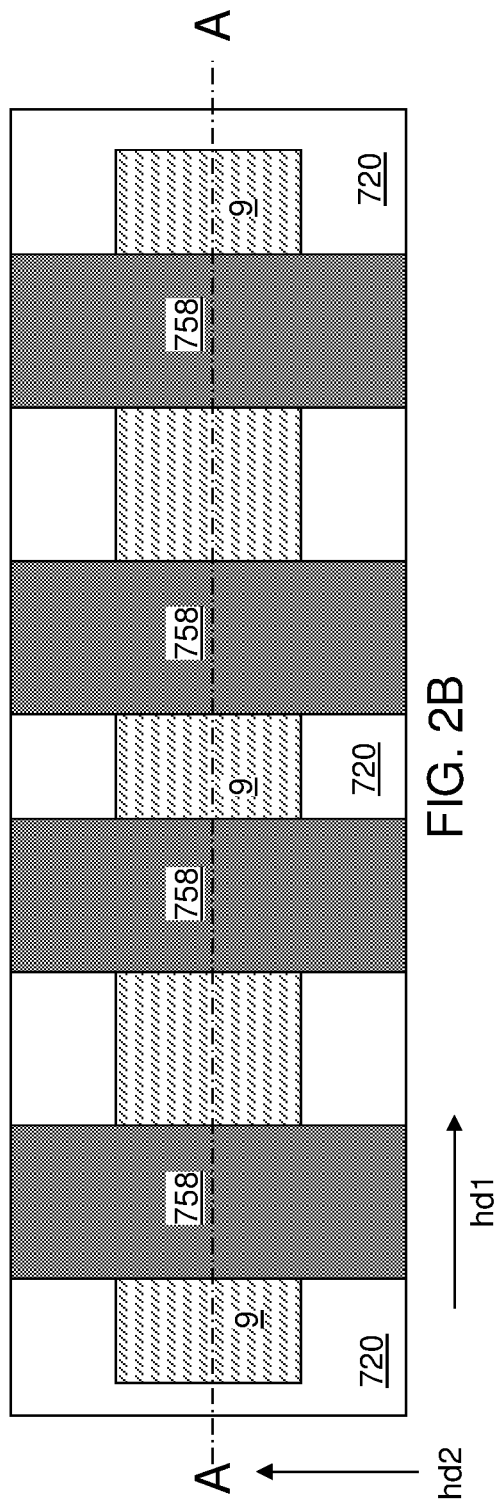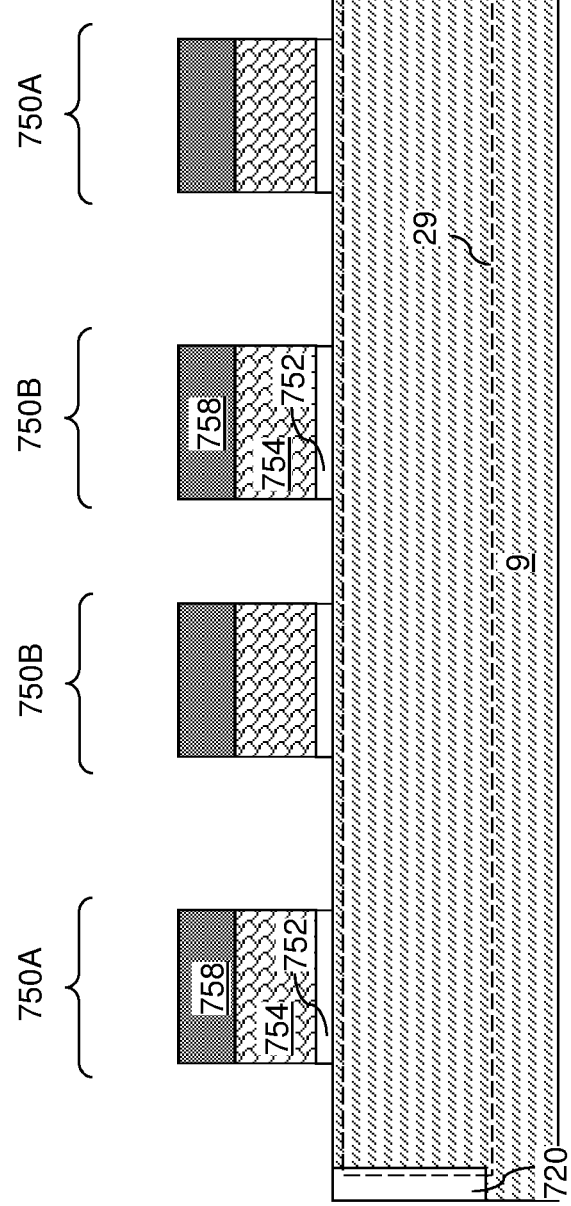

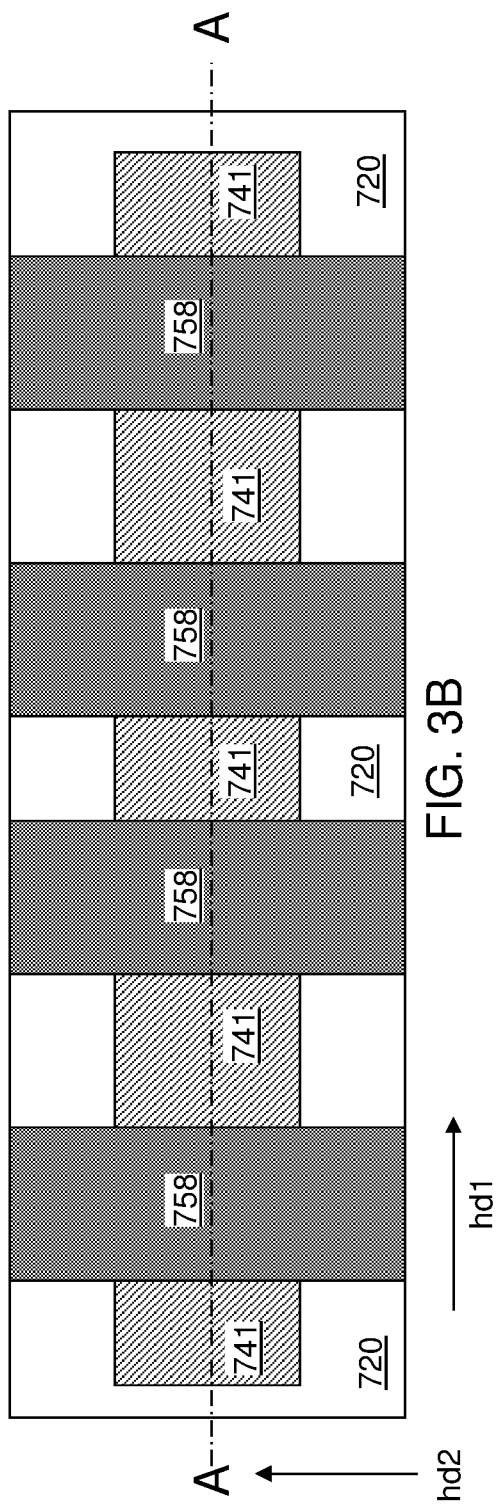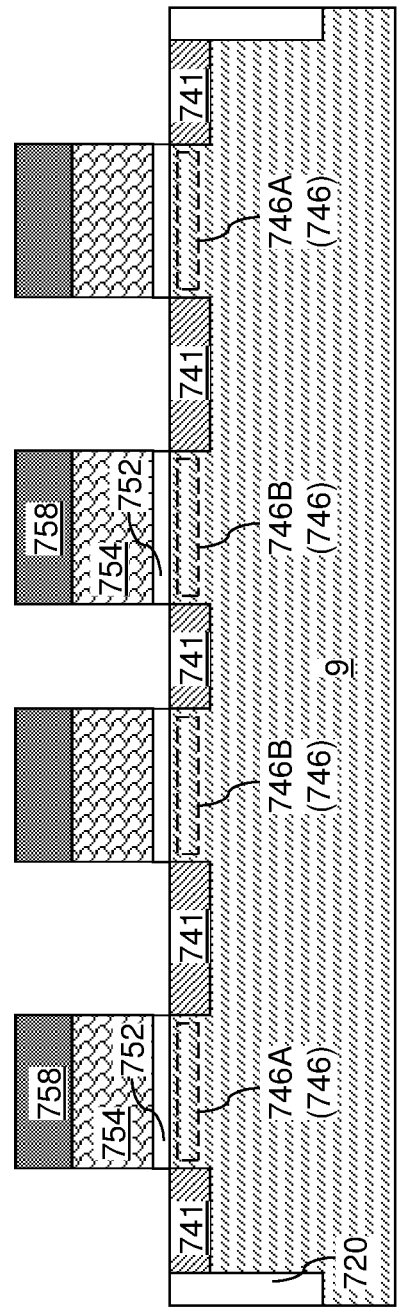

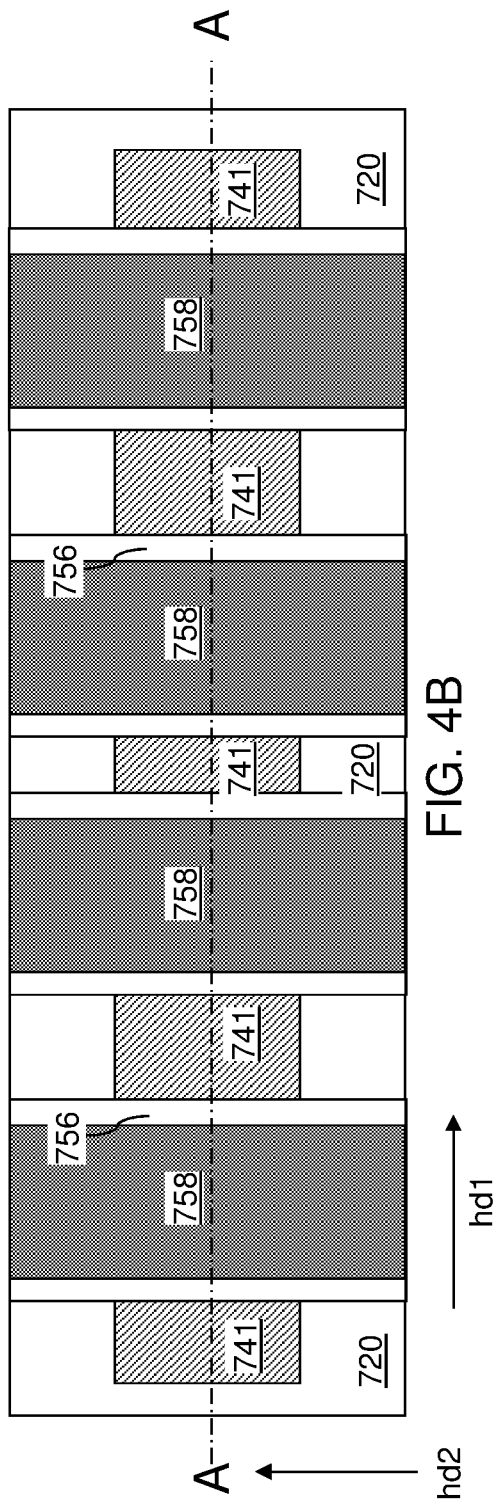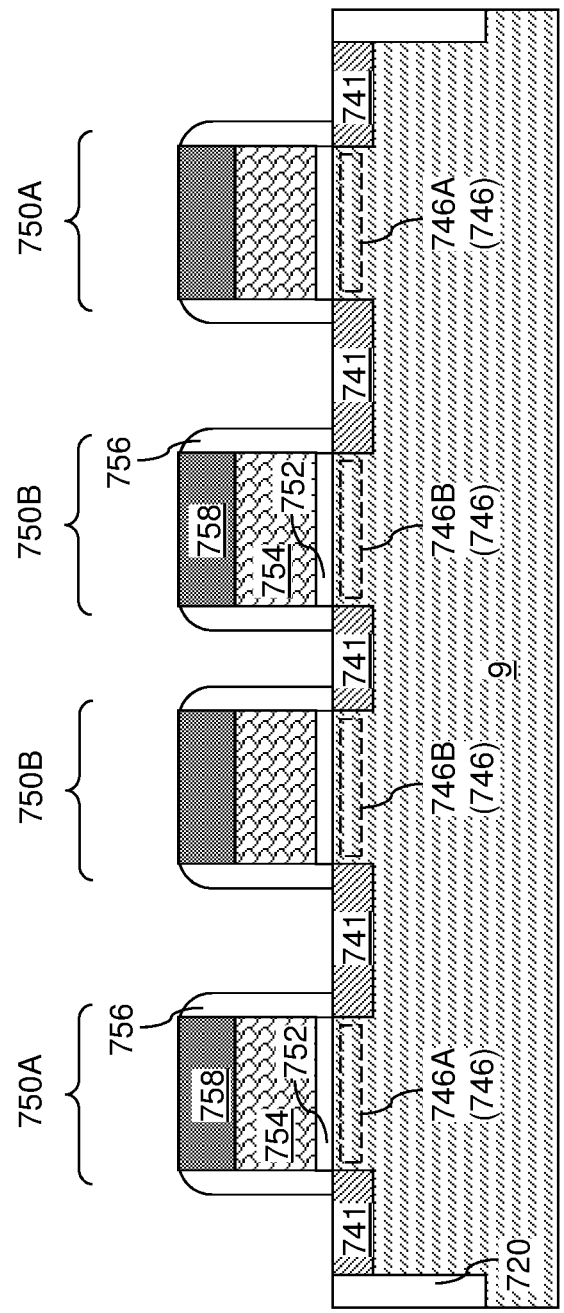

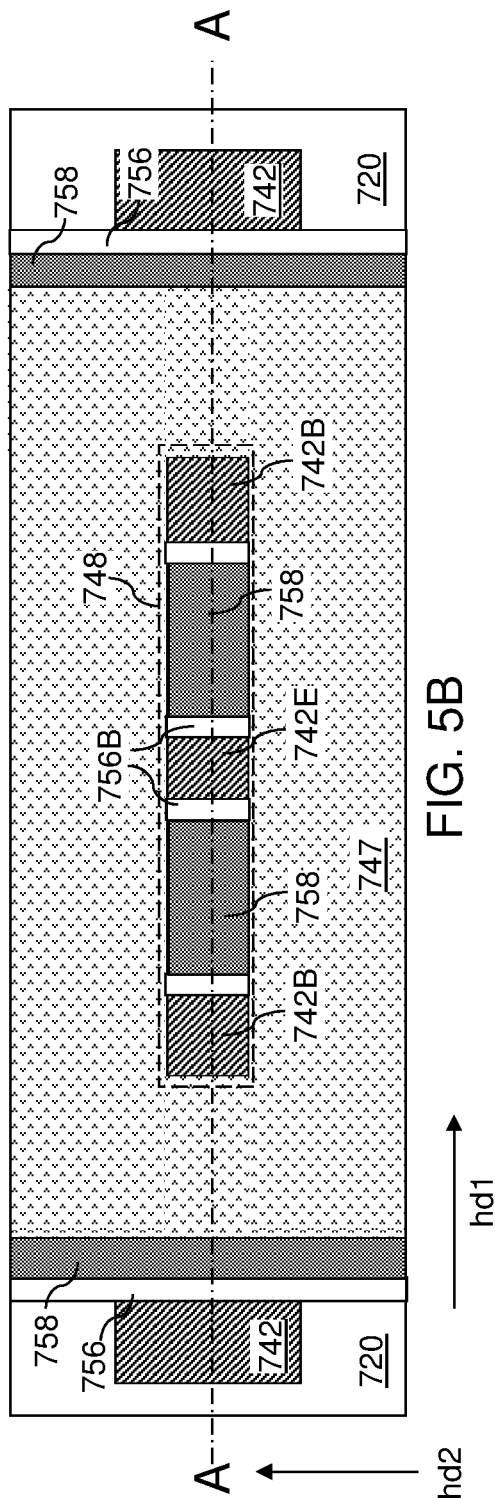
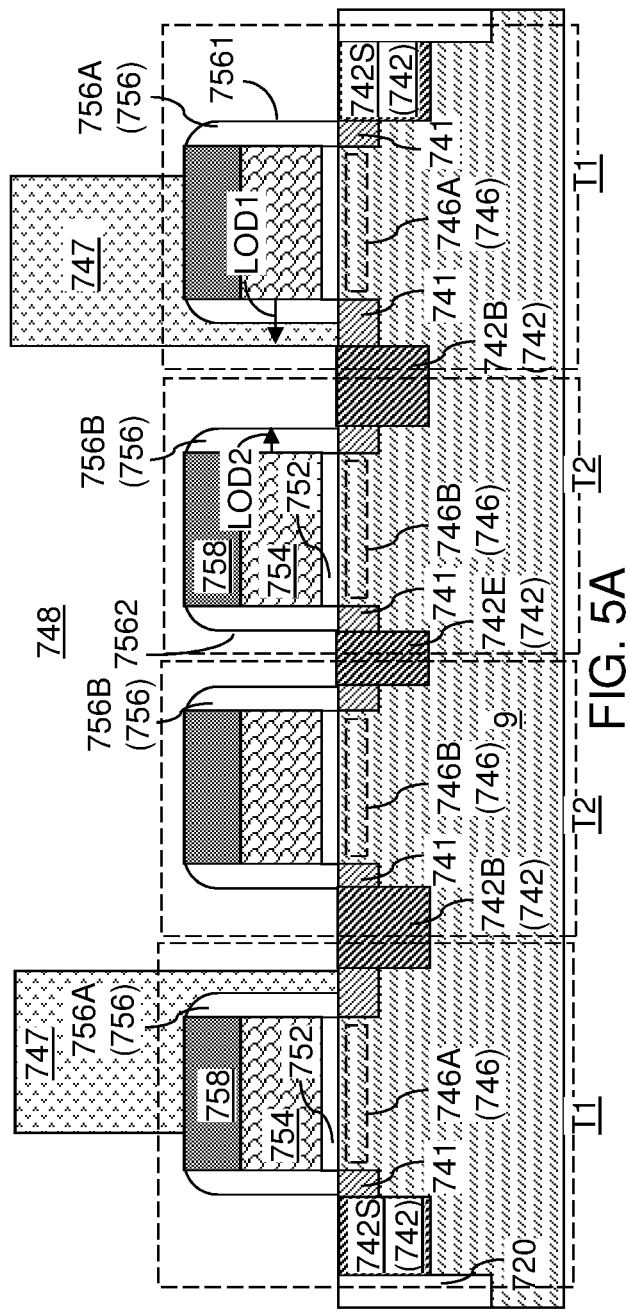
FIG. 5B
FIG. 5A

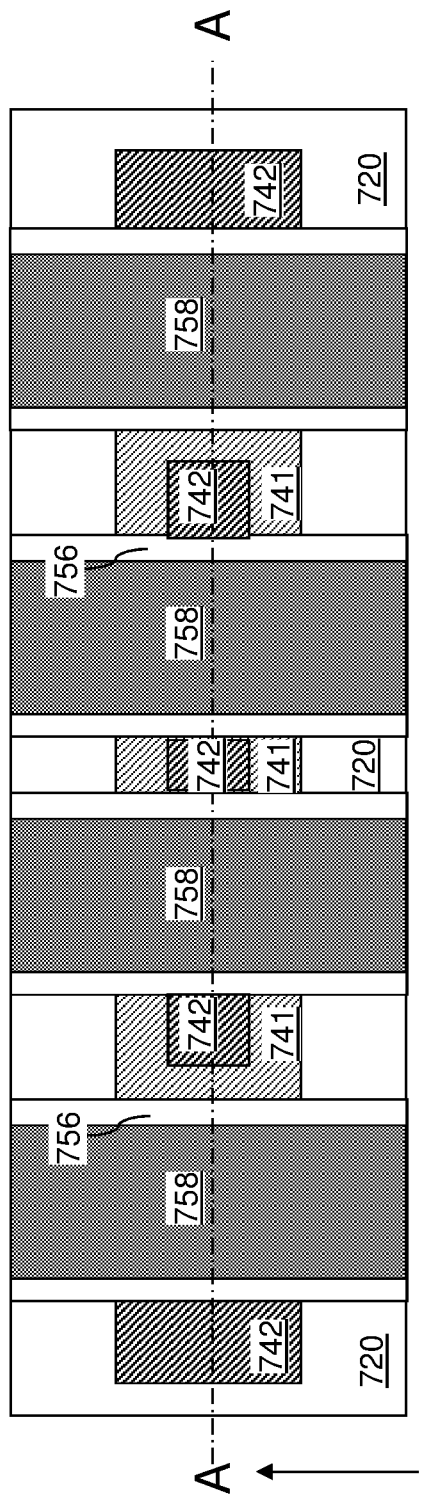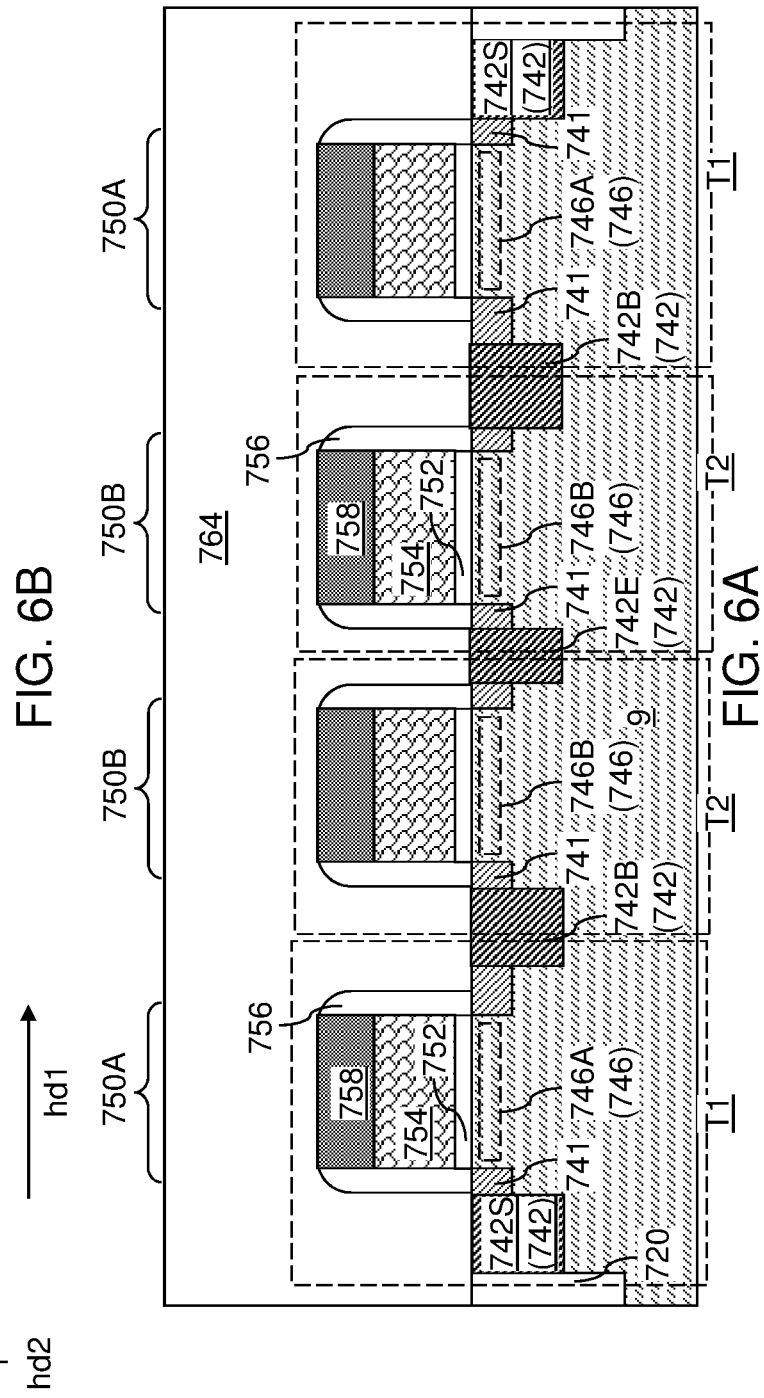

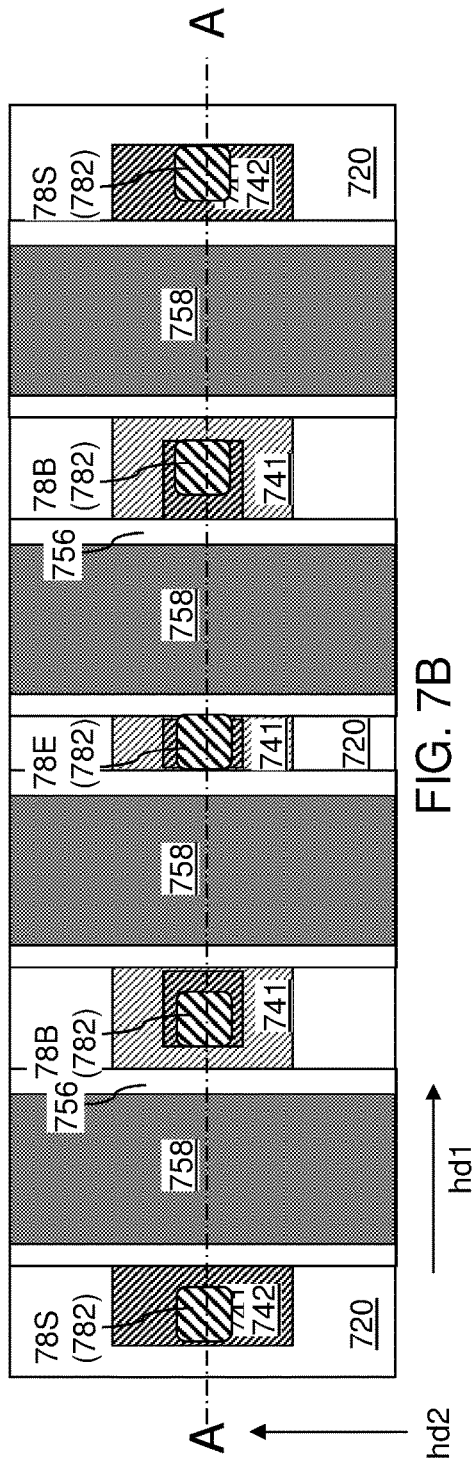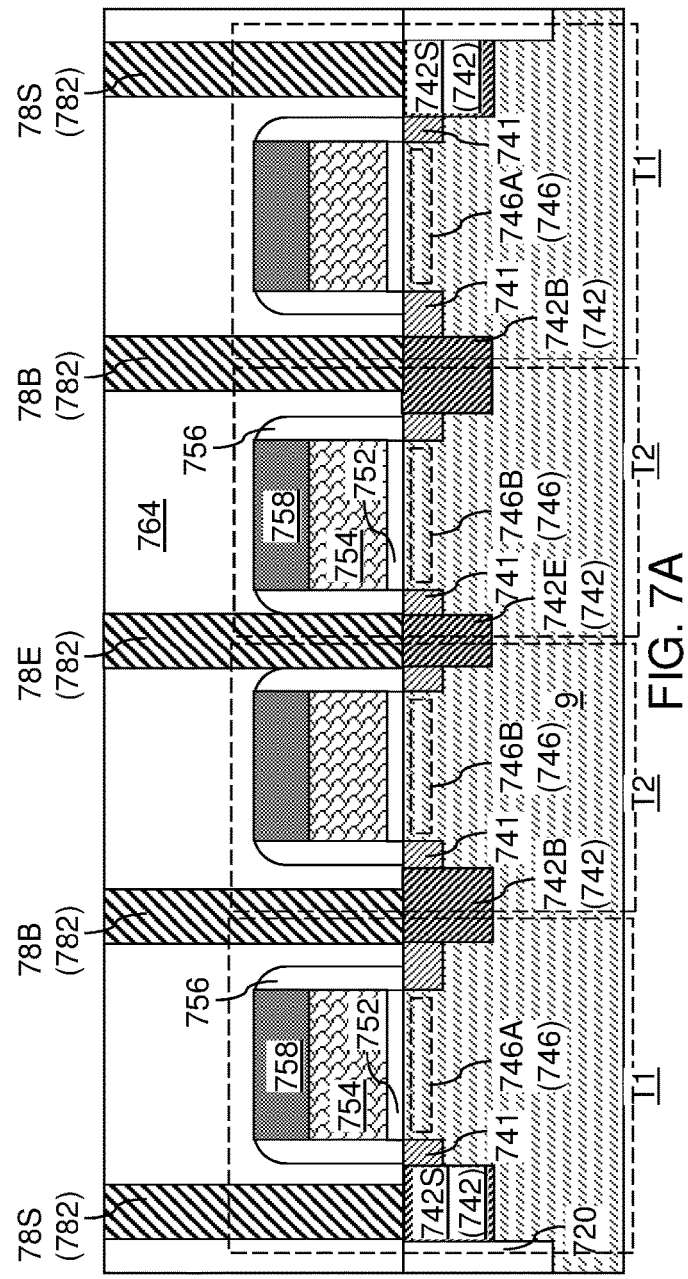

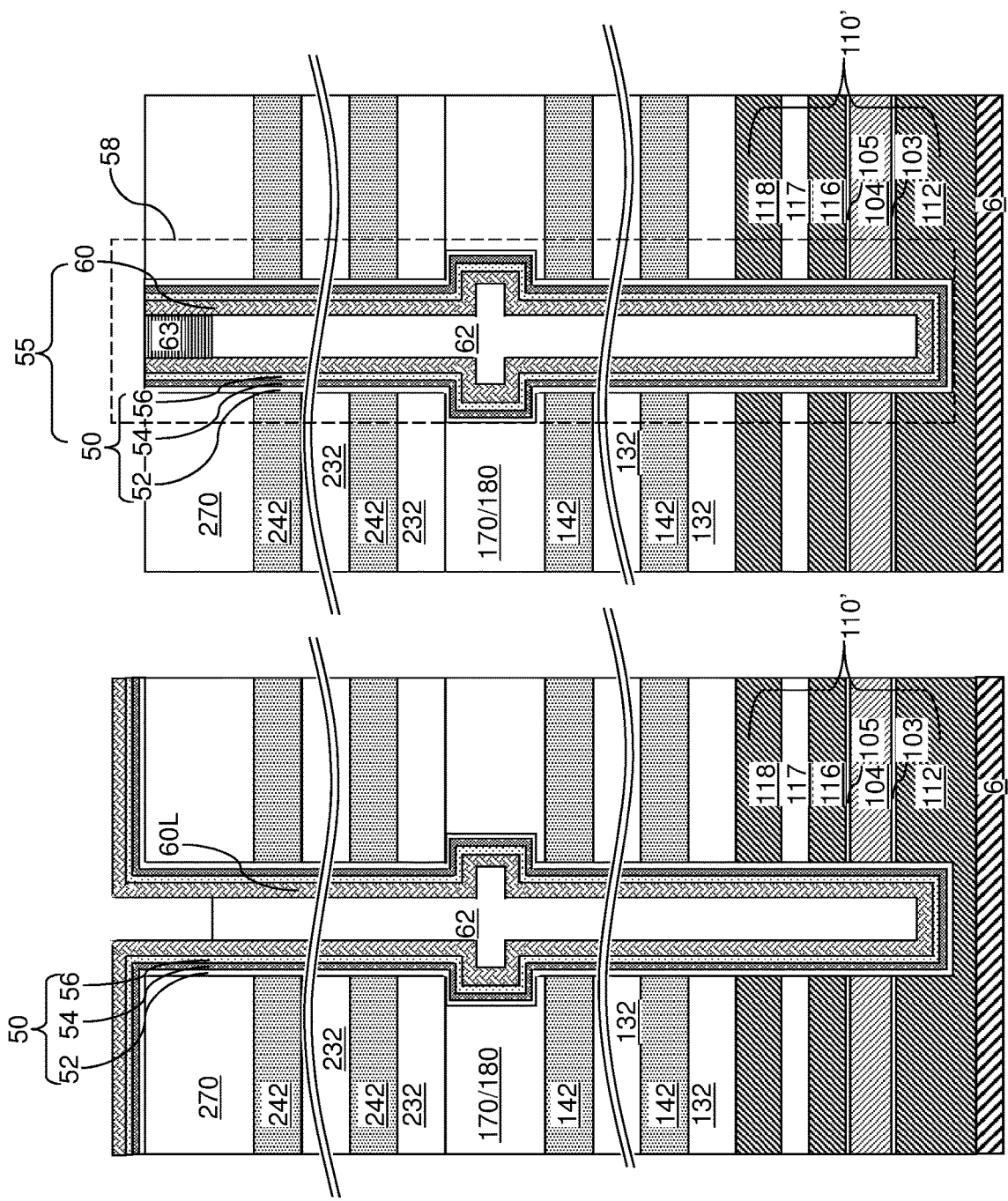

THREE-DIMENSIONAL MEMORY DEVICE CONTAINING COMPACT BIT LINE SWITCH CIRCUIT AND METHOD OF MAKING THE SAME

FIELD

The present disclosure relates generally to the field of semiconductor devices, and particular to a three-dimensional memory device having a compact bit line switch circuit and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure includes a three-dimensional NAND memory array located over a substrate and including bit lines, and an array of bit line connection switches located over the substrate and electrically connected to the bit lines, wherein each of the bit line connection switches comprises a series connection of a first field effect transistor and a second field effect transistor that include a common active region. The first field effect transistor includes a first gate electrode, a first semiconductor channel extending between the common active region and a first active region, the second field effect transistor includes a second gate electrode, a second semiconductor channel extending between the common active region and a second active region, and the common active region is offset farther from the first gate electrode than from the second gate electrode.

According to another embodiment of the present disclosure, a method of forming a semiconductor structure, comprises forming an array of bit line connection switches on a semiconductor substrate, wherein each of the bit line connection switches is formed by forming a first gate electrode and a second gate electrode over a semiconductor material region having a doping of a first conductivity type and located in the semiconductor substrate, forming extension doping portions in surface portions of semiconductor material region that are not masked by the first gate electrode or the second gate electrode by performing a first ion implantation process that implants dopants of a second conductivity type that is the opposite of the first conductivity type, forming a first dielectric gate spacer and a second dielectric gate spacer on sidewalls of the first gate electrode and the second gate electrode, respectively, by conformally depositing a dielectric material layer and anisotropically etching the dielectric material layer, forming an implantation mask layer over the semiconductor material region, wherein the implantation mask layer includes an outer periphery that overlies the first gate electrode and includes an opening that exposes at least a portion of the second gate electrode and the second dielectric gate spacer, wherein the implantation mask layer covers the entire first dielectric gate spacer which faces the second gate electrode, and forming a first deep active portion, a common deep active portion, and a second deep active portion by performing a second ion implantation process that implants additional dopants of the second conductivity type into the respective extension doping portions that are not masked by the implantation mask layer and through the opening in the implantation mask layer, such that the common deep active portion is offset farther from the first gate electrode than from the second gate electrode, forming a three-dimensional NAND memory array over the array of bit line connection switches; and electrically connecting bit lines of the three-dimensional NAND memory array to the array of bit line connection switches.

BRIEF DESCRIPTION OF THE DRAWINGS

FIG. 2A is a vertical cross-sectional view of a region of the exemplary structure after formation of gate stack structures according to an embodiment of the present disclosure.

FIG. 2B is a top-down view of the region of the exemplary structure of FIG. 2A.

FIG. 3A is a vertical cross-sectional view of a region of the exemplary structure after formation of extension active portions according to an embodiment of the present disclosure.

FIG. 3B is a top-down view of the region of the exemplary structure of FIG. 3A.

FIG. 4A is a vertical cross-sectional view of a region of the exemplary structure after formation of dielectric gate spacers according to an embodiment of the present disclosure.

FIG. 4B is a top-down view of the region of the exemplary structure of FIG. 4A.

FIG. 5A is a vertical cross-sectional view of a region of the exemplary structure after formation of an implantation mask layer and deep active portions according to an embodiment of the present disclosure.

FIG. 5B is a top-down view of the region of the exemplary structure of FIG. 5A.

FIG. 6A is a vertical cross-sectional view of a region of the exemplary structure after formation of a first dielectric material layer according to an embodiment of the present disclosure.

FIG. 6B is a top-down view of the region of the exemplary structure of FIG. 6A.

FIG. 7A is a vertical cross-sectional view of a region of the exemplary structure after formation of contact via structures according to an embodiment of the present disclosure.

FIG. 7B is a top-down view of the region of the exemplary structure of FIG. 7A.

FIGS. 19A-19D illustrate sequential vertical cross-sectional views of a memory opening during formation of a memory opening fill structure according to an embodiment of the present disclosure.

DETAILED DESCRIPTION

Figure 1B:
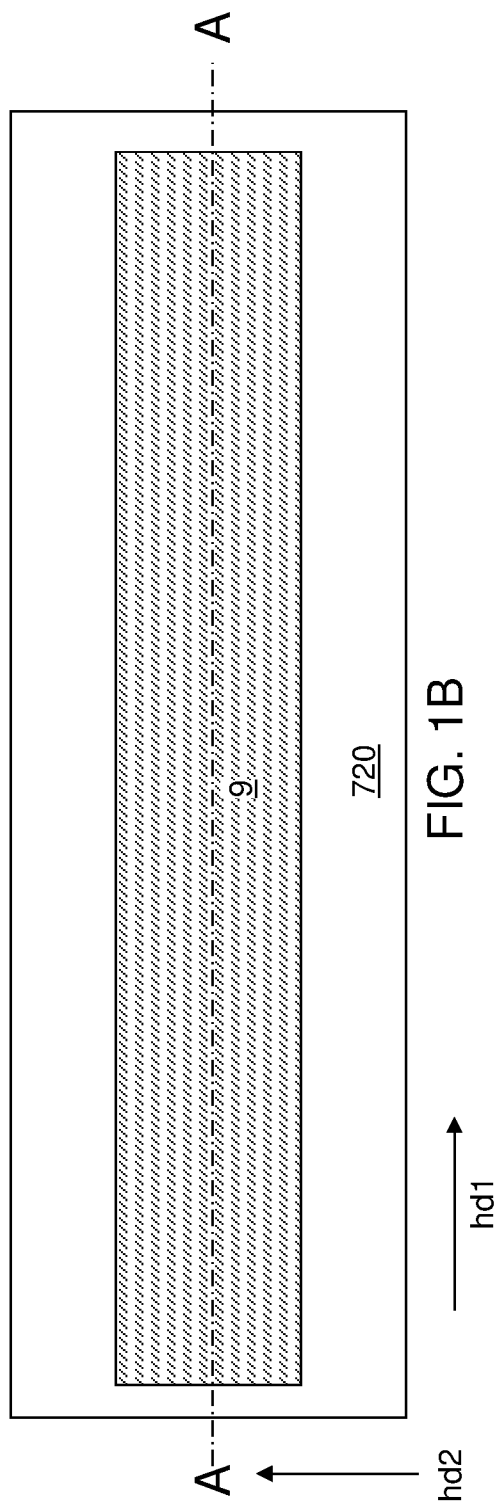
FIG. 1B is a top-down view of the region of the exemplary structure of FIG. 1A.

In one embodiment, a three-dimensional vertical NAND device may use gate induced drain leakage (GIDL) current to perform an erase operation. For example, a CMOS under array type of three-dimensional vertical NAND device may contain the CMOS containing driver circuit (i.e., peripheral circuit) under the array of vertical NAND strings may use GILD current top perform the erase operation. In this case, bit lines connected to a respective subset of the three-dimensional vertical NAND strings are electrically disconnected from a sense amplifier circuit and electrically connected to an erase supply voltage source. A switch configured to provide a switchable electrical connection between an input node of a sense amplifier and the erase supply voltage source is provided for each bit line. Given a high number of bit lines in a typical three-dimensional memory array, the switches can occupy a significant area of a semiconductor chip. Embodiments of the present disclosure provide a compact bit line switch circuit in which the sense amplifier switch transistor (e.g., a bit line hook up transistor) which is connected to the bit lines has one active region (e.g., drain region) that is offset from the sidewall spacer of the gate electrode, and optionally another active region (e.g., source region) that is aligned to the sidewall spacer of the gate electrode. In contrast, the erase voltage supply transistor has both active regions which are not offset from (i.e., are aligned to) the sidewall spacers of the gate electrode. This configuration of the switching transistors in which the active regions are not offset in the erase voltage supply transistors may decrease the area of the switching transistors by as much as over 30%.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The substrate may include integrated circuits fabricated thereon, such as driver circuits for a memory device Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1A:
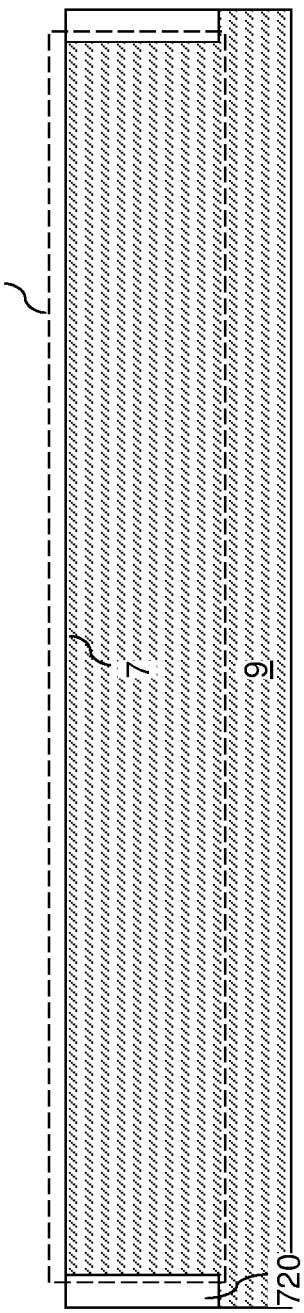
FIG. 1A is a vertical cross-sectional view of a region of the exemplary structure after formation of a shallow trench isolation structure that defines semiconductor material regions according to an embodiment of the present disclosure.

Referring to FIGS. 1A and 1B, a region of an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 maybe a semiconductor wafer, a doped well in the semiconductor wafer or a semiconductor material layer located over a substrate, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

The upper portion of semiconductor substrate layer 9 can have a doping of a first conductivity type, which may be p-type or n-type. If n-type field effect transistors are to be subsequently formed, the upper portion of the semiconductor substrate layer 9 can have a p-type doping (e.g., a p-type well). The dopant concentration in the upper portion of the semiconductor substrate layer 9 can be in a range from $1.0 \times 10^{14}/cm^3$ to $1.0 \times 10^{18}/cm^3$, although lesser and greater dopant concentrations can also be employed. A lower portion of the semiconductor substrate layer 9 can optionally have a doping of a second conductivity type, which is the opposite of the first conductivity type. For example, if the first conductivity type is p-type, the second conductivity type is n-type, and vice versa.

A two-dimensional array of semiconductor material regions 29 is defined by forming shallow trenches in an upper region of the substrate semiconductor layer 9 such that bottom surfaces of the shallow trenches reach the portion of the substrate semiconductor layer 9 having a doping of the second conductivity type. For example, a photoresist layer (not shown) can be applied over the major surface 7 of the substrate semiconductor layer 9, and can be lithographically patterned to form a two-dimensional periodic array of rectangular photoresist material portions (not shown). Each rectangular photoresist material portion can have a pair of lengthwise sidewalls that extend along a first horizontal direction hd1 (e.g., word line direction) and a pair of widthwise sidewalls that extend along a second horizontal direction hd2 (e.g., bit line direction) that is perpendicular to the first horizontal direction hd1. The length-to-width ratio of each rectangular photoresist material portion can be in a range from 2 to 32, such as from 4 to 16, although lesser and greater length-to-width ratios can also be employed.

An anisotropic etch process can be performed to remove regions of the upper portion of the substrate semiconductor layer 9 that are not covered by the two-dimensional periodic array of rectangular photoresist material portions. A two-dimensional network of shallow trenches can be formed in the voids from which the material of the substrate semiconductor layer 9 is removed. The depth of the two-dimensional network of shallow trenches can be in a range from 60 nm to 600 nm, such as from 120 nm to 300 nm, although lesser and greater depths can also be employed. Each isolated portion of the substrate semiconductor layer 9 that is laterally surrounded by the two-dimensional network of shallow trenches constitutes a semiconductor material region 29. A dielectric material such as silicon oxide can be deposited in the shallow trenches. Excess portions of the dielectric material can be removed from above the horizontal plane including the major surface 7 of the substrate semiconductor layer 9 by a planarization process such as a chemical mechanical planarization (CMP) process. The remaining portion of the dielectric material filling the two-dimensional network of shallow trenches constitutes a shallow trench isolation structure 720. The illustrated area of FIGS. 1A and 1B corresponds to the area of one of the semiconductor material regions 29 of the array of such regions.

Referring to FIGS. 2A and 2B, a gate dielectric layer, a conductive gate material layer, and a gate cap dielectric layer can be sequentially deposited on the major surface 7 of the substrate semiconductor layer 9. The gate dielectric layer includes a gate dielectric material such as silicon oxide and/or a dielectric metal oxide. The conductive gate material layer includes doped semiconductor material and/or a metal or metal alloy gate material such as tungsten, tungsten silicide, titanium silicide, etc. The gate cap dielectric layer includes a dielectric material such as silicon nitride.

The gate cap dielectric layer, the conductive gate material layer, and the gate dielectric layer can be patterned, for example, by application and patterning of a photoresist layer thereabove, and by transferring the pattern in the photoresist layer through the gate cap dielectric layer, the conductive gate material layer, and the gate dielectric layer employing an anisotropic etch process. The anisotropic etch process can stop on the top surface of the substrate semiconductor layer 9. Patterned portions of the gate cap dielectric layer constitute gate cap dielectrics 758, patterned portions of the conductive gate material layer constitute gate electrodes 754, and patterned portions of the gate dielectric layer constitutes gate dielectrics 752. Each stack of a gate dielectric 752, a gate electrode 754, and a gate cap dielectric 758 constitutes a gate stack (752, 754, 758). The photoresist layer can be subsequently removed, for example, by ashing. In case n-type field effect transistors are subsequently formed within each semiconductor material region 29, the gate electrodes 754 can include n-doped polysilicon or an n-doped amorphous silicon that can be converted into n-doped polysilicon in a subsequent anneal process.

In one embodiment, each of the semiconductor material regions 29 can have a rectangular horizontal cross-sectional shape. The lengthwise direction of the rectangular horizontal cross-sectional shape of each semiconductor material region 29 can be along the first horizontal direction hd1, and the gate stacks (752, 754, 758) can laterally extend along the second horizontal direction hd2, that is perpendicular to the first horizontal direction hd1.

At least one first gate structure 750A including a respective first gate stack (752, 754, 758) and at least one second gate structure 750B including a respective second gate stack (752, 754, 758) can extend across each semiconductor material region 29. In one embodiment, a pair of first gate structures 750A and a pair of second gate structures 750B can extend across each semiconductor material region 29 along the second horizontal direction hd2. Each of the first gate structures 750A can be proximal to widthwise sidewalls of a respective semiconductor material region 29, and each of the second gate structures 750B can be proximal to the geometrical center of the respective semiconductor material region 29. Thus, the pair of first gate structures 750A and the pair of second gate structures 750B can be arranged such that a sequence of a first gate structure 750A, a second gate structure 750B, an additional second gate structure 750B, and an additional first gate structure 750A is arranged, in order, along the first horizontal direction hd1 across each semiconductor material region 29. The width of each gate structure (750A, 750B) along the first horizontal direction hd1 can be in a range from 30 nm to 100 nm, although lesser and greater widths can also be employed. In one embodiment, all gate structures (750A, 750B) can have the same width throughout.

The spacing between neighboring pairs of gate structures (750A, 750B) can be selected such that a gate dielectric spacer can be subsequently formed around each gate structure (750A, 750B) without inducing merging of neighboring pairs of gate dielectric spacers. Further, the spacing between neighboring pairs of gate structures (750A, 750B) can be selected such that a contact via structure can be subsequently formed between each neighboring pair of gate structures (750A, 750B). According to an aspect of the present disclosure, the spacing between the neighboring pair of two second gate structures 750B can be greater than or equal to the sum of the lateral dimension of a contact via structures to be subsequently formed therebetween and twice the lateral thickness of a dielectric gate spacer to be subsequently formed. The spacing between each neighboring pair of a first gate structure 750A and a second gate structure 750B can be greater than the sum of the lateral dimension of a contact via structures to be subsequently formed therebetween and at least twice the lateral thickness of a dielectric gate spacer to be subsequently formed. The lateral dimension of each physically exposed portion of a semiconductor material region 29 between a widthwise edge of the semiconductor material region 29 and a proximal one of the first gate structures 750A can be greater than the sum of the lateral dimension of a contact via structures to be subsequently formed therebetween and the lateral thickness of a dielectric gate spacer to be subsequently formed.

Referring to FIGS. 3A and 3B, extension active portions 741 (i.e., so-called N-low doped drain ("LDD") regions) can be formed by implanting dopants of a second conductivity type into surface portions of each semiconductor material region 29 that is not masked by the gate structures (750A, 750B). As used herein, an "extension active portion" refers to an extension portion of an active region. As used herein, an "active region" refers to a source region or a drain region of a field effect transistor. As used herein, an "extension portion" of an active region refers to a portion of the active region having a lower dopant concentration than another portion of the active region that has a higher dopant concentration.

The gate structures (750A, 750B) can be used as an implantation mask layer during a first ion implantation process in which dopants of the second conductivity type are implanted into the surface portions of the semiconductor material regions 29. For example, if the semiconductor material region 29 has a p-type doping, n-type dopants can be implanted into the unmasked surface portions of the semiconductor material region 29 to form the extension active portions 741. The atomic concentration of the dopants of the second conductivity type in each extension active portion 741 can be in a range from $1.0 \times 10^{16}/cm^3$ to $2.0 \times 10^{19}/cm^3$, such as from $1.0 \times 10^{17}/cm^3$ to $1.0 \times 10^{18}/cm^3$. The depth of the bottom surface of each extension active portion 741 can be in a range from 10 nm to 100 nm, such as from 20 nm to 50 nm, although lesser and greater depths can also be used.

A surface portion of the semiconductor material region 29 underlying a first gate structure 750A and laterally extending between a neighboring pair of extension active portions 741 constitutes a first semiconductor channel 746A. A surface portion of the semiconductor material layer 29 underlying a second gate structure 750B and laterally extending between a neighboring pair of extension active portions 741 constitutes a second semiconductor channel 746B. The first semiconductor channels 746A and the second semiconductor channels 746B are herein collectively referred to as semiconductor channels 746.

Referring to FIGS. 4A and 4B, a dielectric material layer can be conformally deposited on the physically exposed surfaces of the exemplary structure. The dielectric material layer includes a dielectric material such as silicon oxide and/or silicon nitride. The dielectric material layer can be deposited by a conformal deposition process such as a chemical vapor deposition process. The thickness of the dielectric material layer can be in a range from 10 nm to 150 nm, such as from 20 nm to 80 nm, although lesser and greater thicknesses can be employed.

An anisotropic etch process can be performed to remove horizontal portions of the dielectric material layer. Each remaining vertical portion of the dielectric material layer constitutes a dielectric gate spacer 756. Each dielectric gate spacer 756 can laterally surround, and encircle, a respective one of the dielectric gate spacers 756, and is incorporated into a respective one of the gate structures (750A, 750B). As such, each of the gate structures (750A, 750B) can include a contiguous set of a gate dielectric 752, a gate electrode 754, a gate cap dielectric 758, and a dielectric gate spacer 756.

A gate dielectric 752 within a first gate structure 750A is herein referred to as a first gate dielectric 752. A gate electrode 754 within a first gate structure 750A is herein referred to as a first gate electrode 754. A gate cap dielectric 758 within a first gate structure 750A is herein referred to as a first gate cap dielectric 758. A dielectric gate spacer 756 that contacts, and laterally surrounds, a first gate electrode 754 is herein referred to as a first dielectric gate spacer 756A. A gate dielectric 752 within a second gate structure 750B is herein referred to as a second gate dielectric 752. A gate electrode 754 within a second gate structure 750B is herein referred to as a second gate electrode 754. A gate cap dielectric 758 within a second gate structure 750B is herein referred to as a second gate cap dielectric 758. A dielectric gate spacer 756 that contacts, and laterally surrounds, a second gate electrode 754 is herein referred to as a second dielectric gate spacer 756B.

Referring to FIGS. 5A and 5B, an implantation mask layer 747 is formed over the exemplary structure. The implantation mask layer 747 is a patterned mask structure that is thick enough to block implantation of additional dopants of the second conductivity type during a subsequent second ion implantation process. For example, the implantation mask layer 747 can be a photoresist material layer that is applied over the exemplary structure by spin coating, and is patterned by lithographic exposure and development.

According to an aspect of the present disclosure, the implantation mask layer 747 can continuously extend between a first edge that overlies one of a pair of first gate structures 750A and a second edge that overlies the other of a pair of first gate structures 750A within each area of a semiconductor material region 29. The first edge and the second edge can laterally extend along the second horizontal direction hd2. The entire area between the first edge and the second edge can be covered by the implantation mask layer 747 except for an elongated opening 748 overlying a pair of second gate structures 750B in a semiconductor material region 29.

As shown in FIG. 5A, the first gate structures 750A may be located in respective first field effect transistors T1, while the second gate structures 750B may be located in respective second field effect transistors T2. The first transistors T1 may comprise sense amplifier switch transistors (e.g., a bit line hook up transistors) which are configured to electrically connect a respective bit line to a sense amplifier circuit. The second transistors T2 may comprise erase voltage supply transistors which are configured to electrically connect the respective bit line to the erase voltage supply source.

According to an aspect of the present disclosure, the first dielectric gate spacers 756A of the first transistors T1 that face the second transistors T2 (e.g., which are located on the drain sides of the gate electrodes 754 of the first transistors T1) are covered by the implantation mask layer 747 and are not exposed through the opening 748 in the implantation mask layer 747. As shown in FIG. 5A, a portion of the implantation mask layer 747 contacts the top surface of the substrate, which can be surfaces of the extension active portions 741 of the drain regions of the first transistors T2. In contrast, the first dielectric gate spacers 756A of the first transistors T1 that face away from the second transistors T2 (e.g., which are located on the source sides of the gate electrodes 754 of the first transistors T1) and the second gate dielectric spacers 756B of the second transistors T2 have at least a portion that is exposed through the opening 748 in the implantation mask layer 747.

Dopants of the second conductivity (e.g., phosphorus and/or arsenic) are implanted into the opening 748 and outside the periphery of the implantation mask layer 747. Implanted regions of the semiconductor material in the substrate are converted into doped semiconductor portions that function as active regions. The implanted regions of the semiconductor material can have a greater depth than the extension active portions 741, and are herein referred to as deep active portions 742 (e.g., N+ source and drain regions). The deep active portions 742 can include dopants of the second conductivity type at a greater atomic concentration than the atomic concentration of dopants of the second conductivity type in the extension active portions 741. The atomic concentration of the dopants of the second conductivity type in each deep active portion 742 can be in a range from $5.0 \times 10^{18}/cm^3$ to $2.0 \times 10^{21}/cm^3$, such as from $2.0 \times 10^{20}/cm^3$ to $1.0 \times 10^{21}/cm^3$. The depth of the bottom surface of each deep active portion 742 can be in a range from 30 nm to 300 nm, such as from 60 nm to 150 nm, although lesser and greater depths can also be employed.

The second ion implantation process can form a pair of deep active portions 742 can include a pair of first deep active portions 742S (e.g., source regions of the first transistors T1), a pair of common deep active portions 742B (e.g., shared drain regions of adjacent first transistors T1 and second transistors T2), and a second deep active portion 742E (e.g., shared source region of adjacent second transistors T2). The pair of first deep active portions 742S is formed by implanting dopants of the second conductivity type into a respective one of the extension doping portions 741 that are not masked by the implantation mask layer 747 and located outside the outer peripheries of the implantation mask layer 747 that laterally extend along the second horizontal direction hd2. The pair of common deep active portions 742B and the second deep active portion 742E are formed by implanting dopants of the second conductivity type into the opening 748 in the implantation mask layer 747.

Each contiguous combination of a first deep active portion 742S and an extension doping portion 741 constitutes a first active region (742S, 741) (e.g., source regions of the first transistors T1). Each contiguous combination of a common deep active portion 742B and an extension doping portion 741 constitutes a common active region (742B, 741) (e.g., shared drain region of adjacent first transistor T1 and second transistor T2). Each contiguous combination of a second deep active portion 742E and an extension doping portion 741 constitutes a second active region (742E, 741) (e.g., shared source region of adjacent second transistors T2). Each contiguous combination of a first active region (742S, 741), a first semiconductor channel 746A, a common active region (742B, 741), and a first gate structure (752, 754, 758, 756) constitutes the first field effect transistor T1. Each contiguous combination of a second active region (742E, 741), a second semiconductor channel 746B, a common active region (742B, 741), and a second gate structure (752, 754, 758, 756) constitutes the second field effect transistor T2. Each adjoined combination of a first field effect transistor T1 and a second field effect transistor T2 constitutes a switch that can connect the node of a common active region (742B, 741) (e.g., which is electrically connected to a bit line) to either of a first active region (742S, 741) (e.g., which is electrically connected to sense amplifier circuit) or a second active region (742E, 741) (e.g., which is electrically connected erase voltage source) within the switch.

The first gate electrode 754 and the second gate electrode 754 within each switch can be connected to a logic circuitry (not shown) that is provided outside the area of the two-dimensional periodic array of semiconductor material regions 29. The logic circuitry can be configured such that only one of the first gate electrode 754 and the second gate electrode 754 is provided with a bias voltage that turns on the first field effect transistor T1 or the second field effect transistor T2. As such, the node of the common active region (742B, 741) within each switch is electrically connected to only one of the first active region (742S, 741) of the switch or the second active region (742E, 741) of the switch, thereby providing the series connection of the first field effect transistor T1 and the second field effect transistor T2 the functionality of an electrical switch.

In one embodiment, the common active region (742B, 741) of each switch is connected to a respective bit line of a three-dimensional array of memory elements to be subsequently formed. In this case, each switch can connect the node of a respective bit line to a node connected to the first active region (742S, 741) of the switch or to a node connected to the second active region (742E, 741) of the switch, and thus, can function as a bit line connection switch.

A pair of bit line connection switches is formed within each area of a semiconductor material region 29 that is laterally surrounded by the shallow trench isolation structure 720. As discussed above, the exemplary structure can include a two-dimensional periodic array of semiconductor material regions 29. As such, an array of bit line connection switches can be formed on the substrate, which is a semiconductor substrate.

Each of the bit line connection switches comprises a series connection of a first field effect transistor T1 and a second field effect transistor T2 that include a common active region (742B, 741). The first field effect transistor T1 includes a first semiconductor channel 746A extending between the common active region (742B, 741) and a first active region (742S, 741). The second field effect transistor T2 includes a second semiconductor channel 746B extending between the common active region (742B, 741) and a second active region (742E, 741). Each of the common active region (742B, 741), the first active region (742S, 741), and the second active region (742E, 741) has a respective extension doping portion 741 and a respective deep active portion (742S, 742B, 742E) having a greater depth than the respective extension doping portion 741 and having a higher atomic concentration of electrical dopants than the respective extension doping portion 741.

In one embodiment, an interface between the extension doping portion 741 of the first active region (742S, 741) and the deep active portion 742S of the first active region (742S, 741) is vertically coincident with a first outer sidewall 7561 of a first dielectric spacer 756A that laterally surrounds a gate electrode (i.e., the first gate electrode) 754 of the first field effect transistor T1. In other words, the deep active portion 742S of the first transistor is self-aligned to and not spaced apart from the first outer sidewall 7561 of the first dielectric spacer 756A of the first transistor T1.

In one embodiment, the extension doping portion 741 of the first active region (742S, 741) has a uniform width that is the same as a lateral thickness of the first dielectric gate spacer 756A. In one embodiment, the first outer sidewall 7561 of the first dielectric gate spacer 756A can be vertically coincident with an interface between the extension doping portion 741 of the first active region (742S, 741) and the first deep active portion 742S of the first active region (742S, 741). In one embodiment, a first inner sidewall of the first dielectric gate spacer 756A can be vertically coincident with an interface between the extension doping portion 741 of the first active region (742S, 741) and the first semiconductor channel 746A.

The deep active portion 742B of the common active region (742B, 741) is laterally spaced apart from the gate electrode (i.e., the first gate electrode) 754 of the first field effect transistor T1 by a first lateral offset distance LOD1 that is greater than a lateral thickness of the first dielectric gate spacer 756A, and is laterally spaced apart from a gate electrode of the second field effect transistor T2 by a second lateral offset distance LOD2 that equal to the lateral thickness of a second dielectric gate spacer 756B that laterally surrounds a gate electrode of the second field effect transistor T2. Thus, the first lateral offset distance LOD1 is wider than the second lateral offset distance LOD2. The deep active portion 742B is self-aligned to and is not offset from the outer surface 7562 of the second electric gate spacer 756B.

In one embodiment, an interface between the extension doping portion 741 of the second active region (742E, 741) and the deep active portion 742E of the second active region (742E, 741) is vertically coincident with a first outer sidewall 7562 of a second dielectric spacer 756B that laterally surrounds a gate electrode of the second field effect transistor T2. The deep active portion 742E is self-aligned to and is not offset from the outer surfaced 7562 of the second electric gate spacers 756B of the adjacent second transistors T2.

In one embodiment, interfaces between the extension doping portions 741 of any of the common active region (742B, 741), the first active region (742S, 741), and the second active region (742E, 741) and any of the first semiconductor channel 746A and the second semiconductor channel 746B is vertically coincident with a respective overlying one of interfaces between gate electrodes 754 and dielectric gate spacers 756 of the first and second field effect transistors (T1, T2).

In one embodiment, the common active region (742B, 741), the first active region (742S, 741), and the second active region (742E, 741) are located on a surface portion of the semiconductor material region 29 that is laterally surrounded by a shallow trench isolation structure 720. In one embodiment, the deep active portion 742S of the first active region (742S, 741) has a same width as the semiconductor material region 29 in the second horizontal direction hd2, and the deep active portion 742B of the common active region (742B, 741) and the deep active portion 742E of the second active region (742E, 741) have a smaller width than the semiconductor material region 29 in the second horizontal direction hd2.

In one embodiment, each of the deep active portions (742S, 742B, 742E) is formed entirely within an area of a respective one of the extension doping portions 741, and regions of the extension doping portions 741 that are implanted with the additional dopants of the second conductivity type are converted into, and are incorporated into, the deep active portions (742S, 742B, 742E).

Each area of a semiconductor material region 29 can include a series connection of a first field effect transistor T1 and a second field effect transistor T2, and an additional series connection of an additional first field effect transistor T1 and an additional second field effect transistor T2. The additional series connection of the additional first field effect transistor T1 and the additional second field effect transistor T2 includes an additional common active region (742B, 741) and an additional first active region (742S, 741) that are located on the surface portion of the semiconductor substrate. The second active region (742E, 741) of the second field effect transistor T2 is the same as (i.e., is shared with) the active region (742E, 741) of the adjacent second field effect transistor T2.

According to an aspect of the present disclosure, sense amplifiers and a voltage supply circuit containing an erase voltage supply output node can be formed on the semiconductor substrate outside the areas of the two-dimensional periodic array of semiconductor material regions 29 during the processing steps of 1A-5B. The sense amplifiers can include a circuitry that is configured to be connected through the first transistors T1 to the bit lines of the three-dimensional array of memory elements to be subsequently formed.

The voltage supply circuit can be configured to provide an erase voltage to the erase voltage supply output node, which can be applied through the second transistors T2 to a group of bit lines during an erase operation on a block of memory elements within the three-dimensional array of memory elements to be subsequently formed.

Referring to FIGS. 6A and 6B, the implantation mask layer 747 can be removed, for example, by ashing. A first dielectric material layer 764 can be deposited and planarized over the various gate structures (750A, 750B). The first dielectric material layer 764 may include a single dielectric material, or a layer stack of multiple dielectric materials having different material compositions. The first dielectric material layer 764 can include silicon nitride, undoped silicate glass, or a doped silicate glass. The topmost portion of the first dielectric material layer 764 can include a planarizable dielectric material such as silicon oxide. A planarization process may be performed to provide a planar top surface to the first dielectric material layer 764. The planarization process may employ chemical mechanical planarization and/or a recess etch process. The top surface of the first dielectric material layer 764 may be formed at the height of the topmost surfaces of the gate structures (750A, 750B), or may be formed above the height of the topmost surfaces of the gate structures (750A, 750B).

Referring to FIGS. 7A and 7B, a photoresist layer (not shown) can be applied over the first dielectric material layer 764, and can be lithographically patterned to form openings therethrough. The locations of the openings through the photoresist layer can be selected such that an opening in the photoresist layer overlies each of the deep active portions 742. Thus, five openings can be formed through the photoresist layer within each area of a semiconductor material region 29.

Contact via cavities are formed through the first dielectric material layer 764 underneath the openings in the photoresist layer by performing an anisotropic etch process that employs the photoresist layer as an etch mask layer. Each contact via cavity extends through the first dielectric material layer 764 to a top surface of a respective one of the deep active portions 742. In one embodiment, the entire sidewall of each contact via cavity above the first deep active portions 742S or above the common active portions 742B can be a sidewall of the first dielectric material layer 764. In one embodiment, the dielectric gate spacers 756 can include a dielectric material having a greater etch resistance than the material of the first dielectric material layer 764. For example, the dielectric gate spacers 756 can include silicon nitride, and the first dielectric material layer 764 can include undoped silicate glass, a doped silicate glass, or organosilicate glass. In this case, the anisotropic etch process that forms the contact via cavities can etch through the material of the first dielectric material layer 764 selective to the material of the dielectric gate spacers 764. The sidewall of each contact via cavity extending to a top surface of s second active portion 742E can include a sidewall of the first dielectric material layer 764 and sidewalls of two dielectric gate spacers 756 of the two adjacent second gate structures 750B. The photoresist layer can be subsequently removed, for example, by ashing.

At least one conductive material can be deposited in each of the contact via cavities. The at least one conductive material can include a metallic nitride liner material such as TiN, TaN, or WN, and a conductive fill material such as W, Co, Cu, Ru, or a heavily doped semiconductor material. Excess portions of the at least one conductive material can be removed from above the horizontal plane including the top surface of the first dielectric material layer 764 by a planarization process. The planarization process can employ a recess etch and/or chemical mechanical planarization. Contact via structures 782 are formed in the contact via cavities. The contact via structures 782 include two first contact via structures 78S, two common contact via structures 78B, and a second contact via structure 78E. The first contact via structures 78S may comprise source electrodes of the first transistors T1 that are electrically connected to sense amplifier circuits. The common contact via structures 78B may comprise shared drain electrodes of the first and second transistors that are connected to respective bit lines to be formed later. The second contact via structure 78E may comprise a shared source electrode of two adjacent second transistors T2 that is connected to the erase voltage source.

Figure 8:
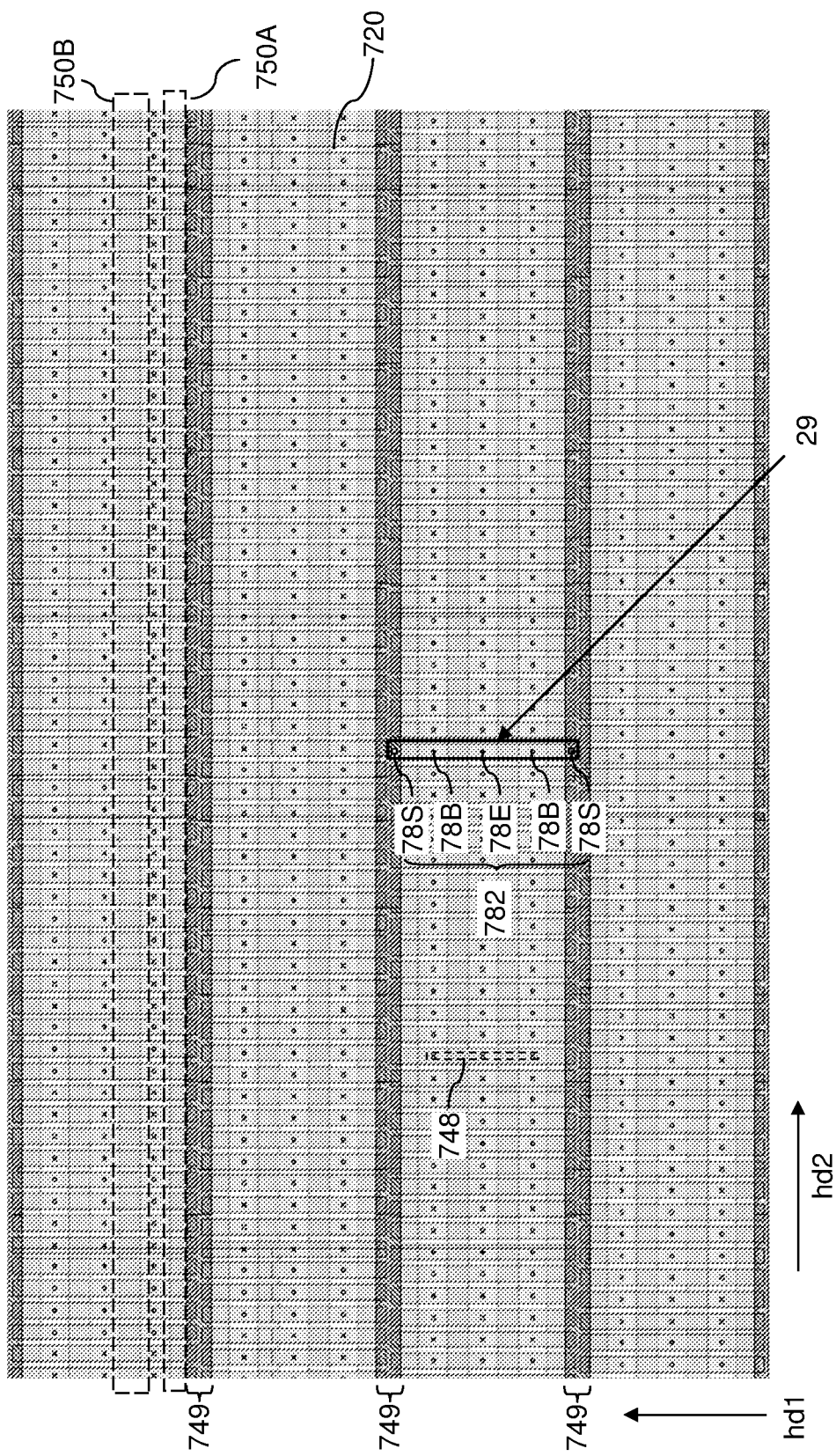
FIG. 8 is a top-down view of an array of bit line connection switches after the processing steps of FIGS. 7A and 7B according to an embodiment of the present disclosure.

Referring to FIG. 8, a global layout of contact via structures 782 is illustrated. A unit structure corresponding to the area of one semiconductor material region 29 includes two first contact via structures 78S, two common contact via structures 78B, and a second contact via structure 78E is repeated as a two-dimensional periodic array. The areas 749 that were exposed between adjacent implantation mask layers 747 during the step shown in FIGS. 5A and 5B are schematically illustrated as dark stripes extending in the second horizontal direction hd2.

Figure 9:
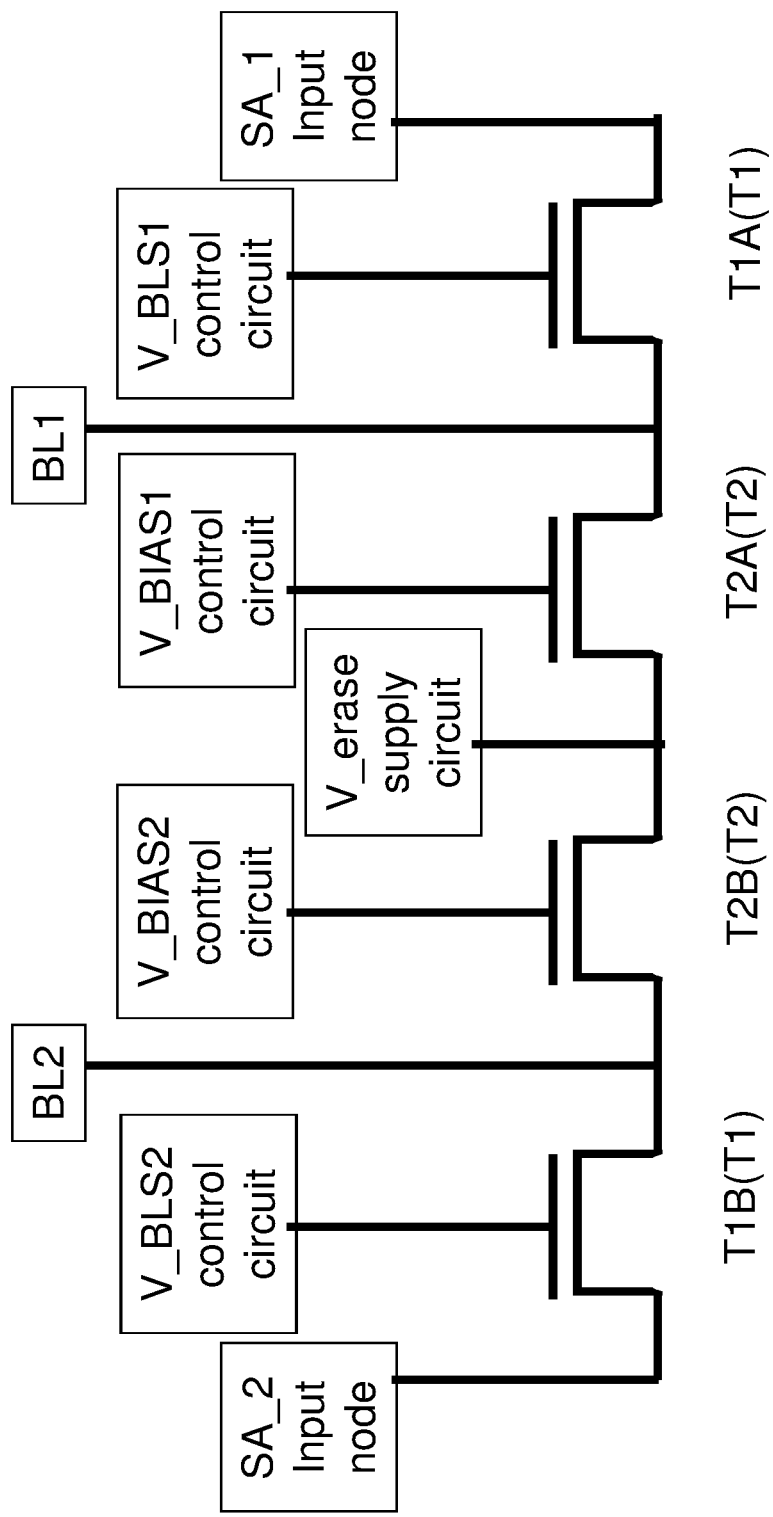
FIG. 9 is a circuit diagram of a pair of bit line connection switches formed on a single semiconductor material region according to an embodiment of the present disclosure.

Referring to FIGS. 8 and 9, each of the common contact via structures 78B is electrically connected to a respective one the bit lines (BL1 or BL2) to be subsequently formed through a first subset of the lower-level metal interconnect structures, memory-array-level connection via structures, and a subset of upper-level metal interconnect structures to be subsequently formed above the level of a three-dimensional memory array. Each of the first contact via structures 78S is subsequently electrically connected to a respective input node (SA1 input node or SA_2 input node) of a sense amplifier that is provided outside the area of the two-dimensional array of semiconductor material regions 29 by a second subset of lower-level metal interconnect structures to be subsequently formed. As such, the first contact via structures 78S are herein referred to as sense-amplifier-connection contact via structures. Each of the second contact via structures 78E is subsequently connected to an erase voltage supply output node, i.e., an output node of a voltage supply source (such as an erase voltage supply booster circuit "V_erase supply circuit") that is provided outside the area of the two-dimensional array of semiconductor material regions 29 by a third subset of lower-level metal interconnect structures to be subsequently formed. As such, the second contact via structures 78E are herein referred to as erase-voltage-connection contact via structures. A set of structures located within the area of each unit structure constitutes a pair of bit line connection switches.

Referring to FIG. 9, a circuit diagram of a pair of bit line connection switches formed in a single semiconductor material region 29 is illustrated. A series connection of a first field effect transistor T1A and a second field effect transistor T2A is connected to a series connection of a first additional field effect transistor T1B and a second additional field effect transistor T2B such that a second active region 742E is electrically connected to an output node of an erase voltage supply booster circuit (such as "V_erase supply circuit") which applies the erase voltage (V_erase). Each of first active region and an additional first active region within the pair of bit line connection switches is electrically connected by the second subset of the lower-level metal interconnect structures to an input node of a respective sense amplifier (SA1 input node or SA_2 input node) on the semiconductor substrate. Each of the second active regions and the additional second active regions is electrically connected by a third subset of the lower-level metal interconnect structures to an erase voltage supply output node of a voltage supply source (i.e., circuit) on the semiconductor substrate.

Generally, the lower-level metal interconnect structures to be subsequently formed electrically connects each first deep active portion 742S of the array of bit line connection switches to a respective one of the sense amplifiers (SA_1 input node or SA_2 input node), and each second deep active portion 742E of the array of bit line connection switches to the erase voltage supply output node of the voltage supply circuit.

The first gate electrodes 754 of the first field effect transistors T1 are connected to a respective output node of a bit line selection voltage control circuit (V_BLS1 control circuit or V_BLS2 control circuit), which provides a first bit line selection voltage applied (V_BLS1 or V_BLS2) to one of the first gate electrodes 754 and a second bit line selection voltage applied to the other of the first gate electrodes 754 within each pair of bit line connection switches. The second gate electrodes 754 of the second field effect transistors T2 are connected to a respective output node of a bit line bias voltage control circuit (V_BIAS1 control circuit or V_BIAS2 control circuit), which provides a first bit line erase control voltage (V_BIAS1 or V_BIAS2) applied to one of the second gate electrodes 754 and a second bit line erase control voltage applied to the other of the second gate electrodes 754 within each pair of bit line connection switches. The first bit line selection voltage and the first bit line erase control voltage can be complementary such that only one of the first field effect transistor T1A and the second field effect transistor T2A is turned on at a time to provide a voltage to a bit line that is electrically connected to the shared active region (742B, 741) of both transistors. The second bit line selection voltage and the second bit line erase control voltage can be complementary such that only one of the additional first field effect transistor T1B and the additional second field effect transistor T2B is turned on at a time.

Figure 10:
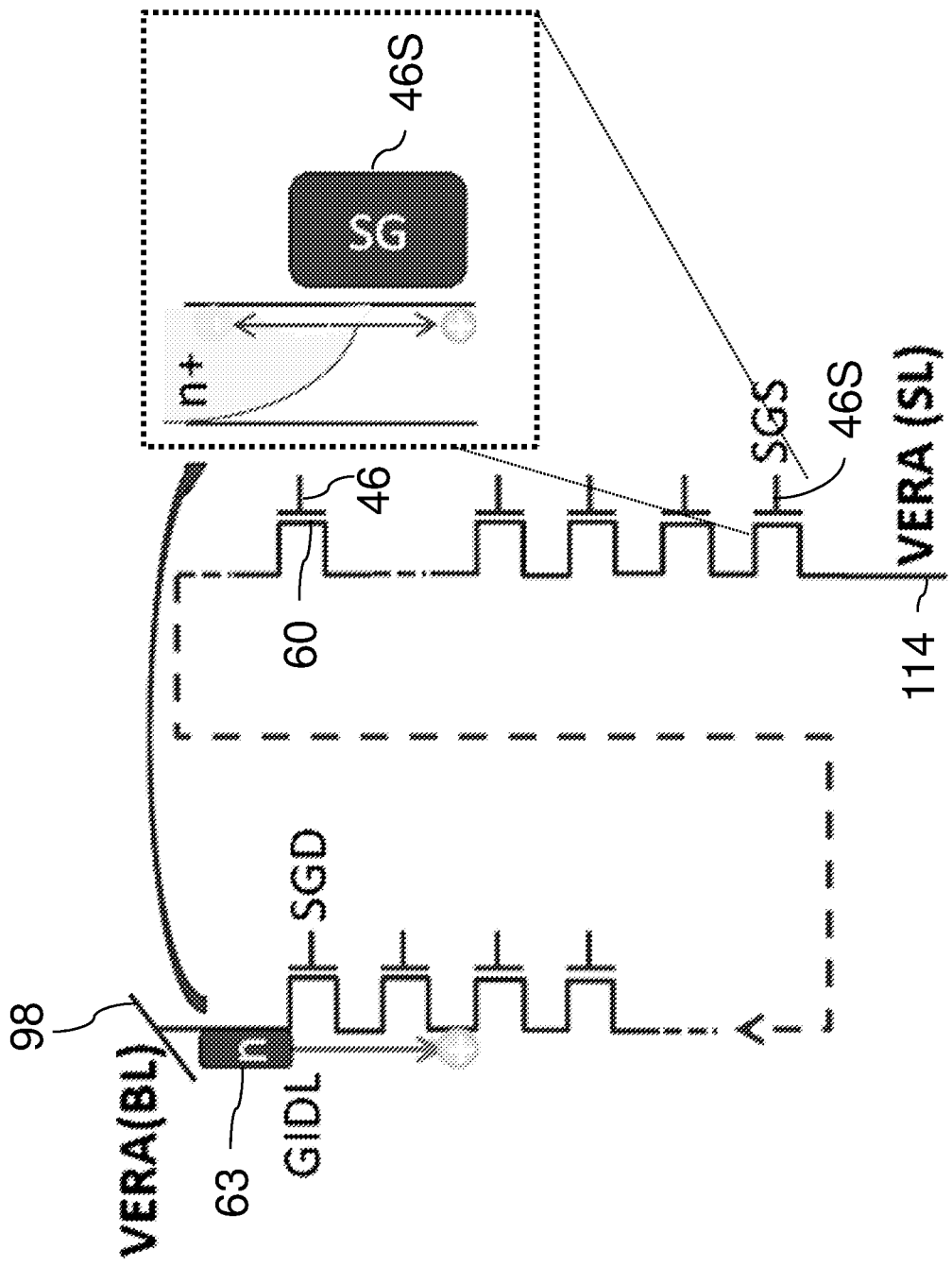
FIG. 10 is a circuit diagram of a vertical NAND string that can be formed over the array of bit line connection switches.

Referring to FIG. 10, a circuit diagram of a vertical NAND string that can be subsequently formed over the array of bit line connection switches of FIG. 8 is illustrated. The vertical NAND string can include a vertical semiconductor channel 60, a drain region 63 that is electrically connected to a top end of the vertical semiconductor channel 60 and a source line (e.g., source contact layer) 114 connected to the lower portion of the vertical semiconductor channel 60. A bit line 98 is electrically connected to the source region 63. The vertical semiconductor channel 60 can be the common channel for a series connection of vertical field effect transistors (e.g., vertical charge storage transistors of the vertical NAND strings) whose control gate electrodes 46 comprise or are electrically connected to word lines. At least one of the topmost field effect transistor is a drain select transistor (SGD) which is used to provide a drain-side select gate voltage that turns on or turns off the vertical NAND string. At least one of the bottommost field effect transistors is a source select transistor (SGS) which contains a select gate electrode 46S which is used to provide a source-side select gate voltage that turns on or turns off the vertical NAND string. In case the drain region 63 includes an n-doped semiconductor material, a bit line 98 (BL) connected to the drain region can be used to provide charge carriers (such as holes) that are injected into charge storage elements of each cell (e.g., charge storage transistor) of the vertical NAND string. An erase voltage VERA applied to the bit line 98 injects holes into the vertical semiconductor channel 60 which are used to erase the charge (e.g., electrons) stored in the charge storage regions of the memory cells during the GIDL erase process. The erase voltage VERA applied to the bit line 98 may be a high voltage (e.g., 15 to 25V). VERA is applied to the bit line when the bit line's 98 respective transistor T2 is turned on to electrically connect the V_erase supply circuit (i.e., erase supply booster circuit) to the bit line 98. In contrast, the program or read voltage applied to the bit line 98 during program or read operation may be lower than the erase voltage VERA, and may have a magnitude of 0 to 2.5V.

The program or read voltage is applied to the bit line 98 when the bit line's 98 respective transistor T1 is turned on to electrically connect the sense amplifier circuit to the bit line 98.

In some embodiments described above, the drain region of the first transistor T1 that is electrically connected to the bit line 98 is offset farther from the gate than the source region that is electrically connected to the sense amplifier. The additional offset of the drain region reduces or prevents breakdown of the first transistor T1 during its off state while the high erase voltage is applied. The additional offset may also decrease the leakage current in the first transistor T1. Thus, leakage current is decreased while the bit line 98 is connected to the sense amplifier through the first transistor T1 to provide accurate sensing of the state of a selected memory element connected to the bit line 98.

In contrast, the source and drain regions of the second transistor T2 are not offset from the gate by a different amount (i.e., they are offset only by the width of the spacers 756). The erase voltage is applied only after the gate is turned on (i.e., opened) by the V-BIAS control circuit, because the erase function takes a longer time than the gate open function. Therefore, there is a decreased concern about breakdown voltage of the T2 transistor during its off state. Thus, the additional offset of the drain region of the first transistor T1 is omitted from the source and drain regions of the second transistor T2. This reduces the lateral dimension of the bit line connection switches, and thus, can provide the two-dimensional array of bit line connection switches at a higher device density, i.e., with a smaller device footprint.

Figure 11A:
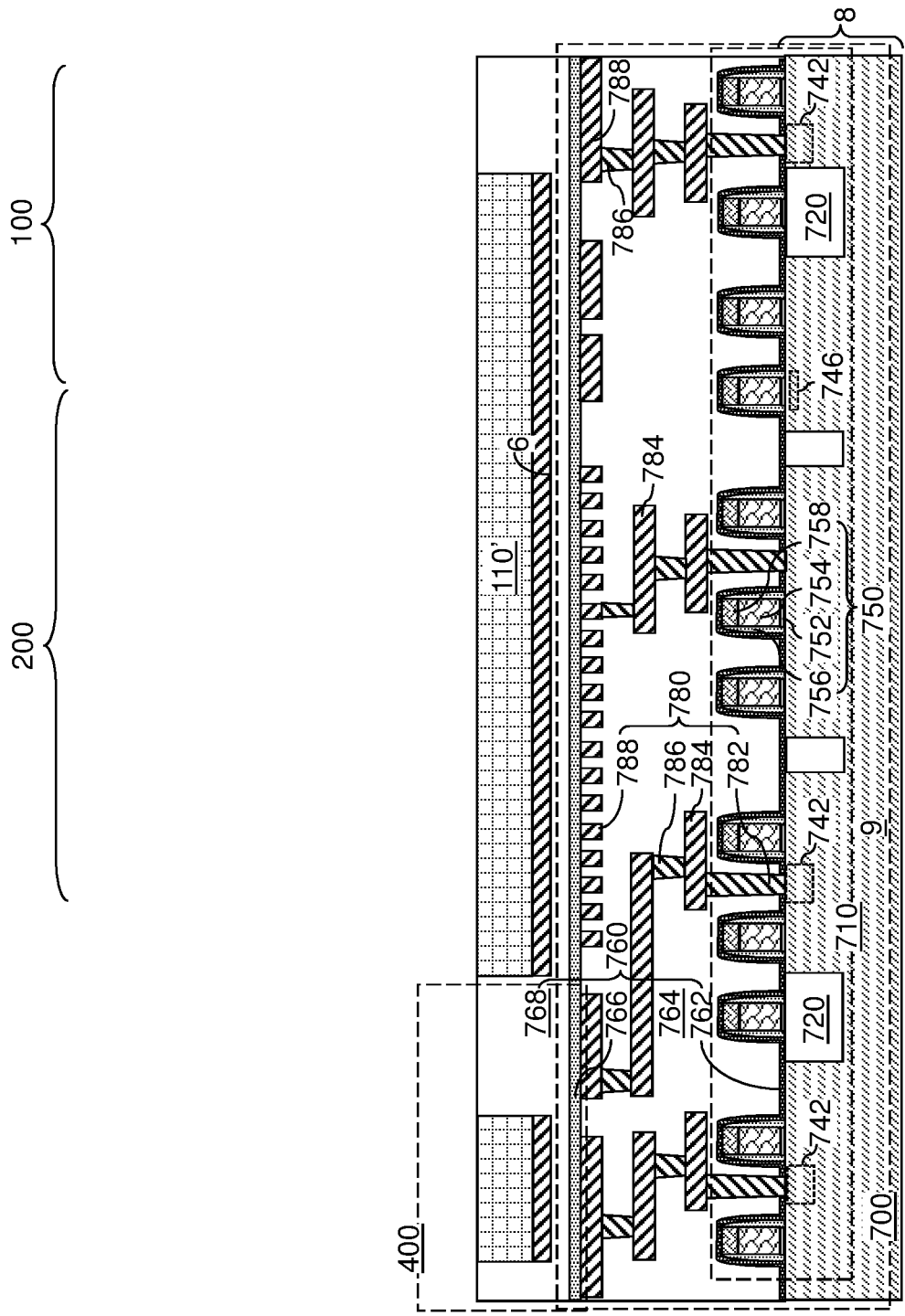
FIG. 11A is a vertical cross-sectional view of the exemplary structure after formation of semiconductor devices, lower level dielectric layers, lower metal interconnect structures, and in-process source level material layers on a semiconductor substrate according to an embodiment of the present disclosure.
Figure 11B:
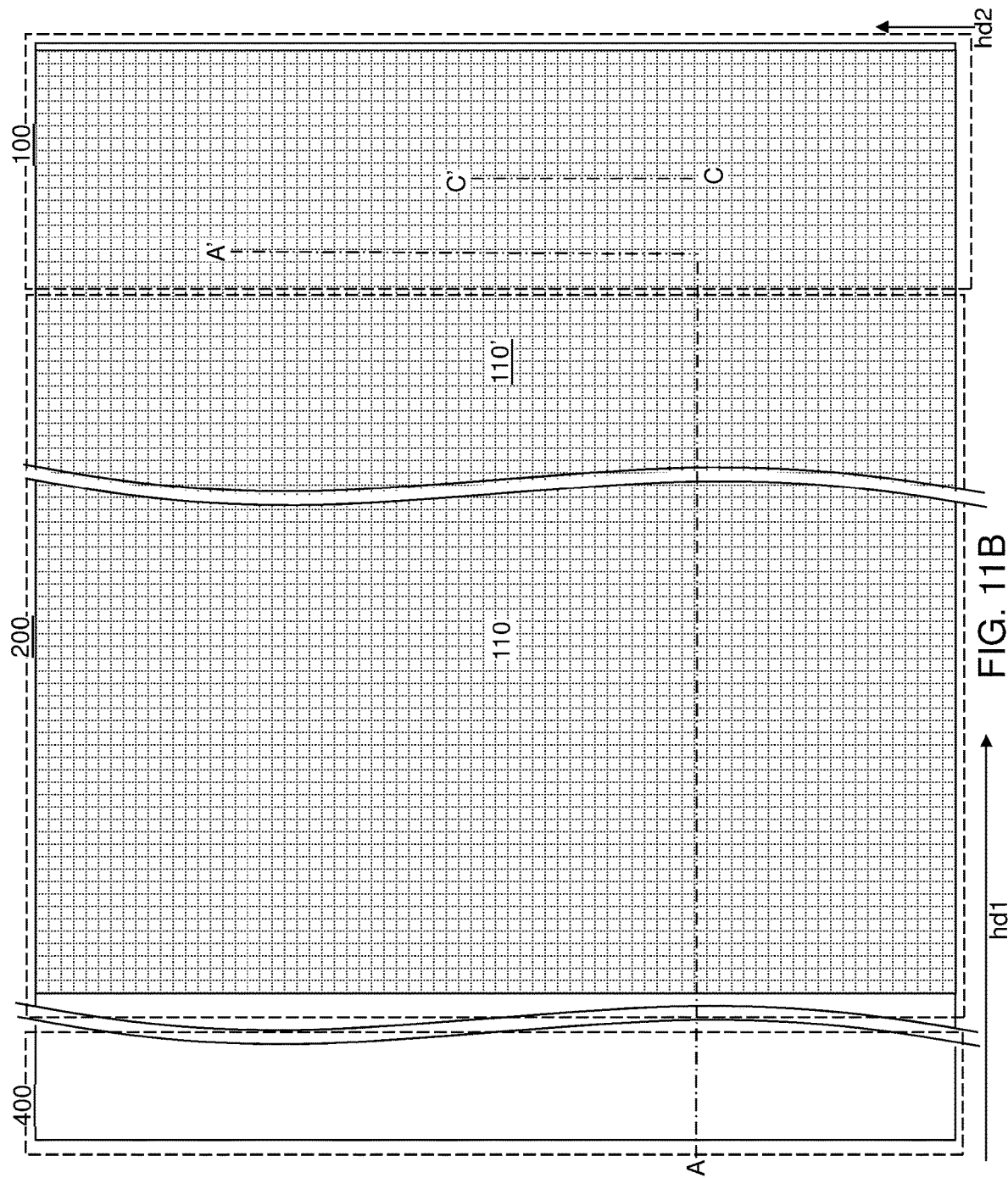
FIG. 11B is a top-down view of the exemplary structure of FIG. 11A. The hinged vertical plane A-A' is the plane of the vertical cross-sectional view of FIG. 11A.
Figure 11C:
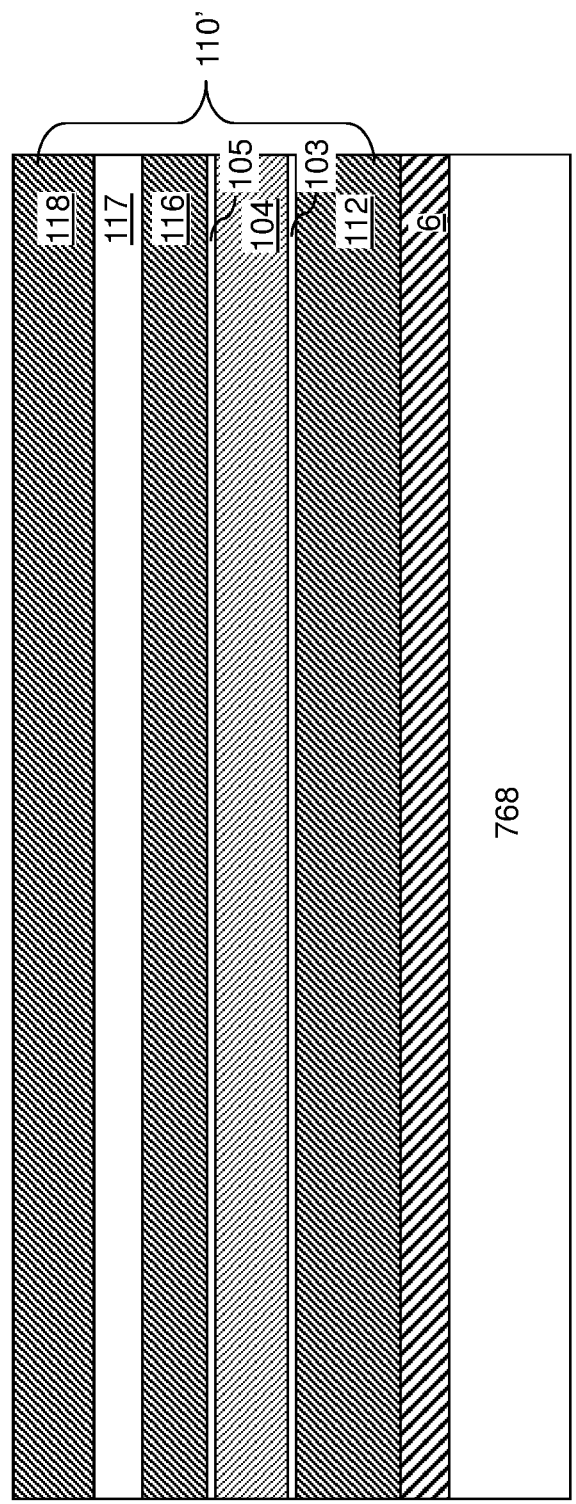
FIG. 11C is a magnified view of the in-process source level material layers along the vertical plane C-C' of FIG. 11B.

Referring to FIGS. 11A-11C, the exemplary structure according to an embodiment of the present disclosure is illustrated. FIG. 11C is a magnified view of an in-process source-level material layers 110' illustrated in FIGS. 11A and 11B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 12:
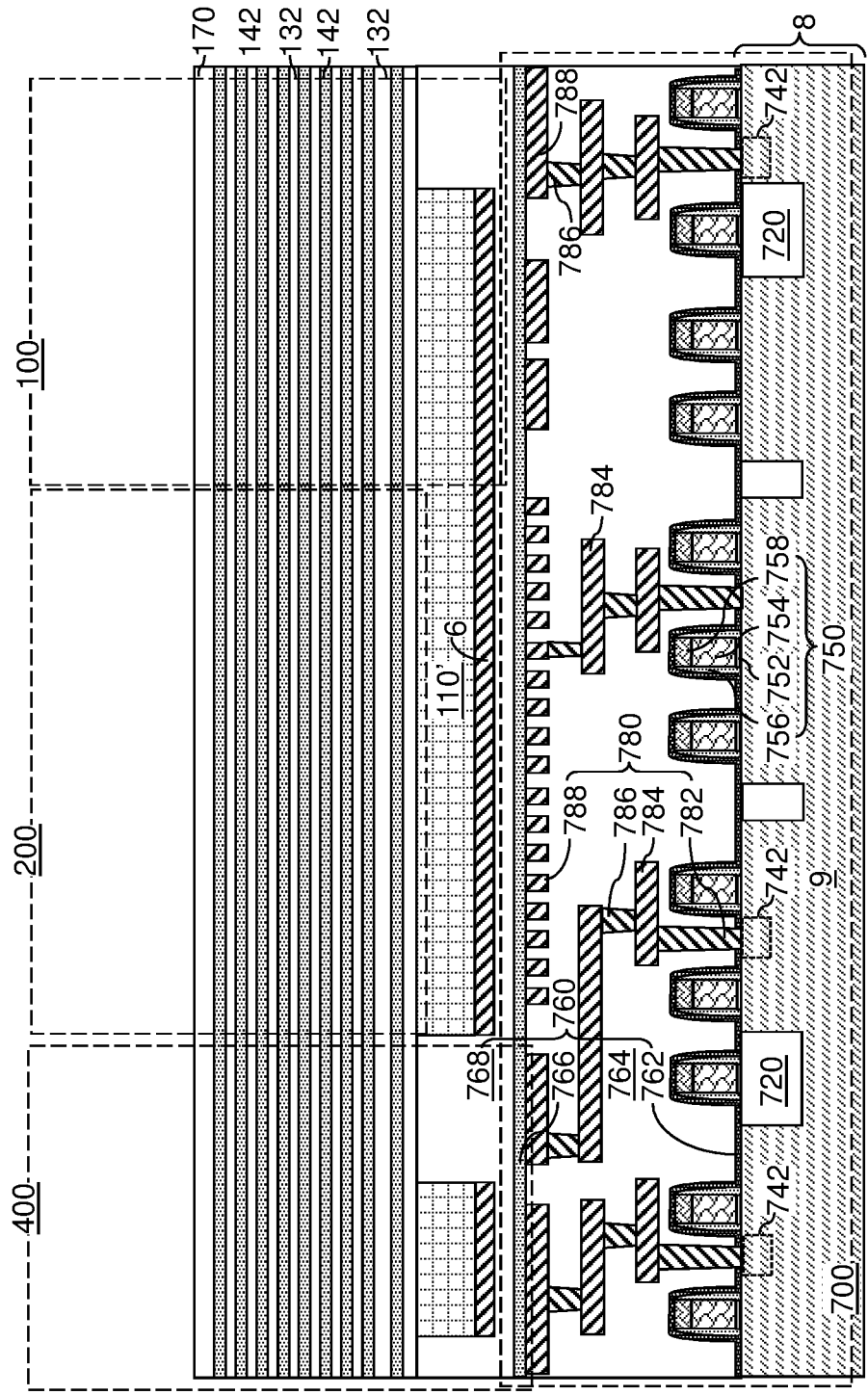
FIG. 12 is a vertical cross-sectional view of the exemplary structure after formation of a first-tier alternating stack of first insulting layers and first spacer material layers according to an embodiment of the present disclosure.

Referring to FIG. 12, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 13:
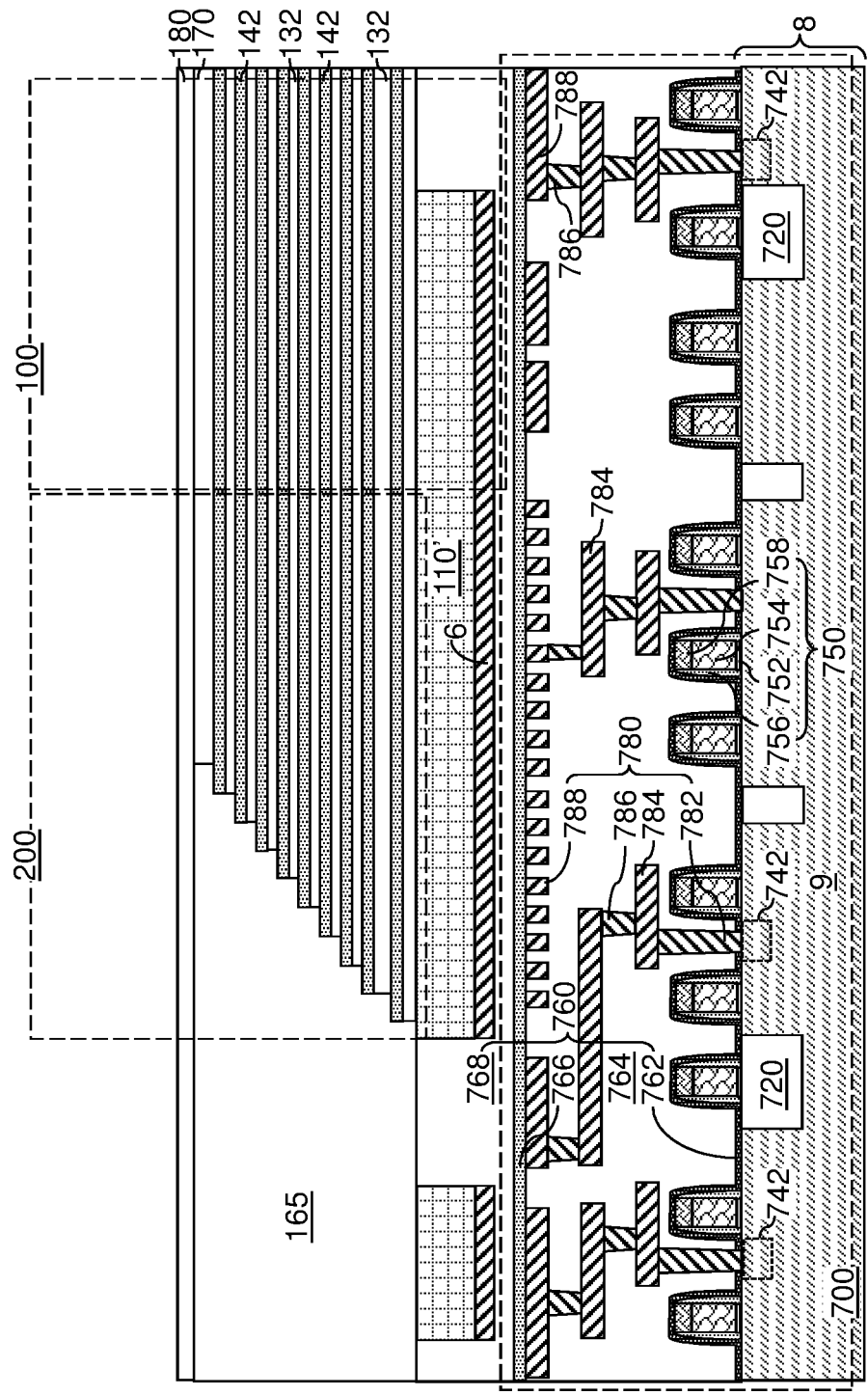
FIG. 13 is a vertical cross-sectional view of the exemplary structure after patterning a first-tier staircase region, a first retro-stepped dielectric material portion, and an inter-tier dielectric layer according to an embodiment of the present disclosure.

Referring to FIG. 13, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 14A:
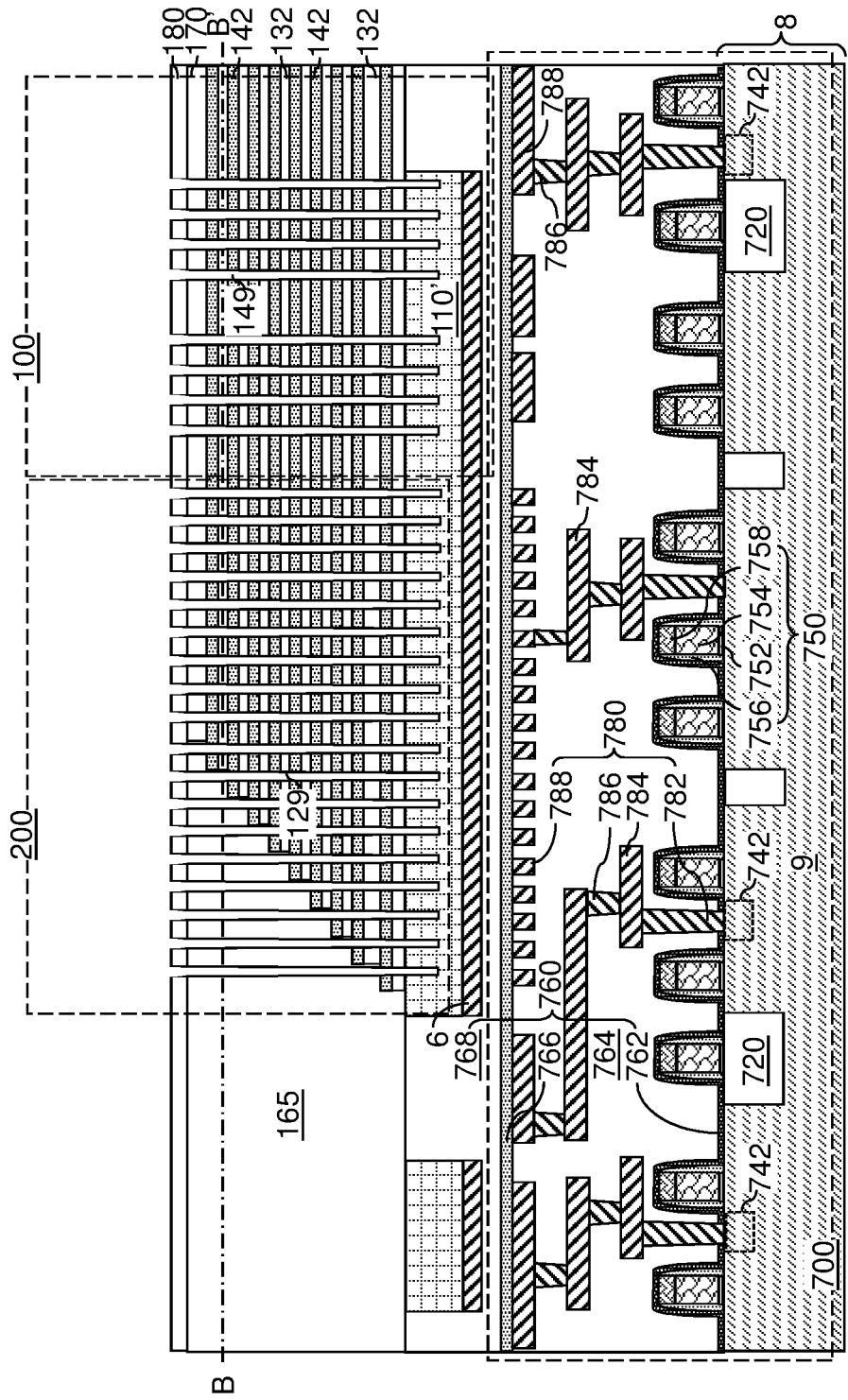
FIG. 14A is a vertical cross-sectional view of the exemplary structure after formation of first-tier memory openings and first-tier support openings according to an embodiment of the present disclosure.
Figure 14B:
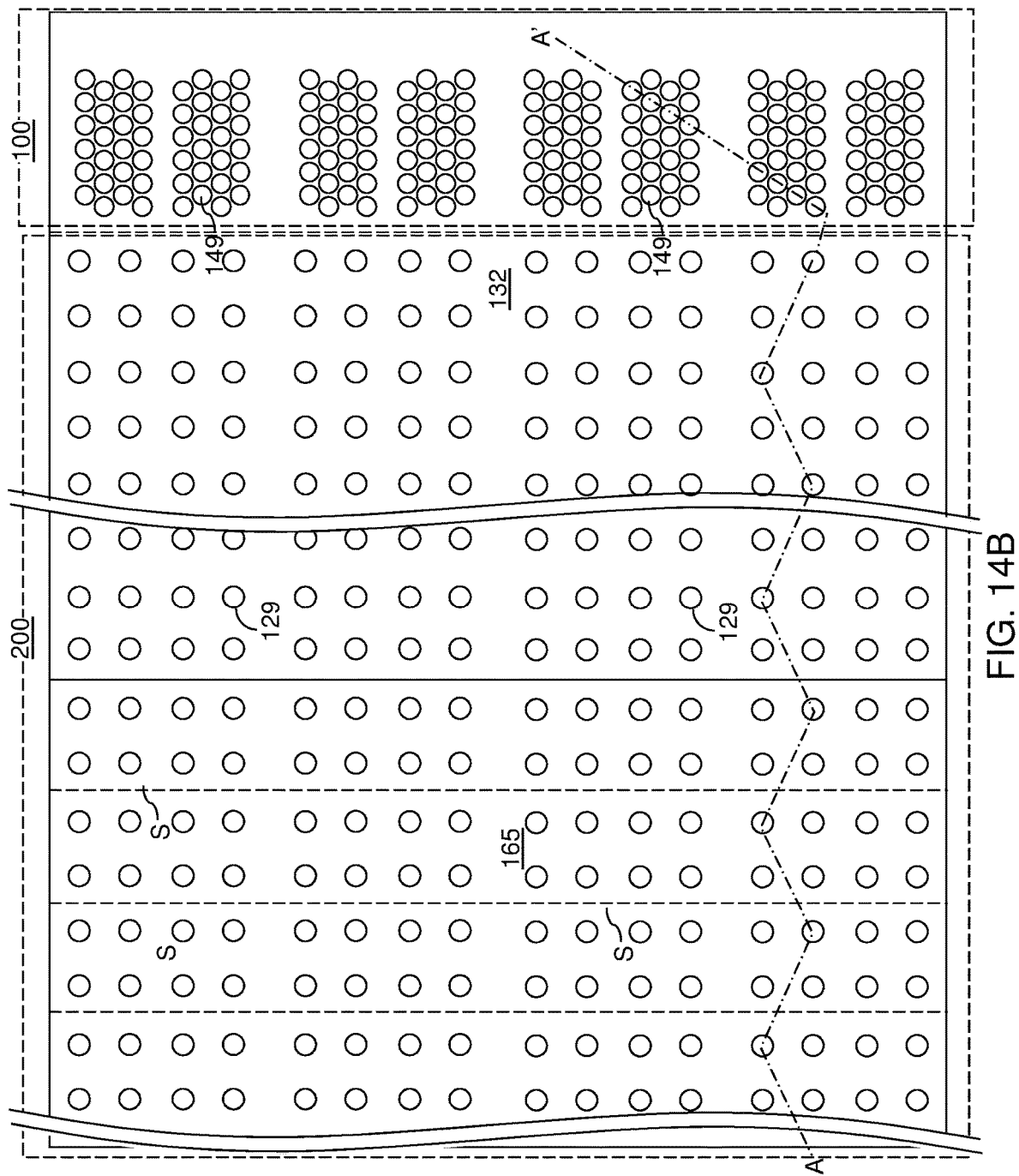
FIG. 14B is a horizontal cross-sectional view of the exemplary structure of FIG. 14A. The hinged vertical plane A-A' corresponds to the plane of the vertical cross-sectional view of FIG. 14A.

Referring to FIGS. 14A and 14B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 14B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 15:
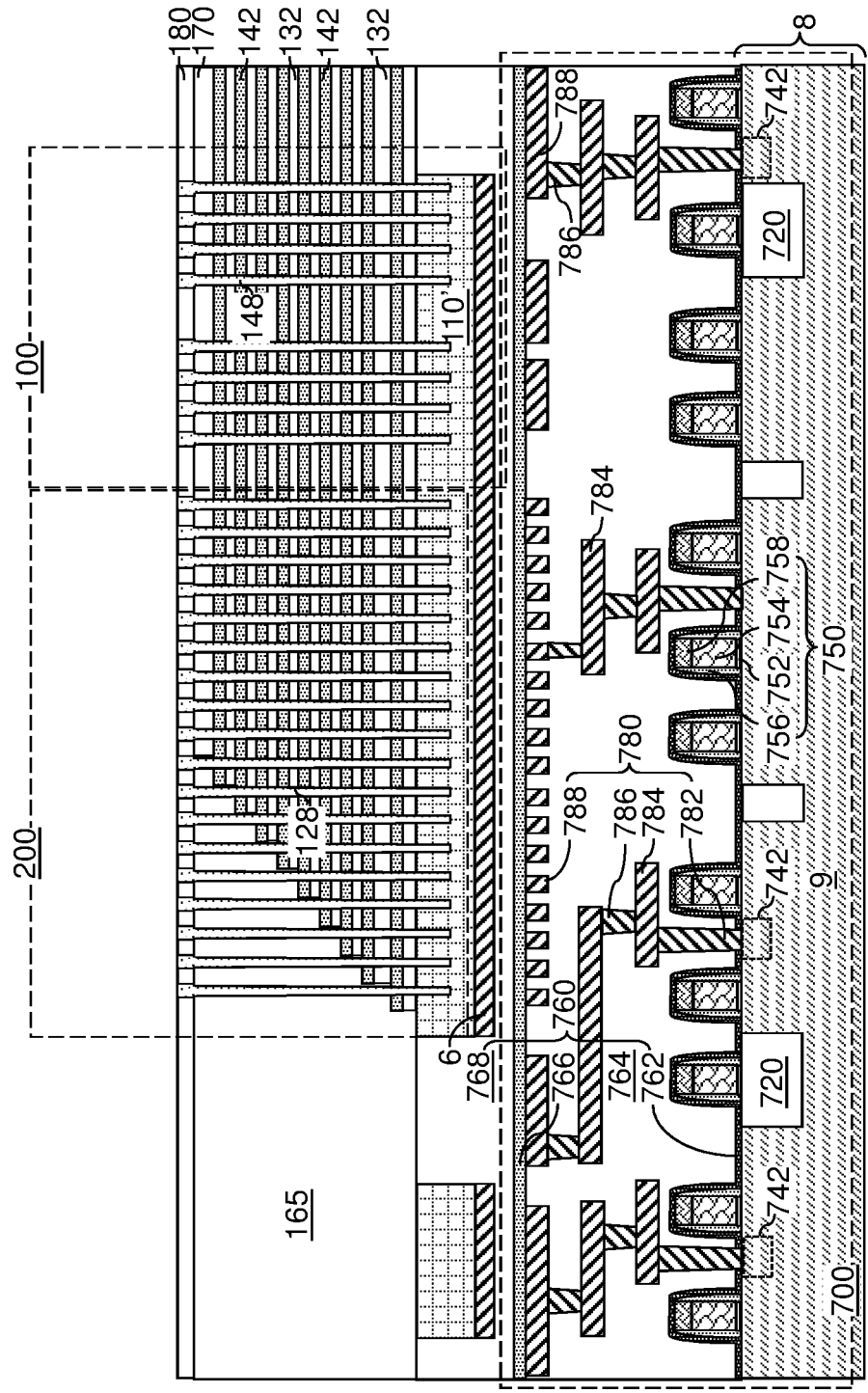
FIG. 15 is a vertical cross-sectional view of the exemplary structure after formation of various sacrificial fill structures according to an embodiment of the present disclosure.

Referring to FIG. 15, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 16:
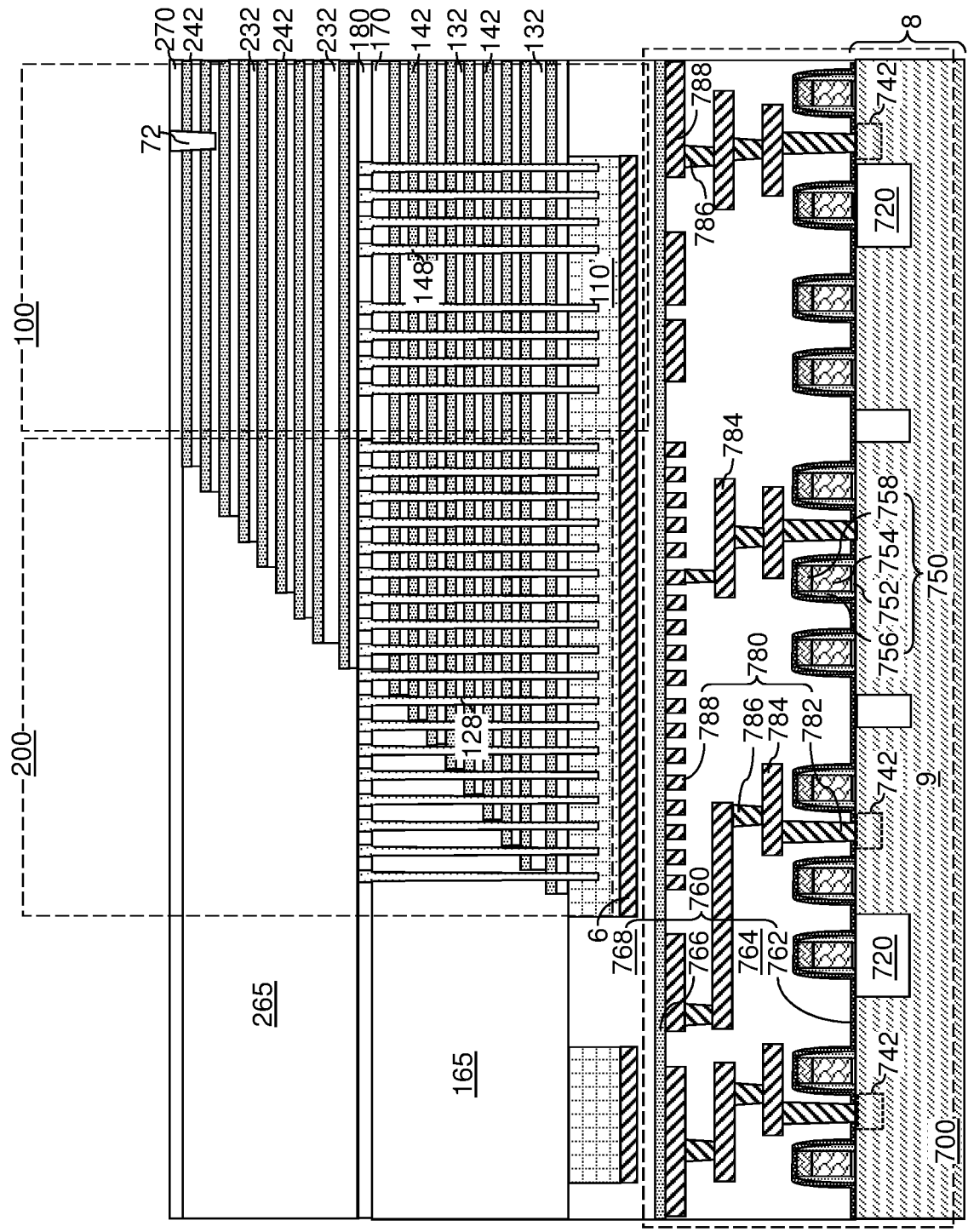
FIG. 16 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 16, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 17A:
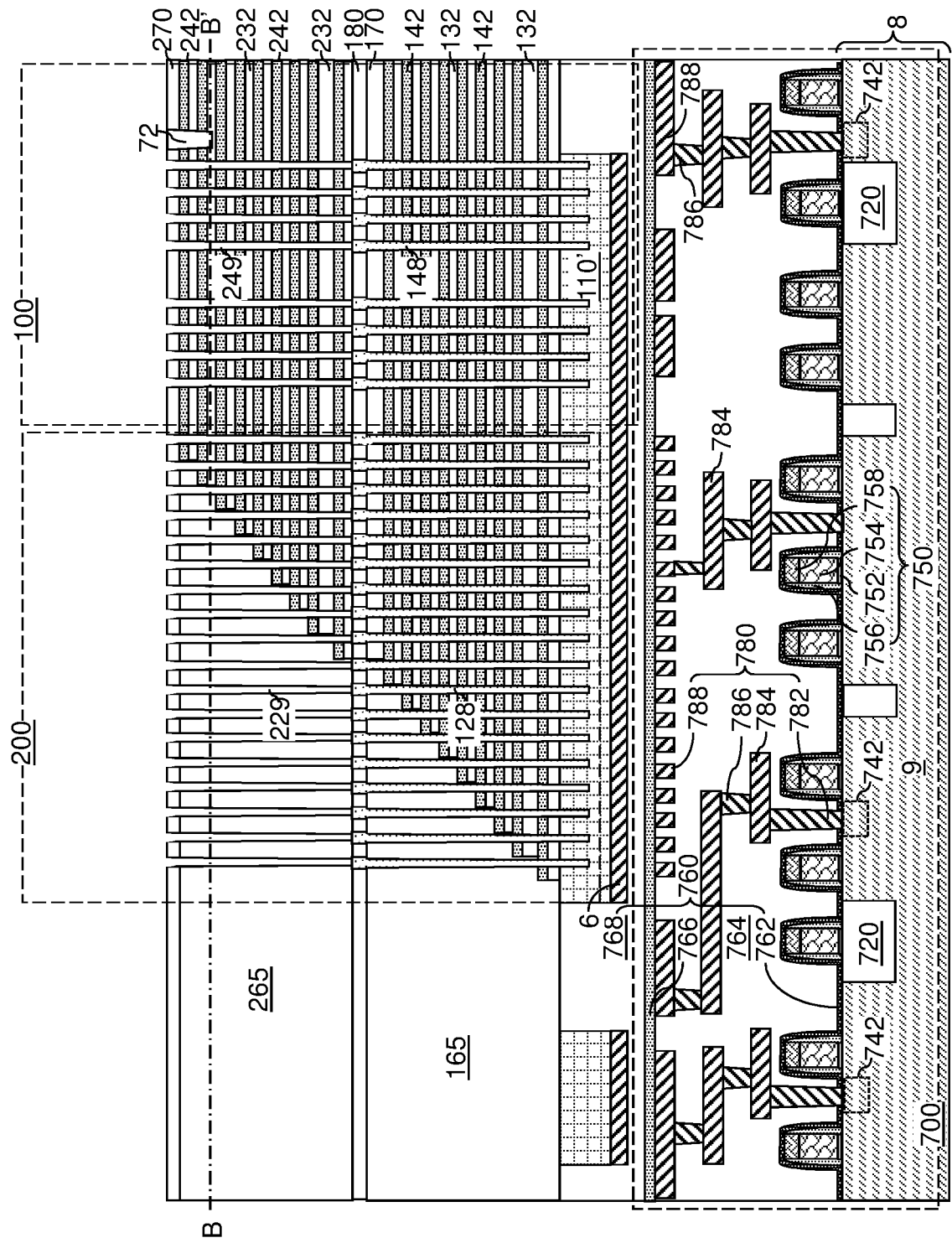
FIG. 17A is a vertical cross-sectional view of the exemplary structure after formation of second-tier memory openings and second-tier support openings according to an embodiment of the present disclosure.
Figure 17B:
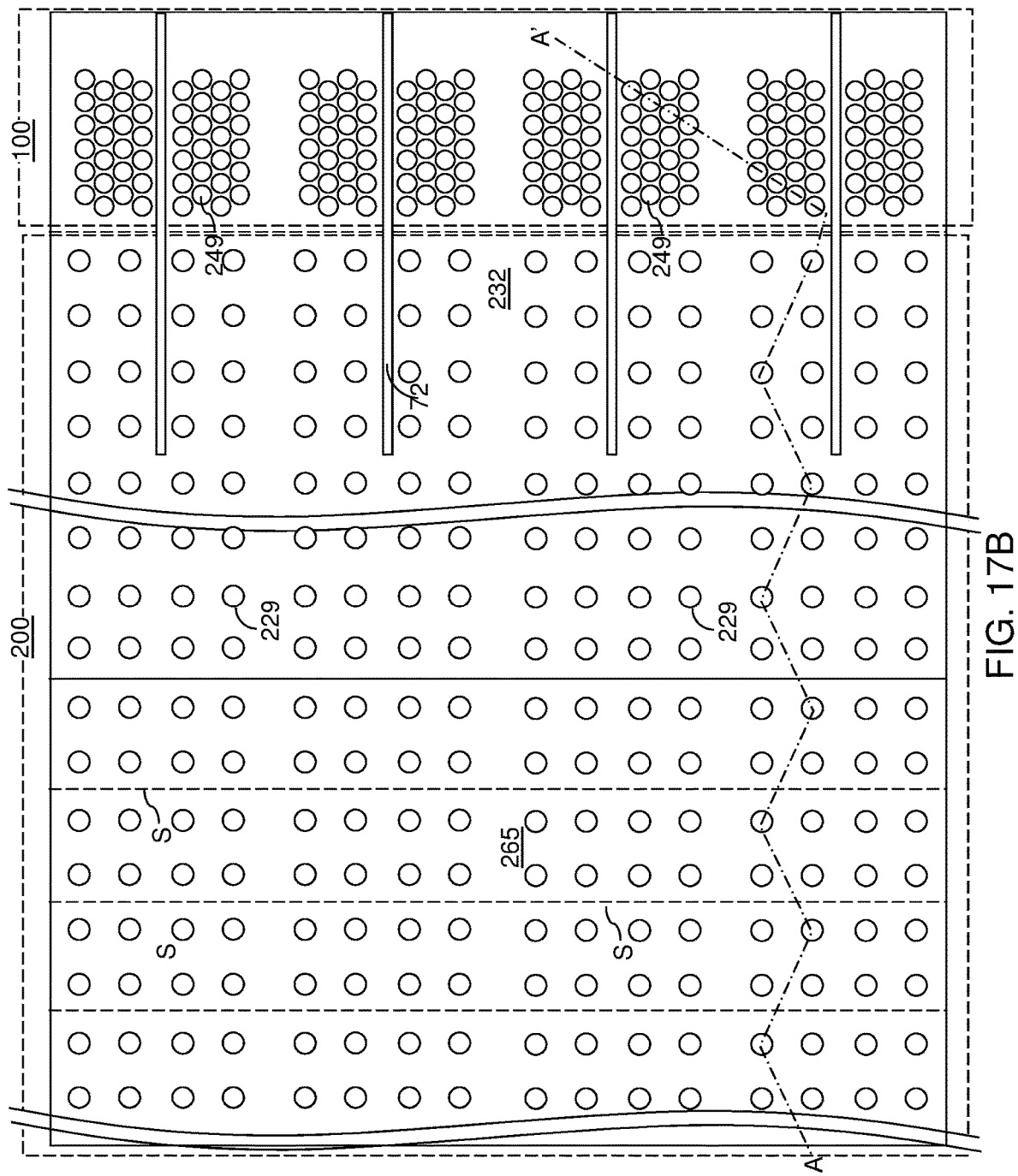
FIG. 17B is a horizontal cross-sectional view of the exemplary structure along the horizontal plane B-B' of FIG. 17A. The hinged vertical plane A-A' corresponds to the plane of the vertical cross-sectional view of FIG. 17A.

Referring to FIGS. 17A and 17B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 17B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 18:
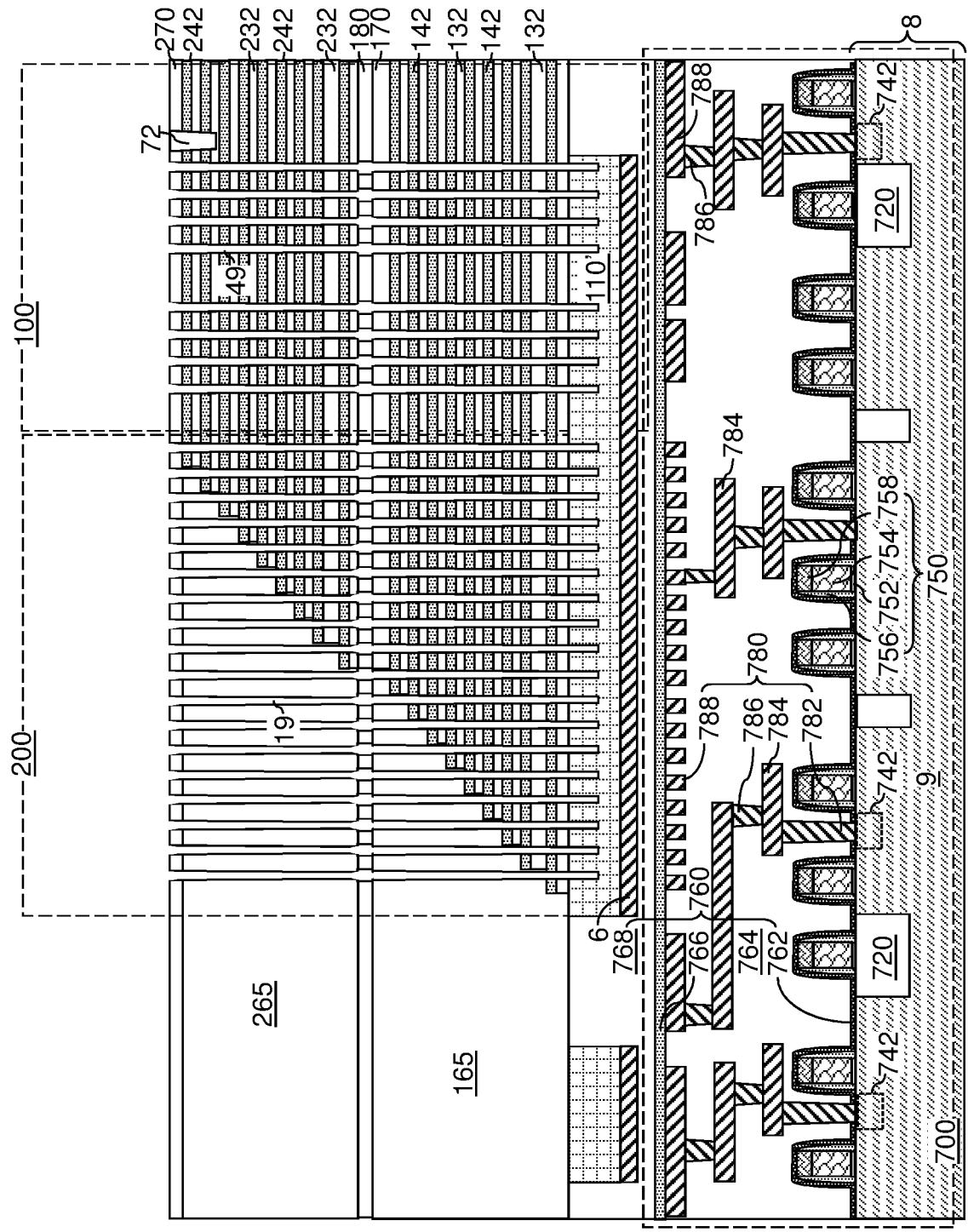
FIG. 18 is a vertical cross-sectional view of the exemplary structure after formation of inter-tier memory openings and inter-tier support openings according to an embodiment of the present disclosure.

Referring to FIG. 18, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 19A-19D provide sequential cross-sectional views of a memory opening 49 during formation of a memory opening fill structure. The same structural change occurs in each of the memory openings 49 and the support openings 19.

Figures 19A, 19B:
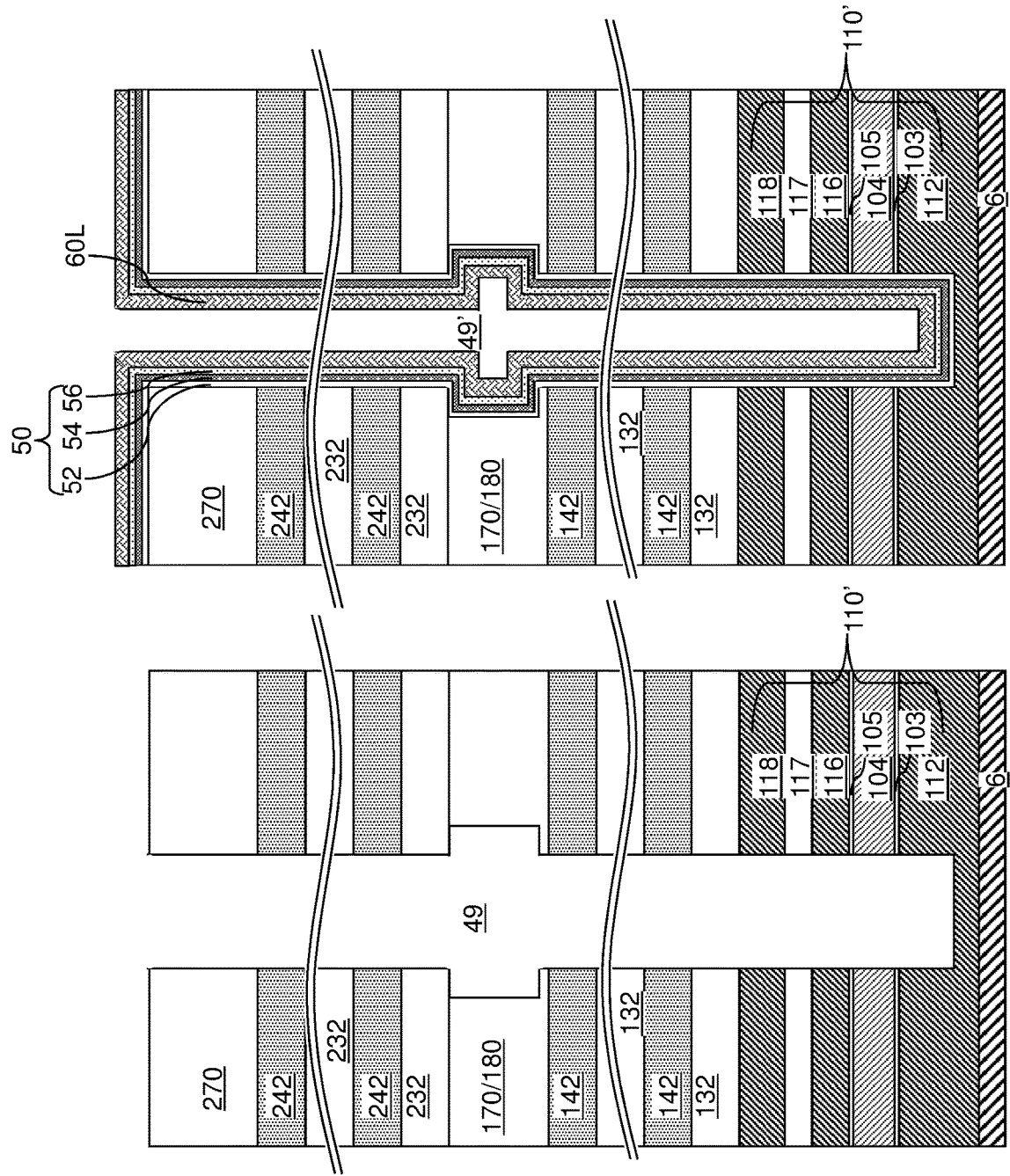

Referring to FIG. 19A, a memory opening 49 in the first exemplary device structure of FIG. 18 is illustrated. The memory opening 49 extends through the first-tier structure and the second-tier structure.

Referring to FIG. 19B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 19C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch.

The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 19D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped poly silicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 20:
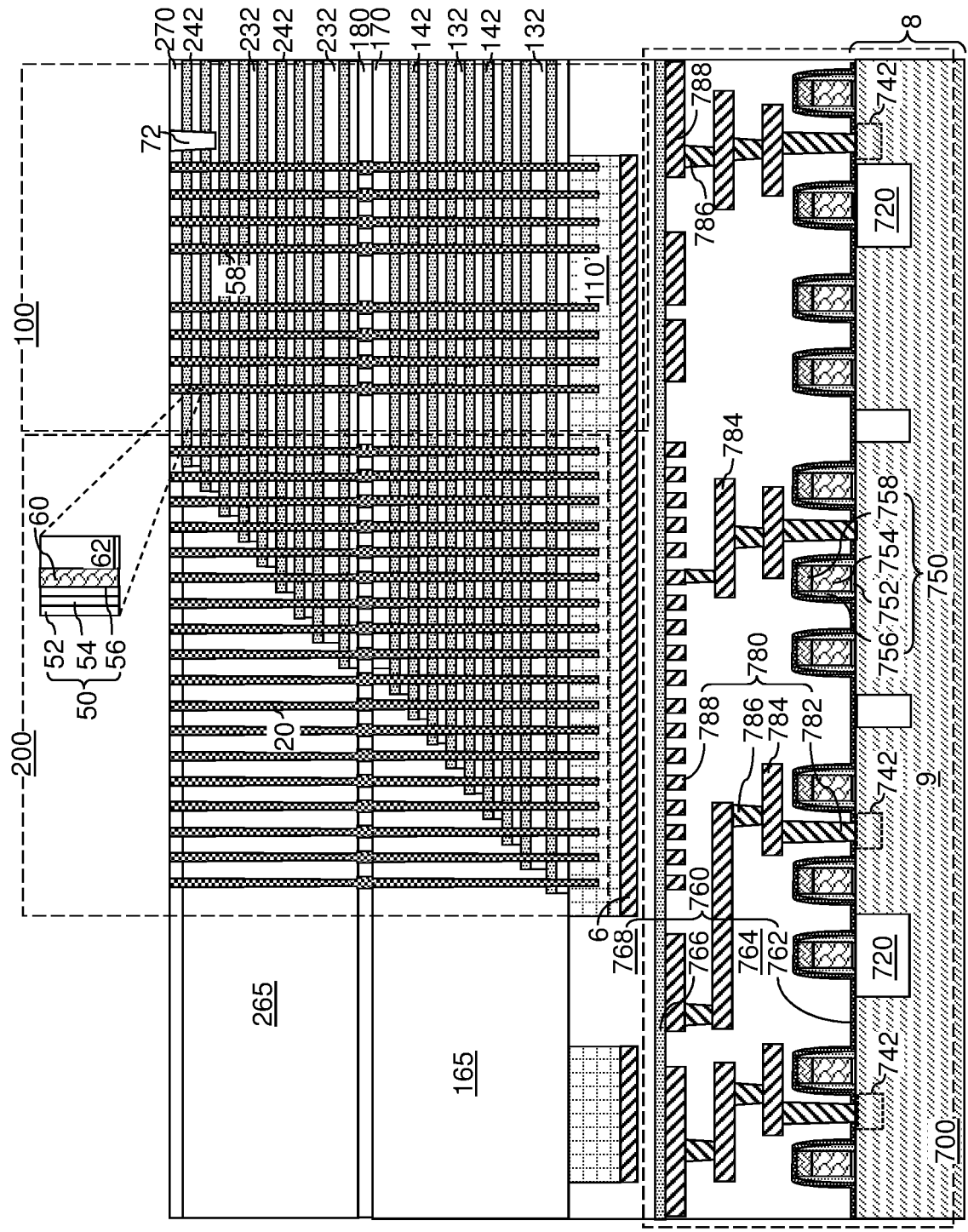
FIG. 20 is a vertical cross-sectional view of the exemplary structure after formation of memory opening fill structures and support pillar structures according to an embodiment of the present disclosure.

Referring to FIG. 20, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 21A:
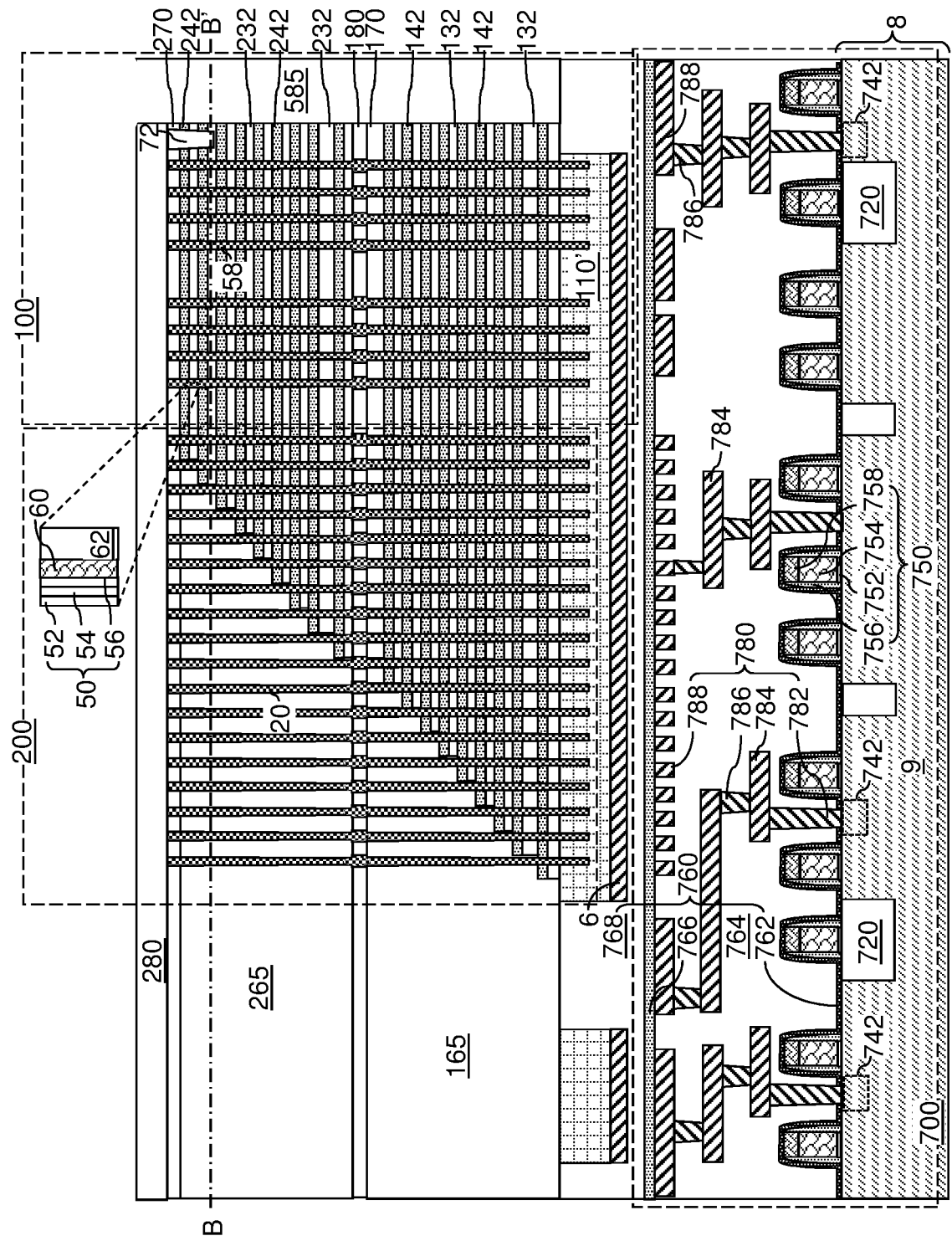
FIG. 21A is a vertical cross-sectional view of the exemplary structure after formation of pillar cavities according to an embodiment of the present disclosure.
Figure 21B:
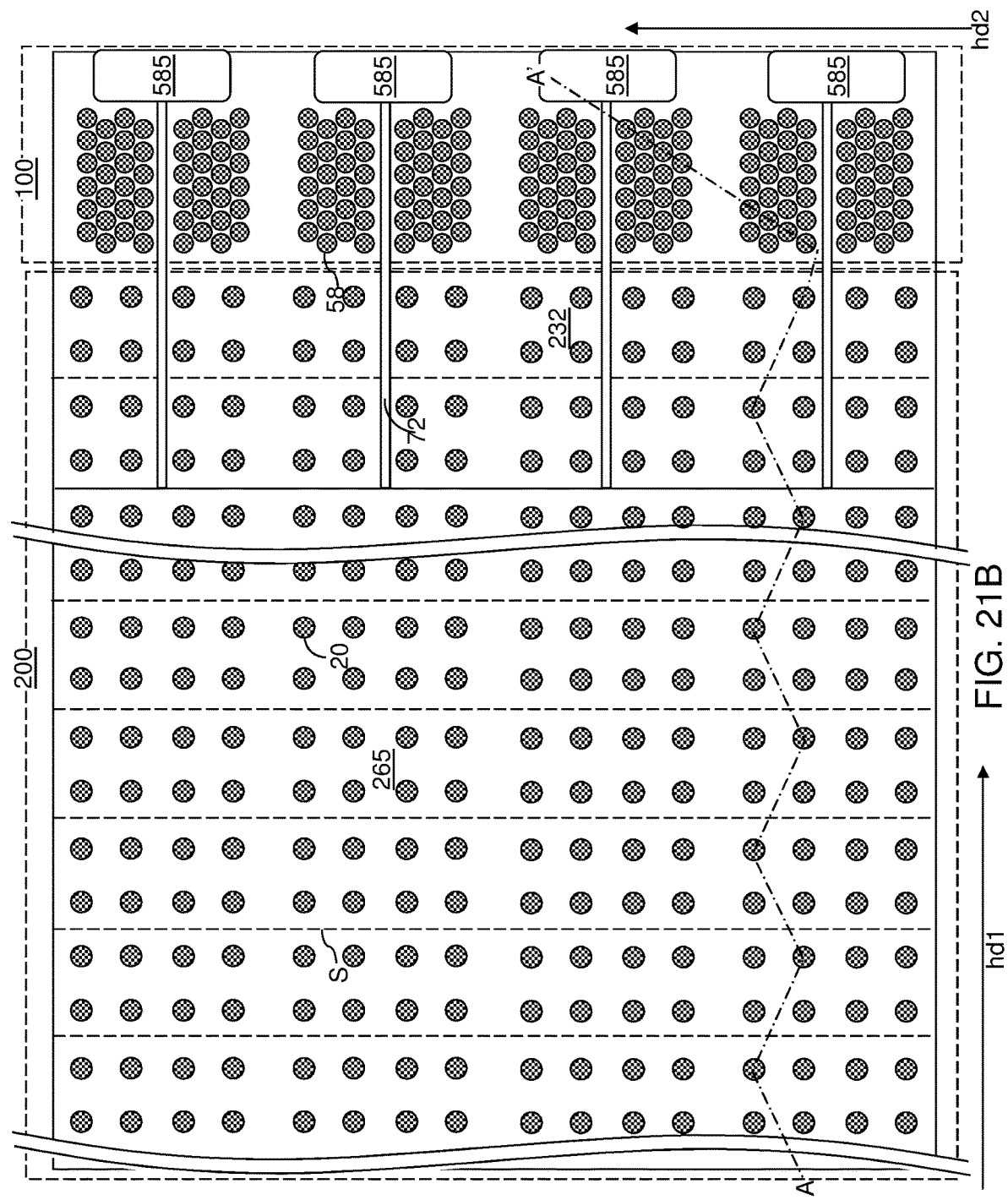
FIG. 21B is a horizontal cross-sectional view of the exemplary structure along the horizontal plane B-B' of FIG. 21A. The hinged vertical plane A-A' corresponds to the plane of the vertical cross-sectional view of FIG. 21A.

Referring to FIGS. 21A and 21B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 22:
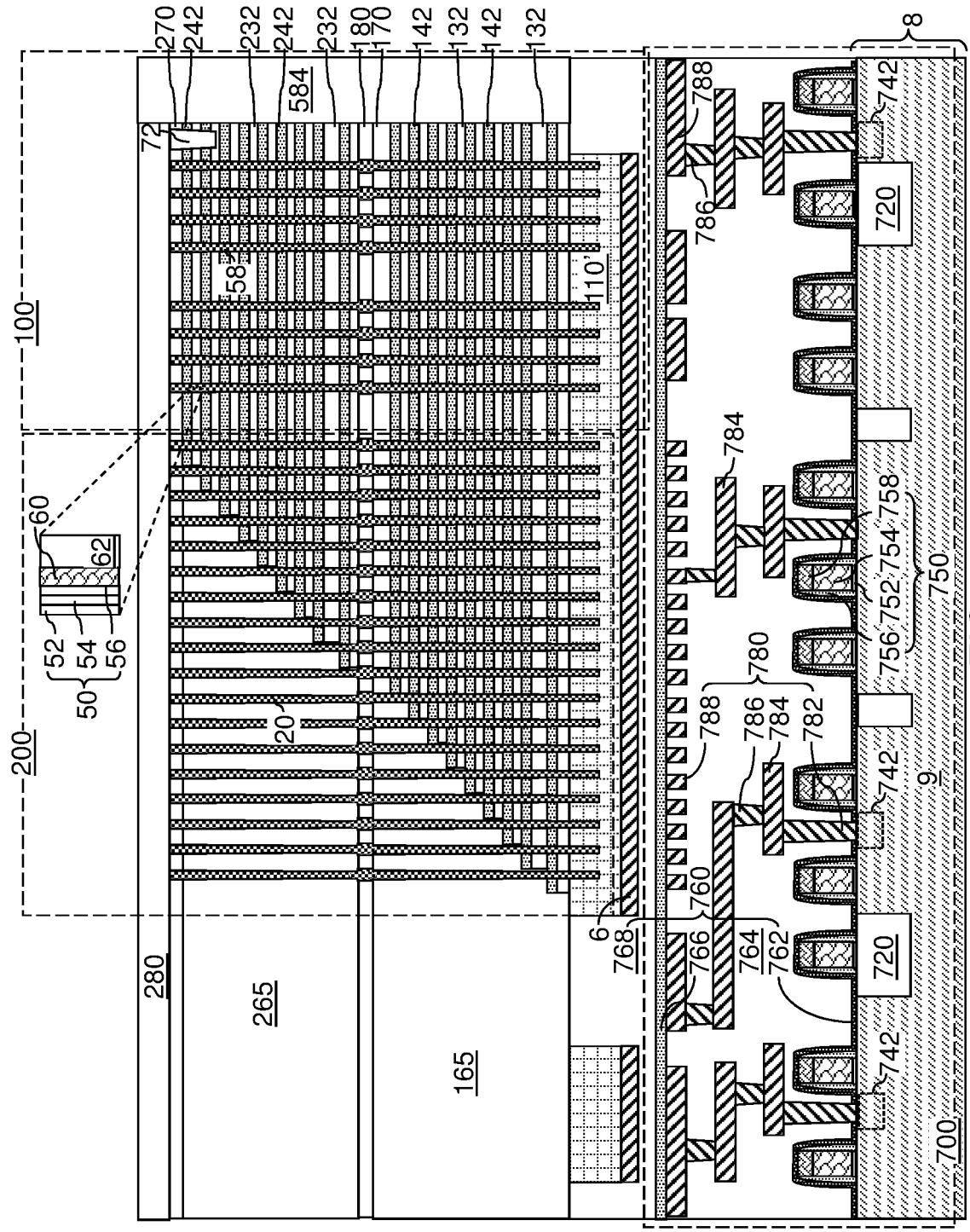
FIG. 22 is a vertical cross-sectional view of the exemplary structure after formation of dielectric pillar structures according to an embodiment of the present disclosure.

Referring to FIG. 22, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 23A:
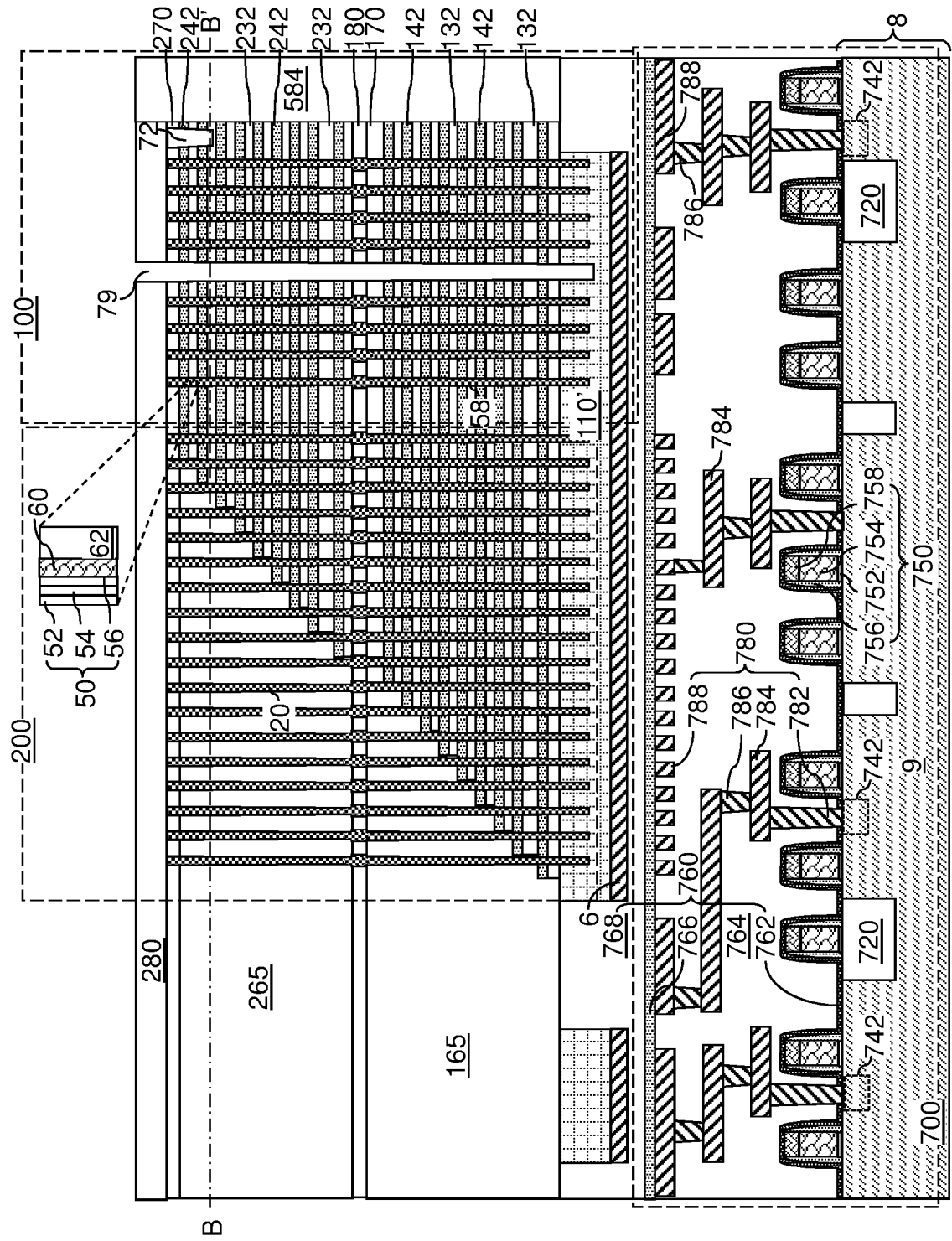
FIG. 23A is a vertical cross-sectional view of the exemplary structure after formation of a first contact level dielectric layer and backside trenches according to an embodiment of the present disclosure.
Figure 23B:
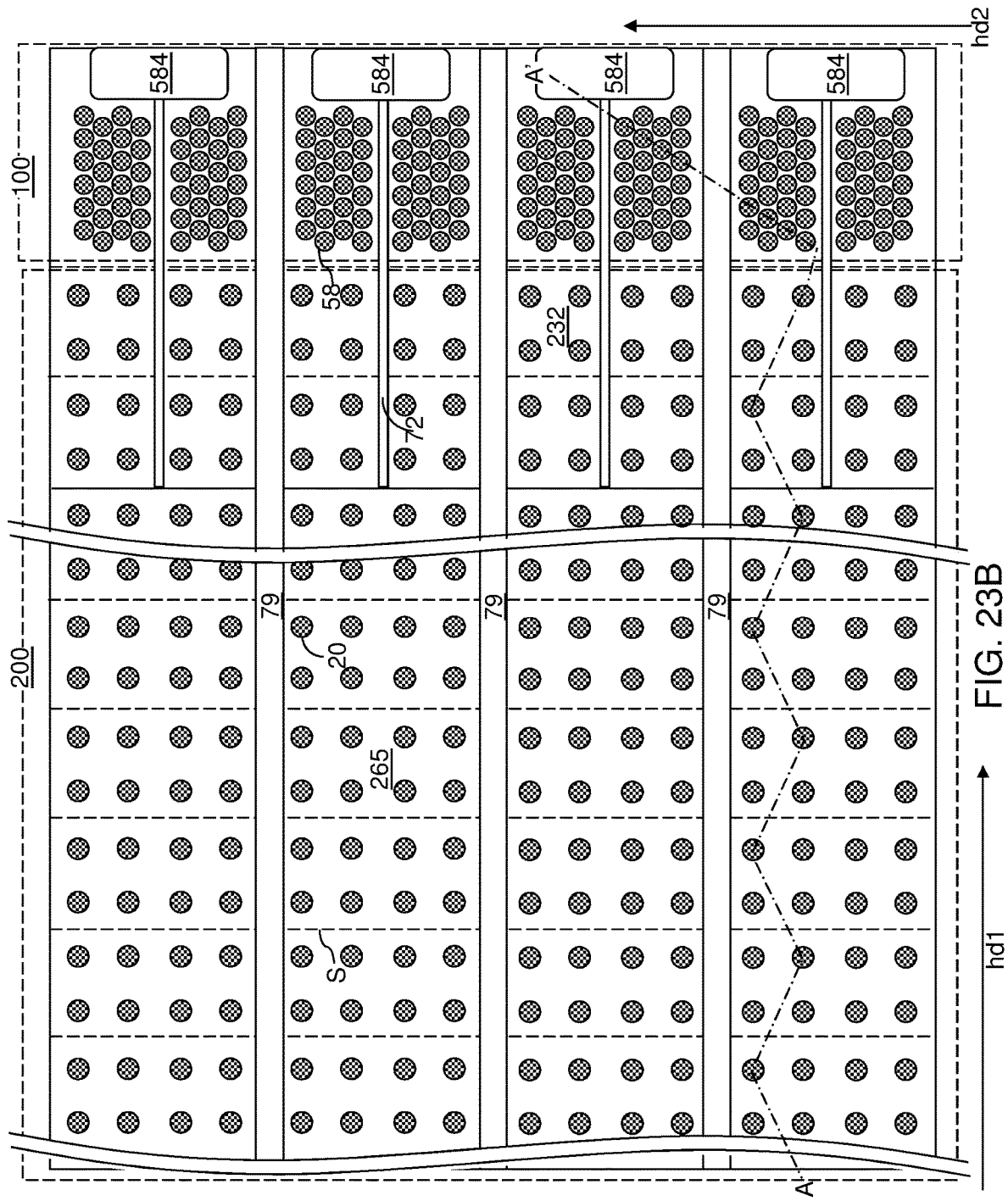
FIG. 23B is a horizontal cross-sectional view of the exemplary structure along the horizontal plane B-B' of FIG. 23A. The hinged vertical plane A-A' corresponds to the plane of the vertical cross-sectional view of FIG. 23A.

Referring to FIGS. 23A and 23B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 110'. Portions of the first contact level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 24:
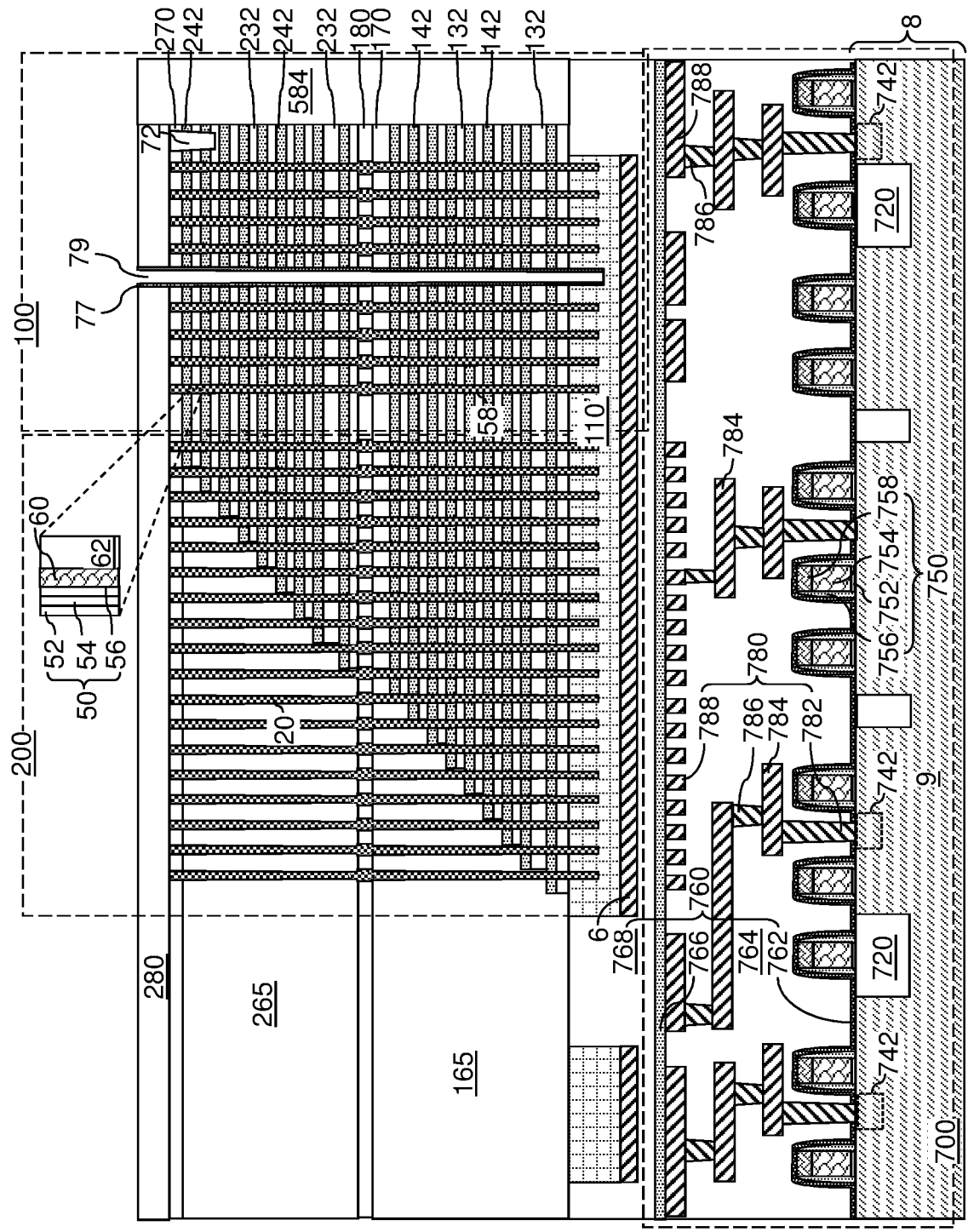
FIG. 24 is a vertical cross-sectional view of the exemplary structure after formation of backside trench spacers according to an embodiment of the present disclosure.
Figure 25A:
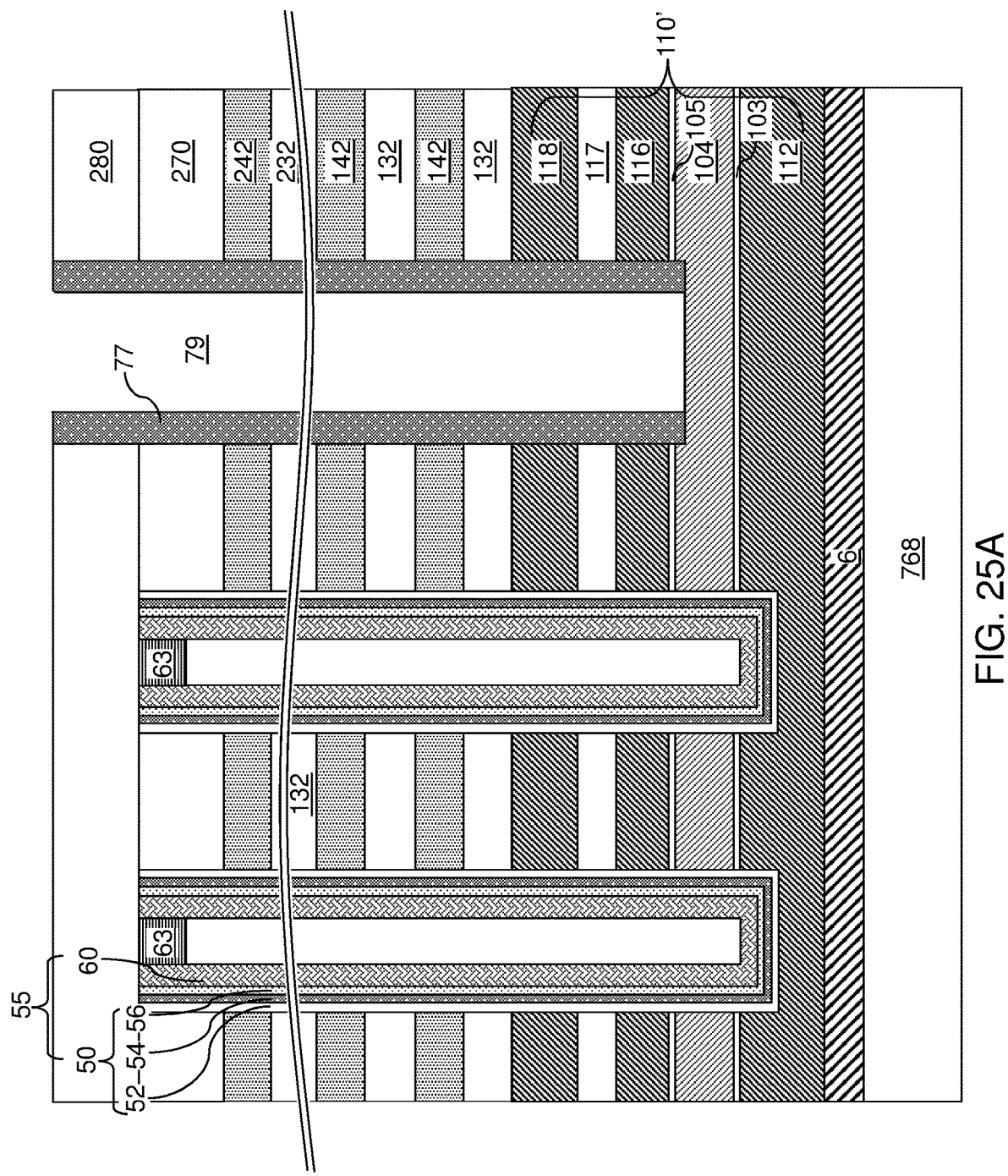
FIGS. 25A-25E illustrate sequential vertical cross-sectional views of memory opening fill structures and a backside trench during formation of source-level material layers according to an embodiment of the present disclosure.

Referring to FIGS. 24 and 25A, a backside trench spacer 77 may be formed on sidewalls of each backside trench 79. For example, a conformal spacer material layer may be deposited in the backside trenches 79 and over the first contact level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 25B:
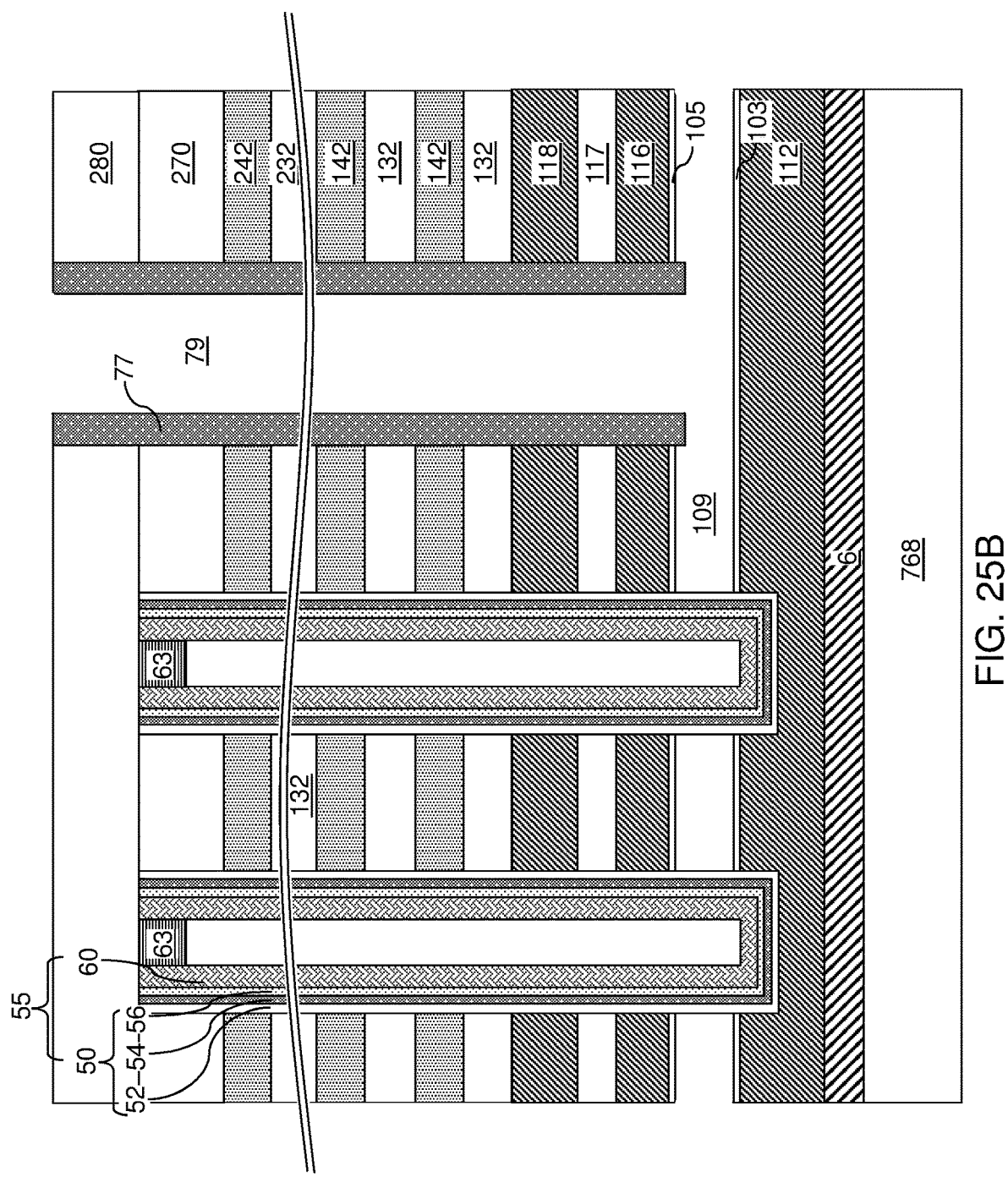

Referring to FIG. 25B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 25C:
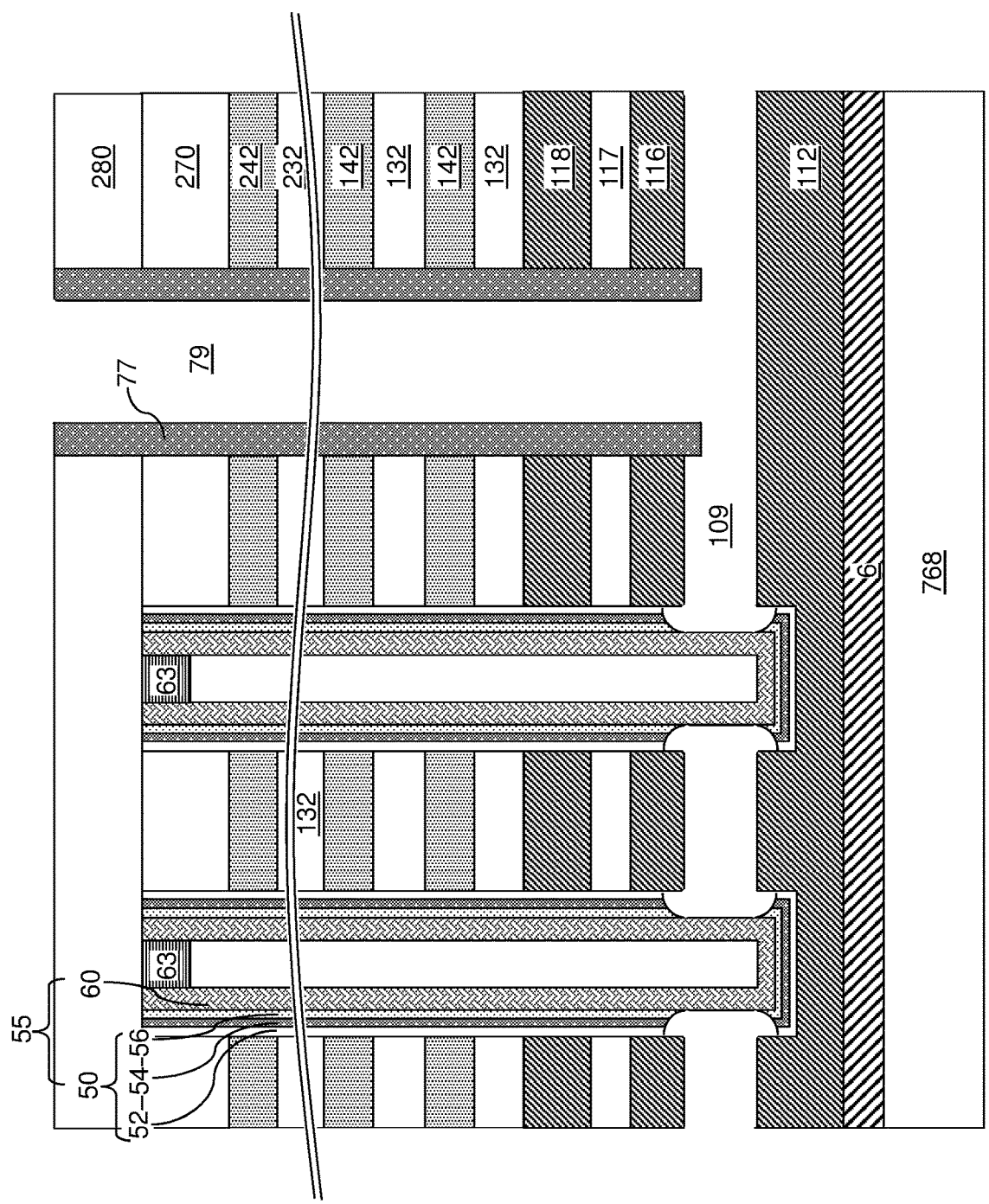

Referring to FIG. 25C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 25D:
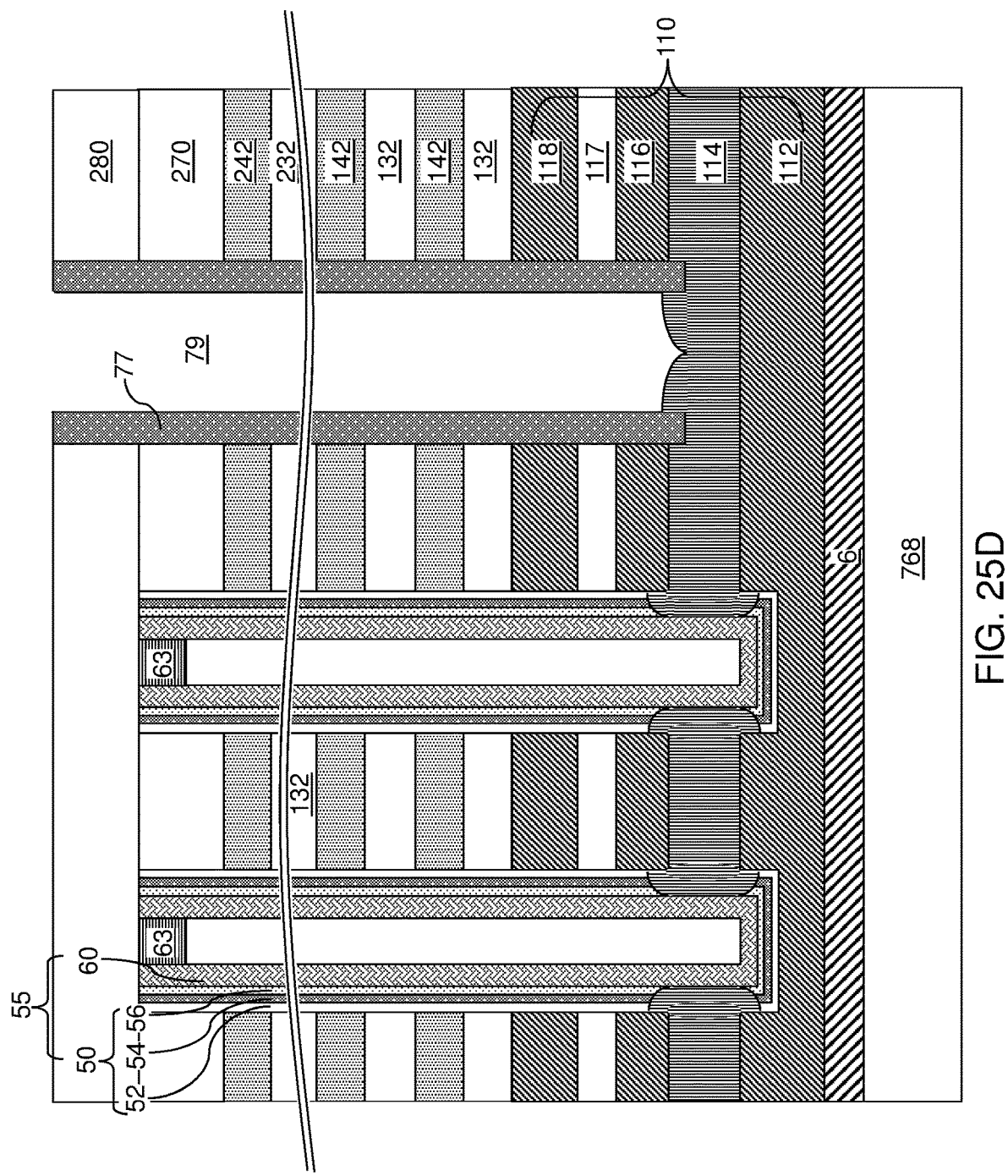

Referring to FIG. 25D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 25E:
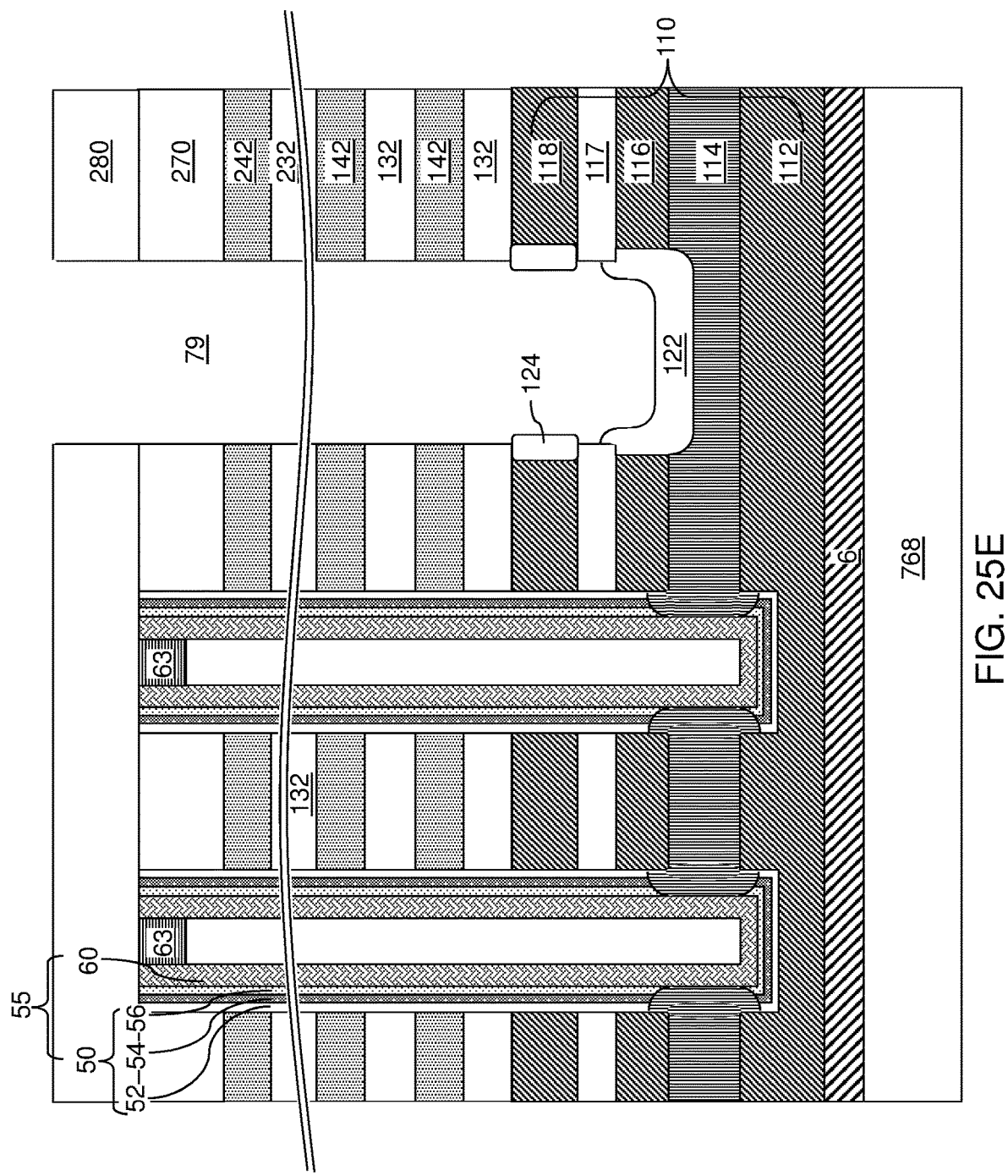
Figure 26:
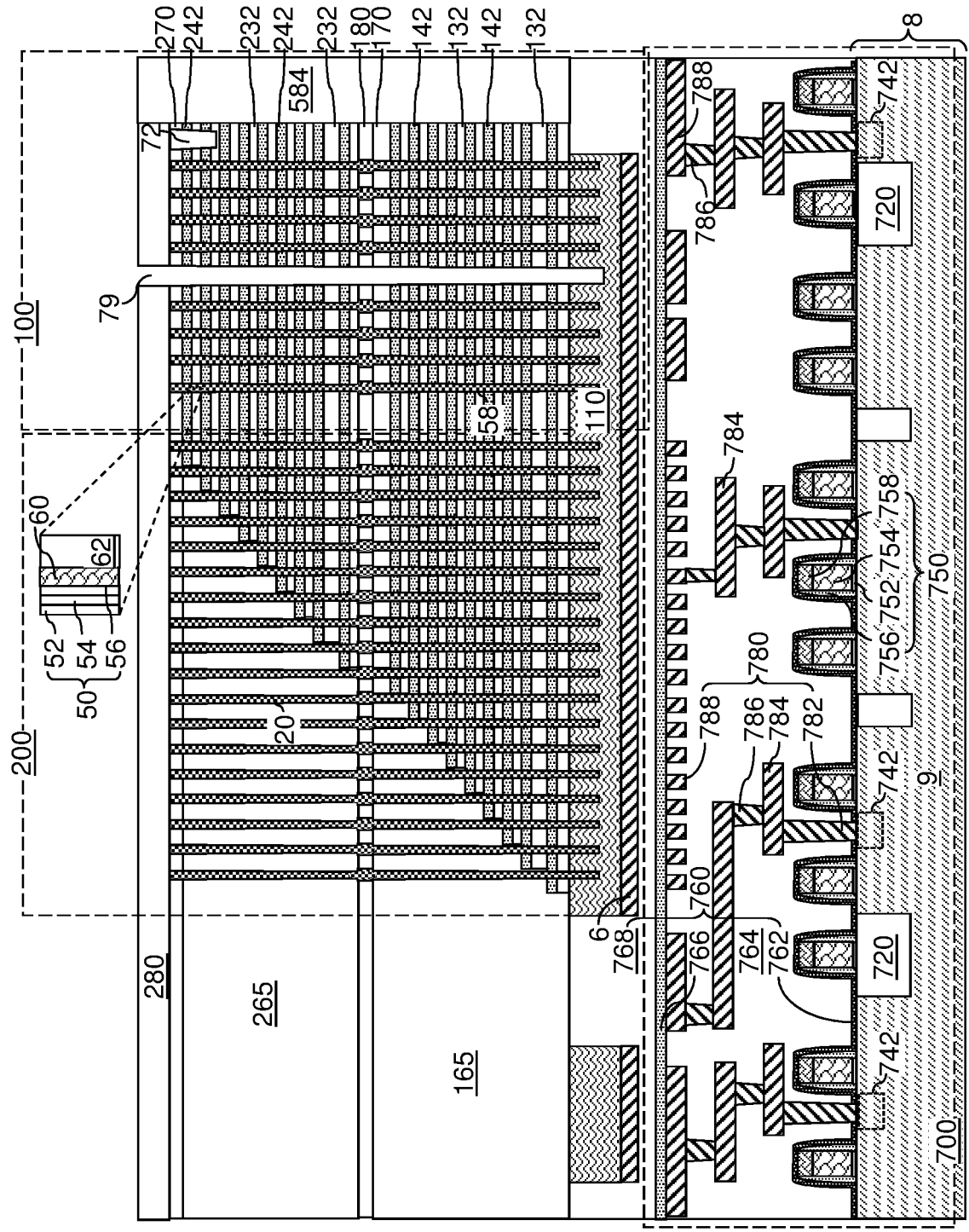
FIG. 26 is a vertical cross-sectional view of the exemplary structure after formation of source-level material layers according to an embodiment of the present disclosure.

Referring to FIGS. 25E and 26, the backside trench spacers 77 may be removed selective to the insulating layers (132, 232), the first and second insulating cap layers (170, 270), the first contact level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 27:
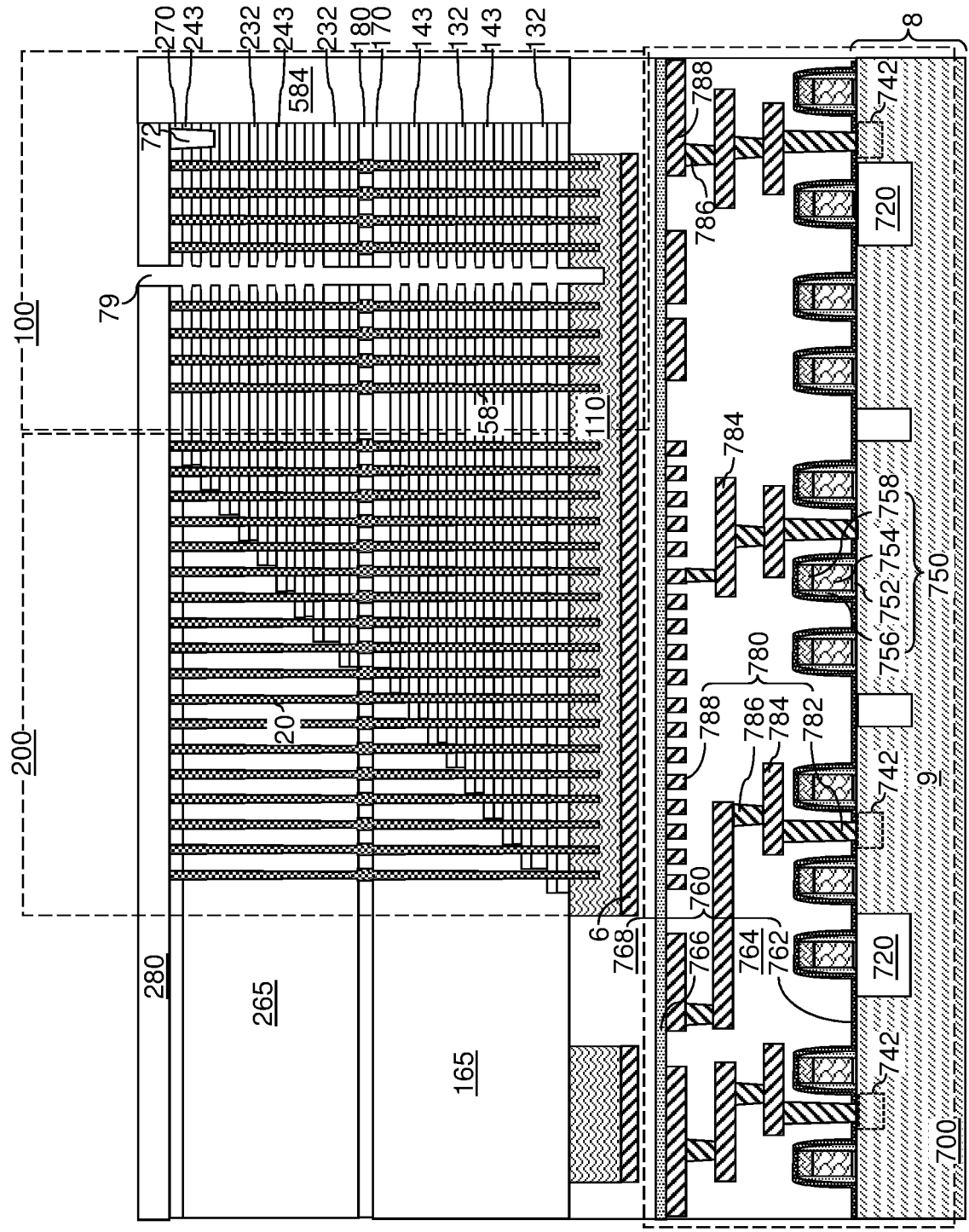
FIG. 27 is a vertical cross-sectional view of the exemplary structure after formation of backside recesses according to an embodiment of the present disclosure.

Referring to FIG. 27, the sacrificial material layers (142, 242) are may be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 28A:
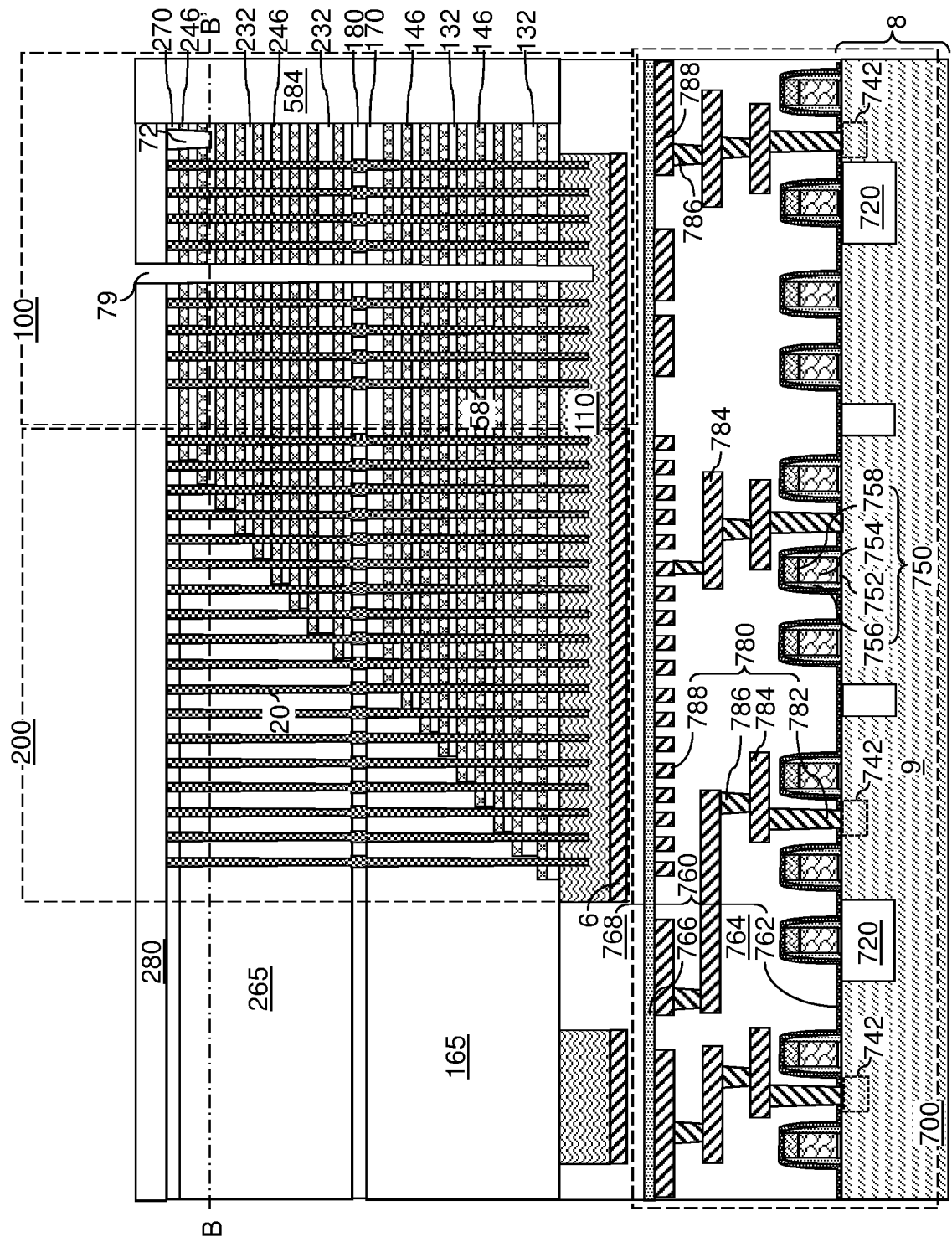
FIG. 28A is a vertical cross-sectional view of the exemplary structure after formation of electrically conductive layers according to an embodiment of the present disclosure.
Figure 28B:
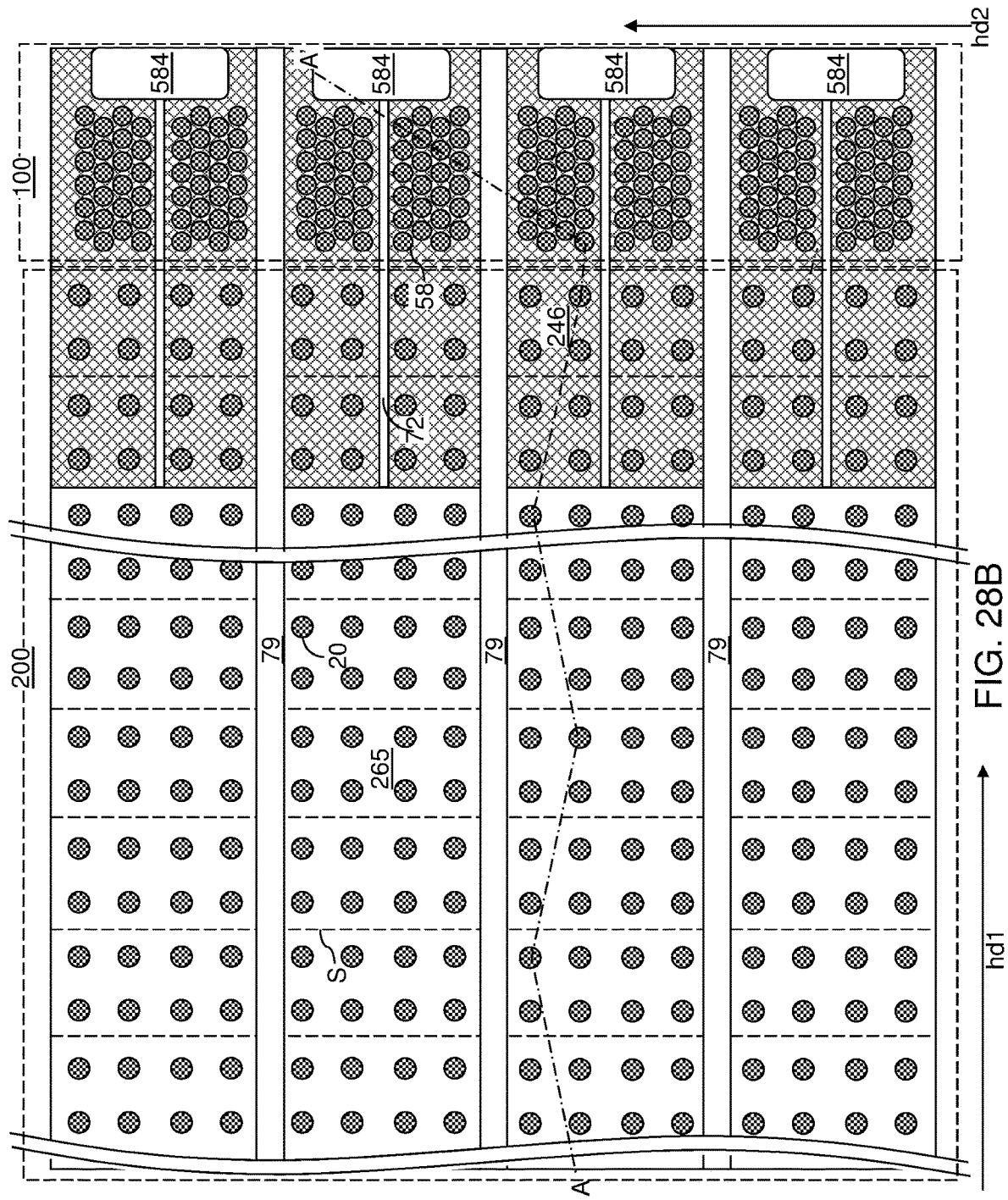
FIG. 28B is a horizontal cross-sectional view of the exemplary structure along the horizontal plane B-B' of FIG. 28A. The hinged vertical plane A-A' corresponds to the plane of the vertical cross-sectional view of FIG. 28A.

Referring to FIGS. 28A and 28B, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 29A:
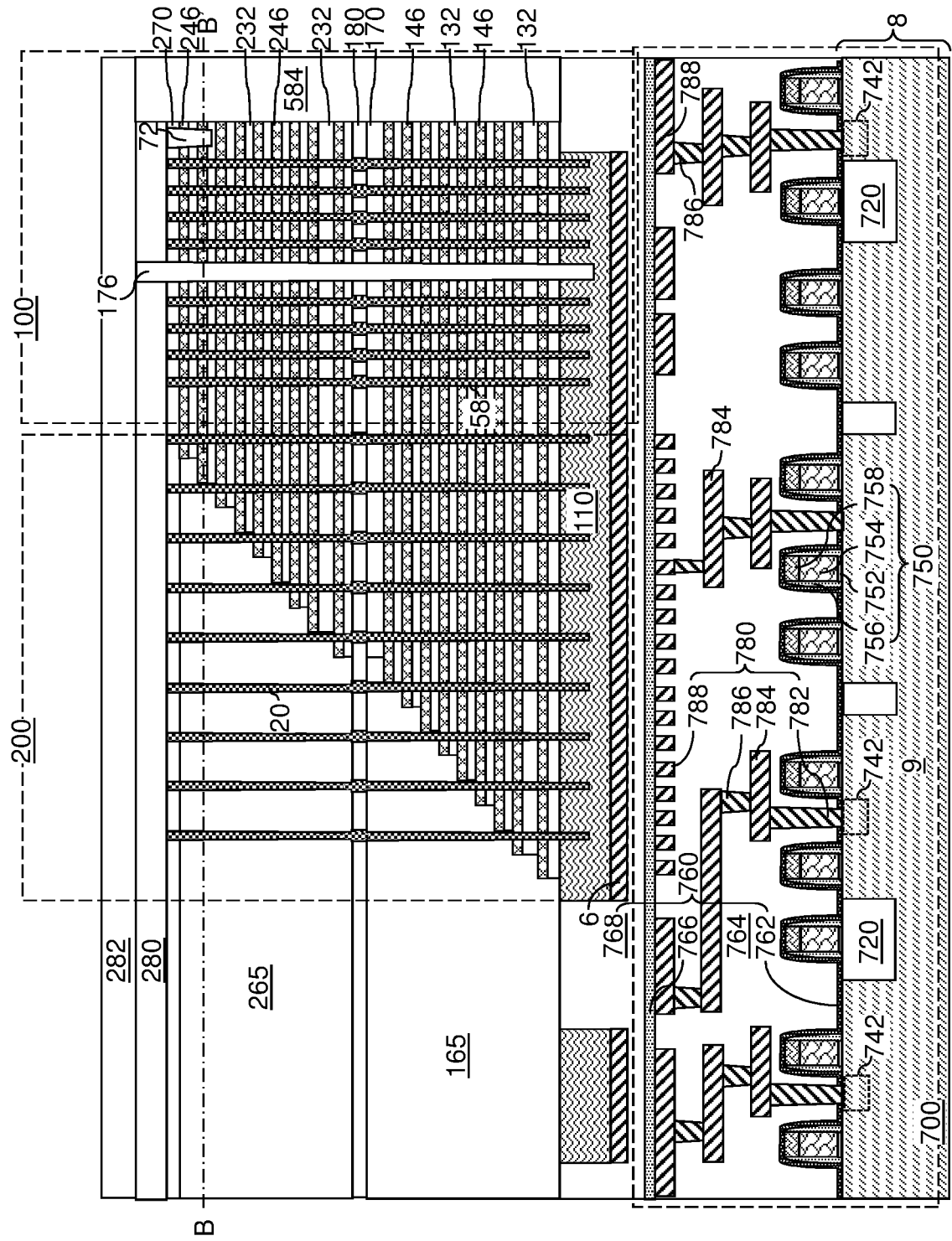
FIG. 29A is a vertical cross-sectional view of the exemplary structure after formation of backside trench fill structures in the backside trenches according to an embodiment of the present disclosure.
Figure 29B:
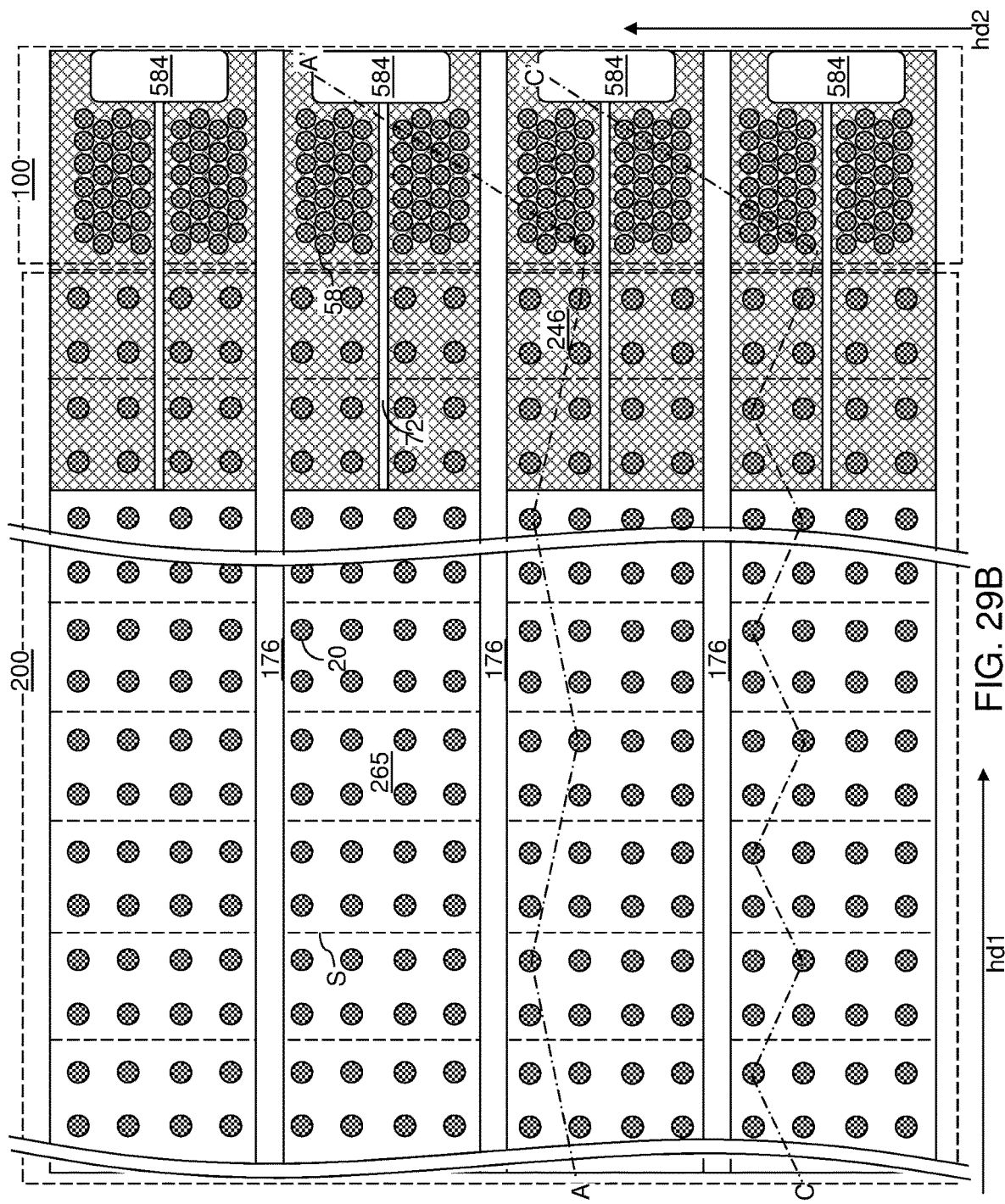
FIG. 29B is a horizontal cross-sectional view of the exemplary structure along the horizontal plane B-B' of FIG. 29A. The hinged vertical plane A-A' corresponds to the plane of the vertical cross-sectional view of FIG. 29A.
Figure 29C:
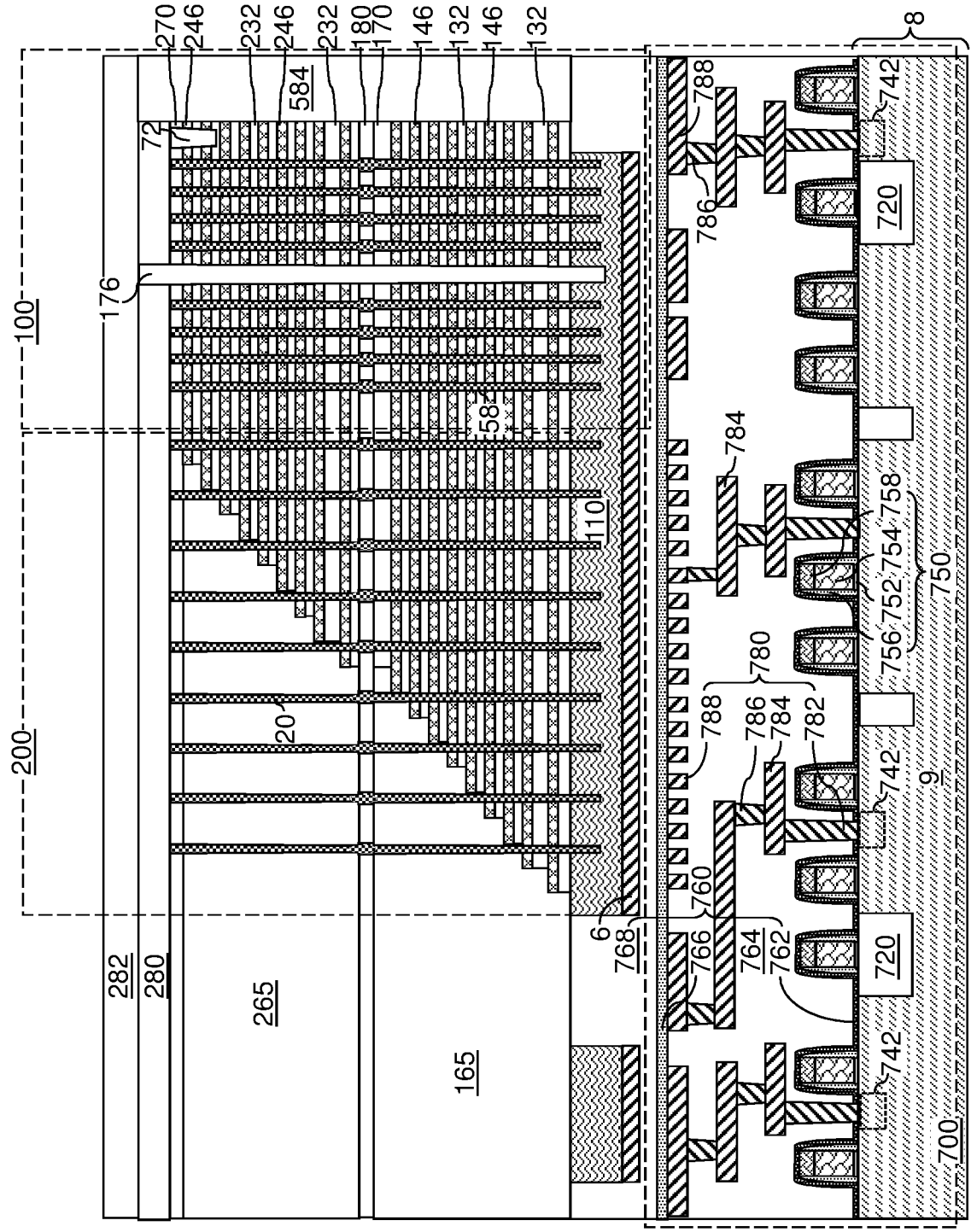
FIG. 29C is a vertical cross-sectional view of the exemplary structure along the vertical plane C-C' of FIG. 29B.

Referring to FIGS. 29A-29C, a dielectric material may be conformally deposited in the backside trenches 79 and over the first contact level dielectric layer 280 by a conformal deposition process. The dielectric material may include, for example, silicon oxide. Each portion of the deposited dielectric material filling a backside trench 79 constitutes a backside trench fill structure 176. Each portion of the deposited dielectric material overlying the first contact level dielectric layer 280 constitutes a second contact level dielectric layer 282. The second contact level dielectric layer 282 includes a dielectric material such as silicon oxide, and may have a thickness in a range from 100 nm to 600 nm, although lesser and greater thicknesses may also be used.

Figure 30A:
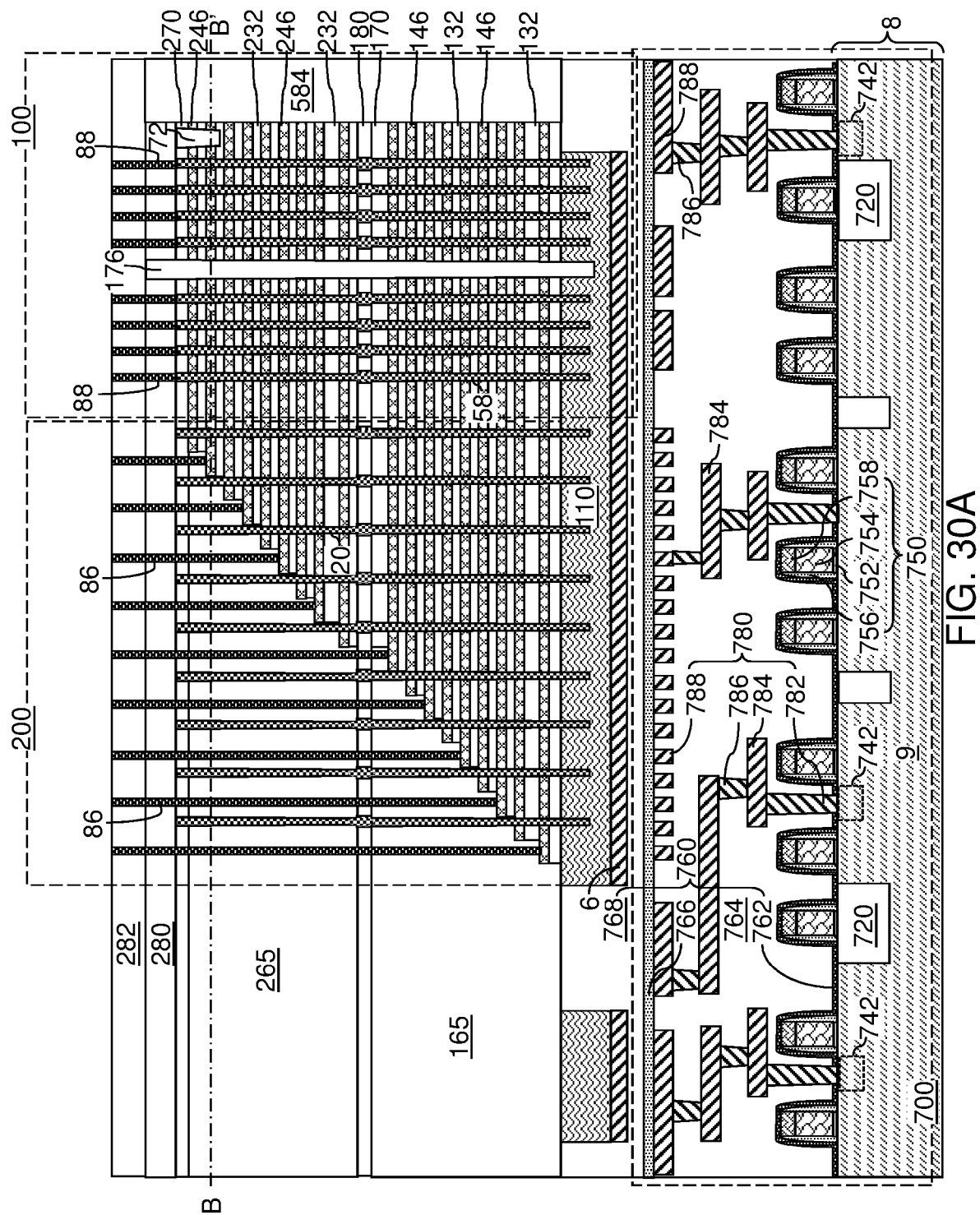
FIG. 30A is a vertical cross-sectional view of the exemplary structure after formation of a second contact level dielectric layer and various contact via structures according to an embodiment of the present disclosure.
Figure 30B:
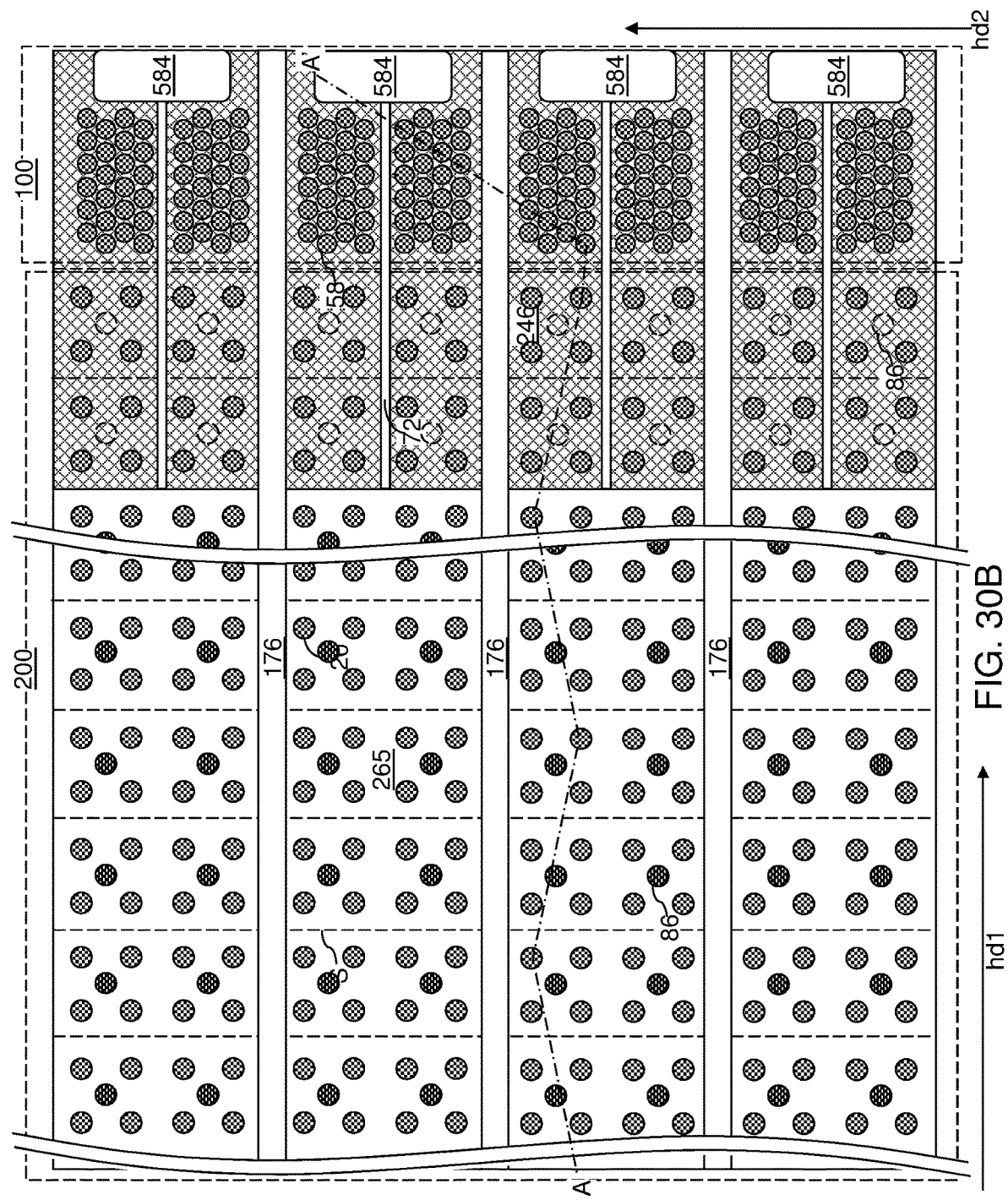
FIG. 30B is a horizontal cross-sectional view of the exemplary structure along the vertical plane B-B' of FIG. 30A. The hinged vertical plane A-A' corresponds to the plane of the vertical cross-sectional view of FIG. 30A.

Referring to FIGS. 30A and 30B, a photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 31:
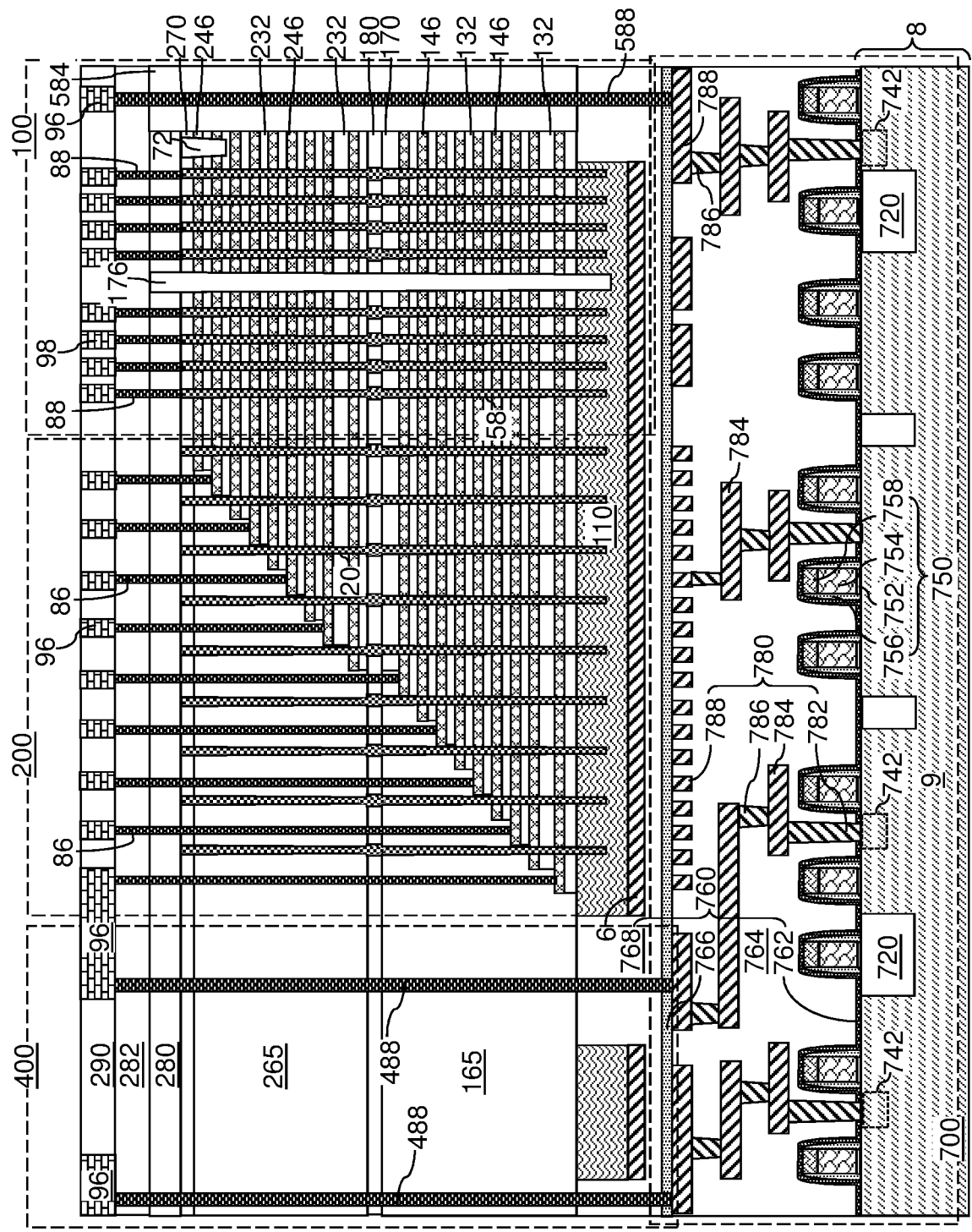
FIG. 31 is a vertical cross-sectional view of the exemplary structure after formation of through-memory-level via structures and upper metal line structures according to an embodiment of the present disclosure.

Referring to FIG. 31, peripheral-region via cavities may be formed through the second and first contact level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Generally, a three-dimensional memory array can be formed over the array of bit line connection switches on a semiconductor substrate. The three-dimensional memory array can comprise an alternating stack of insulating layers 32 and electrically conductive layers 46. Memory stack structures 55 vertically extend through the alternating stack (32, 46). Each of the memory stack structures 55 includes a respective vertical semiconductor channel 60 and a respective vertical stack of memory elements that surround the respective vertical semiconductor channel 60. The three-dimensional memory array can include vertical stacks of memory elements contacting a respective vertical semiconductor channel 60 and bit lines 98 electrically connected to a top end of a respective subset of the vertical semiconductor channels 60.

In one embodiment, each of the bit lines 98 can be electrically connected to a top end of a respective subset of the vertical semiconductor channels 60 through the drain regions 63, and can laterally extend along a horizontal direction that is parallel to a top surface of the semiconductor substrate. In one embodiment, the alternating stack of insulating layers 32 and electrically conductive layers 46 overlies the array of bit line switches such that the alternating stack (32, 46) has an areal overlap with the array of bit line switches in a plan view along a direction that is perpendicular to a top surface of the semiconductor substrate, i.e., in a plan view along the vertical direction.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a three-dimensional NAND memory array located over a substrate and including bit lines; and
an array of bit line connection switches located over the substrate and electrically connected to the bit lines, wherein each of the bit line connection switches comprises a series connection of a first field effect transistor and a second field effect transistor that include a common active region;
wherein:
the first field effect transistor includes a first gate electrode, a first semiconductor channel extending between the common active region and a first active region;
the second field effect transistor includes a second gate electrode, a second semiconductor channel extending between the common active region and a second active region; and
the common active region is offset farther from the first gate electrode than from the second gate electrode.

2. The semiconductor structure of claim 1, wherein:
each of the common active region, the first active region, and the second active region has a respective extension doping portion and a respective deep active portion having a greater depth than the respective extension doping portion and having a higher atomic concentration of electrical dopants than the respective extension doping portion;
an interface between the extension doping portion of the first active region and the deep active portion of the first active region is vertically coincident with a first outer sidewall of a first dielectric spacer of the first gate electrode of the first field effect transistor; and
the deep active portion of the common active region is laterally spaced apart from the first gate electrode of the first field effect transistor by a first lateral offset distance that is greater than a lateral thickness of the first dielectric gate spacer, and is laterally spaced apart from the second gate electrode of the second field effect transistor by a second lateral offset distance that is equal to the lateral thickness of the second dielectric gate spacer of the second gate electrode of the second field effect transistor.

3. The semiconductor structure of claim 2, wherein:
the extension doping portion of the first active region has a uniform width that is the same as a lateral thickness of the first dielectric gate spacer; and
the deep active portion of the common active region does not have any areal overlap with and is offset from the first dielectric gate spacer, and the deep active portion of the common active region is adjoined to the second dielectric gate spacer.

4. The semiconductor structure of claim 2, wherein an interface between the extension doping portion of the second active region and the deep active portion of the second active region is vertically coincident with a first outer sidewall of the second dielectric spacer.

5. The semiconductor structure of claim 2, wherein interfaces between the extension doping portions of the common active region, the first active region, and the second active region and the respective first semiconductor channel and second semiconductor channel are vertically coincident with a respective overlying one of interfaces between the respective first and second gate electrodes and the first and second dielectric gate spacers.

6. The semiconductor structure of claim 2, wherein the common active region, the first active region, and the second active region are located in a semiconductor material region that is laterally surrounded by a shallow trench isolation structure.

7. The semiconductor structure of claim 6, wherein:
the deep active portion of the first active region has a same width in a horizontal direction as the semiconductor material region; and
the deep active portion of the common active region and the deep active portion of the second active region have a smaller width than the semiconductor material region in the horizontal direction.

8. The semiconductor structure of claim 6, wherein an additional series connection of an additional first field effect transistor and an additional second field effect transistor includes an additional common active region and an additional first active region that are located in the semiconductor material region, wherein the second active region of the second field effect transistor is the same as the active region of the additional second field effect transistor.

9. The semiconductor structure of claim 8, further comprising upper-level metal interconnect structures overlying the array of bit line switches, wherein each of the common active regions is electrically connected by a first subset of the upper-level metal interconnect structures to a respective one of the bit lines.

10. The semiconductor structure of claim 9, wherein:
each of the first active regions and the additional first active regions is electrically connected by a second subset of the metal interconnect structures to an input node of a respective sense amplifier located on the substrate; and
each of the second active regions and the additional second active regions is electrically connected by a third subset of the metal interconnect structures to an erase voltage supply output node of a voltage supply circuit located on the substrate which is configured to provide an erase voltage to the bit lines through the second field effect transistor to erase the three dimensional NAND memory array using gate induced drain leakage (GIDL) current.

11. The semiconductor structure of claim 1, wherein the three-dimensional NAND memory array is located over the array of bit line connection switches.

12. The semiconductor structure of claim 11, wherein the three-dimensional NAND memory array comprises an alternating stack of insulating layers and electrically conductive layers, and memory stack structures vertically extending through the alternating stack, wherein each of the memory stack structures includes a respective vertical semiconductor channel and a memory film surrounding the respective vertical semiconductor channel.

13. The semiconductor structure of claim 12, wherein each of the bit lines is electrically connected to a top end of a respective subset of the vertical semiconductor channels through a respective drain region, and laterally extends along a horizontal direction that is parallel to a top surface of the substrate.

14. A method of forming a semiconductor structure, comprising:
forming an array of bit line connection switches on a semiconductor substrate, wherein each of the bit line connection switches is formed by:

forming a first gate electrode and a second gate electrode over a semiconductor material region having a doping of a first conductivity type and located in the semiconductor substrate, forming extension doping portions in surface portions of semiconductor material region that are not masked by the first gate electrode or the second gate electrode by performing a first ion implantation process that implants dopants of a second conductivity type that is the opposite of the first conductivity type, forming a first dielectric gate spacer and a second dielectric gate spacer on sidewalls of the first gate electrode and the second gate electrode, respectively, by conformally depositing a dielectric material layer and anisotropically etching the dielectric material layer, forming an implantation mask layer over the semiconductor material region, wherein the implantation mask layer includes an outer periphery that overlies the first gate electrode and includes an opening that exposes at least a portion of the second gate electrode and the second dielectric gate spacer, wherein the implantation mask layer covers the entire first dielectric gate spacer which faces the second gate electrode, and forming a first deep active portion, a common deep active portion, and a second deep active portion by performing a second ion implantation process that implants additional dopants of the second conductivity type into the respective extension doping portions that are not masked by the implantation mask layer and through the opening in the implantation mask layer, such that the common deep active portion is offset farther from the first gate electrode than from the second gate electrode;

forming a three-dimensional NAND memory array over the array of bit line connection switches; and electrically connecting bit lines of the three-dimensional NAND memory array to the array of bit line connection switches.

15. The method of claim 14, wherein:

each of the deep active portions is formed entirely within an area of a respective one of the extension doping portions; and regions of the extension doping portions that are implanted with the additional dopants of the second conductivity type are converted into, and are incorporated into, the deep active portions.

16. The method of claim 15, wherein:

the deep active portions have a greater depth than the extension doping portions and have a higher atomic concentration of electrical dopants than the extension doping portions;

each combination of a first deep active portion and a respective adjoining one of the extension active portions constitutes a first active region;

each combination of a common deep active portion and a respective adjoining one of the extension active portions constitutes a common active region; and each combination of a second deep active portion and a respective adjoining one of the extension active portions constitutes a second active region.

17. The method of claim 16, wherein:

the bit line connection switch located in the semiconductor material region comprises a series connection of a first field effect transistor and a second field effect transistor;

the first field effect transistor includes a first semiconductor channel extending between the common active region and the first active region; and the second field effect transistor includes a second semiconductor channel extending between the common active region and the second active region.

18. The method of claim 17, wherein an interface between the extension doping portion of the first active region and the deep active portion of the first active region is vertically coincident with a first outer sidewall of the first dielectric spacer.

19. The method of claim 18, wherein the deep active portion of the common active region is laterally spaced apart from the first gate electrode by a first lateral offset distance that is greater than a lateral thickness of the first dielectric gate spacer, and is laterally spaced apart from the second gate electrode by a second lateral offset distance that is equal to a lateral thickness of the second dielectric gate spacer.

20. The method of claim 19, wherein the extension doping portion of the first active region has a uniform width that is the same as a lateral thickness of the first dielectric gate spacer.

* * * * *